(12) United States Patent
Takayama et al.

(10) Patent No.: US 11,322,908 B2
(45) Date of Patent: May 3, 2022

(54) NITRIDE LIGHT EMITTER

(71) Applicant: PANASONIC INTELLECTUAL PROPERTY MANAGEMENT CO., LTD., Osaka (JP)

(72) Inventors: Toru Takayama, Toyama (JP); Tohru Nishikawa, Toyama (JP); Tougo Nakatani, Toyama (JP); Katsuya Samonji, Toyama (JP); Takashi Kano, Shiga (JP); Shinji Ueda, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 48 days.

(21) Appl. No.: 16/670,833

(22) Filed: Oct. 31, 2019

(65) Prior Publication Data
US 2020/0067267 A1 Feb. 27, 2020

Related U.S. Application Data

(63) Continuation of application No. PCT/JP2018/015319, filed on Apr. 12, 2018.

(30) Foreign Application Priority Data

May 1, 2017 (JP) .............................. JP2017-091238

(51) Int. Cl.
*H01S 5/34* (2006.01)
*H01S 5/024* (2006.01)
(Continued)

(52) U.S. Cl.
CPC .......... *H01S 5/02461* (2013.01); *H01S 5/023* (2021.01); *H01S 5/026* (2013.01);
(Continued)

(58) Field of Classification Search
None
See application file for complete search history.

(56) References Cited

U.S. PATENT DOCUMENTS

2004/0213315 A1 10/2004 Kume et al.
2007/0215855 A1* 9/2007 Kang .................... H01L 25/167
257/13
(Continued)

FOREIGN PATENT DOCUMENTS

CN 103367112 A 10/2013
JP 2002-134822 A 5/2002
(Continued)

OTHER PUBLICATIONS

International Search Report and Written Opinion dated Jul. 10, 2018 in International Application No. PCT/JP2018/015319; with partial English translation.

(Continued)

*Primary Examiner* — Tod T Van Roy
(74) *Attorney, Agent, or Firm* — McDermott Will & Emery LLP

(57) ABSTRACT

A nitride light emitter includes: a nitride semiconductor light-emitting element including an $Al_xGa_{1-x}N$ substrate ($0 \le x \le 1$) and a multilayer structure above the $Al_xGa_{1-x}N$ substrate; and a submount substrate on which the nitride semiconductor light-emitting element is mounted. The multilayer structure includes a first clad layer of a first conductivity type, a first light guide layer, a quantum-well active layer, a second light guide layer, and a second clad layer of a second conductivity type which are stacked sequentially from the $Al_xGa_{1-x}N$ substrate. The multilayer structure and submount substrate are opposed to each other. The submount substrate comprises diamond. The nitride semiconductor (Continued)

light-emitting element has a concave warp on a surface closer to the $Al_xGa_{1-x}N$ substrate.

23 Claims, 53 Drawing Sheets

(51) Int. Cl.
| | |
|---|---|
| H01S 5/026 | (2006.01) |
| H01S 5/22 | (2006.01) |
| H01S 5/343 | (2006.01) |
| H01S 5/023 | (2021.01) |
| H01S 5/0233 | (2021.01) |
| H01S 5/0235 | (2021.01) |
| H01S 5/16 | (2006.01) |
| H01S 5/02 | (2006.01) |
| H01S 5/0234 | (2021.01) |
| F21Y 115/30 | (2016.01) |
| F21S 41/176 | (2018.01) |
| F21S 41/16 | (2018.01) |
| H01S 5/20 | (2006.01) |
| H01S 5/10 | (2021.01) |
| H01S 5/0237 | (2021.01) |

(52) U.S. Cl.
CPC .......... *H01S 5/0211* (2013.01); *H01S 5/0233* (2021.01); *H01S 5/0234* (2021.01); *H01S 5/0235* (2021.01); *H01S 5/02484* (2013.01); *H01S 5/168* (2013.01); *H01S 5/22* (2013.01); *H01S 5/3404* (2013.01); *H01S 5/34333* (2013.01); *F21S 41/16* (2018.01); *F21S 41/176* (2018.01); *F21Y 2115/30* (2016.08); *H01S 5/0237* (2021.01); *H01S 5/1039* (2013.01); *H01S 5/2009* (2013.01); *H01S 5/2202* (2013.01); *H01S 5/3403* (2013.01)

(56) References Cited

U.S. PATENT DOCUMENTS

| | | | |
|---|---|---|---|
| 2008/0298412 A1 | 12/2008 | Nakamura | |
| 2008/0317080 A1* | 12/2008 | Kameyama | ........... H01S 5/0207 372/44.01 |
| 2009/0159924 A1* | 6/2009 | Kamiyama | ........... H01S 5/2201 257/103 |
| 2010/0091808 A1* | 4/2010 | Takahira | ................. H01L 24/32 372/44.01 |
| 2010/0150194 A1* | 6/2010 | Tsuchiya | ............. H01S 5/34333 372/45.01 |
| 2012/0273816 A1 | 11/2012 | Yoshida et al. | |
| 2013/0248932 A1 | 9/2013 | Tomabechi | |
| 2014/0023103 A1 | 1/2014 | Kasugai et al. | |
| 2014/0056324 A1* | 2/2014 | Takagi | ................. H01S 5/0202 372/44.011 |
| 2014/0294029 A1 | 10/2014 | Masui | |
| 2015/0108518 A1 | 4/2015 | Samonji et al. | |
| 2018/0109076 A1* | 4/2018 | Takayama | ............. H01S 5/2206 |

FOREIGN PATENT DOCUMENTS

| | | |
|---|---|---|
| JP | 2003-031895 A | 1/2003 |
| JP | 2003-133648 A | 5/2003 |
| JP | 2006-165453 A | 6/2006 |
| JP | 2008-078340 A | 4/2008 |
| JP | 2010-141242 A | 6/2010 |
| JP | 2011-044669 A | 3/2011 |
| JP | 2011-258883 A | 12/2011 |
| JP | 2012-209352 A | 10/2012 |
| JP | 2014-131019 A | 7/2014 |
| WO | 2012/127778 A1 | 9/2012 |
| WO | 2013/175697 A1 | 11/2013 |
| WO | WO-2014107034 A1 * | 7/2014 ............ H01L 33/24 |
| WO | WO-2016199363 A1 * | 12/2016 ............ H01S 5/3211 |

OTHER PUBLICATIONS

The Second Office Action issued in Chinese Patent Application No. 201880027686.X, dated Apr. 20, 2021; with English translation.

* cited by examiner

NITRIDE LIGHT EMITTER

CROSS REFERENCE TO RELATED APPLICATIONS

This application is a U.S. continuation application of PCT International Patent Application Number PCT/JP2018/015319 filed on Apr. 12, 2018, claiming the benefit of priority of Japanese Patent Application Number 2017-091238 filed on May 1, 2017, the entire contents of which are hereby incorporated by reference.

BACKGROUND

1. Technical Field

The present disclosure relates to a nitride light emitter.

2. Description of the Related Art

At present, halogen lamps, high intensity discharge (HID) head lamps, and light-emitting diode (LED) lamps are widely used as light sources of automobile headlights.

In a halogen lamp, a trace amount of halogen gas is added to inert gas containing nitrogen or argon in a light bulb and a filament in the light bulb is energized to emit light during incandescence. Such halogen lamps are widely adopted in the related art. Unlike halogen lamps, an HID lamp does not have a filament and thus the light bulb thereof is not burned out. Light can be emitted as long as electric discharge continues. Generally, HID lamps are more expensive than halogen lamps but advantageously have high luminance and long life with low power consumption. LED lamps have long life, only require the replacement of bulbs, achieve lower power consumption than HID lamps, and generate only a small amount of heat. However, LED lamps have lower brightness than HID lamps. Thus, HID lamps are mainly used as headlights at present, whereas LED lamps are used as fog lamps, light sources for decorative lighting of automobiles, and so on.

As recent light-emitting elements having higher radiant intensity than LEDs, the light sources of laser headlights with radiant intensity increased by laser diodes (LDs) have received attention. As light-emitting elements used for the light sources of headlights, for example, extra-high output blue semiconductor lasers are demanded. Such semiconductor lasers can operate in a 450-nm wavelength band with high-wattage output for an extended period of at least several thousand hours even at a high temperature of 85° C.

In order to achieve such light-emitting elements, it is necessary to minimize a temperature increase caused by the self-heat of the light-emitting elements during laser oscillation.

In order to suppress a temperature increase caused by self-heat, it is important to reduce the thermal resistance of a semiconductor laser element.

As illustrated in FIG. 53, a semiconductor laser described in WO 2013/175697 (hereinafter referred to as Patent Literature 1) includes a semiconductor laser element that is mounted junction-down on a diamond submount substrate having high thermal conductivity in order to reduce the thermal resistance of the semiconductor laser element (see Patent Literature 1).

As illustrated in FIG. 54, in view of the extension of an operating life of a element, Japanese Unexamined Patent Application Publication No. 2003-31895 (hereinafter referred to as Patent Literature 2) discloses a technique in which an uneven surface is formed on a submount substrate, on which a semiconductor laser element is mounted, and the shape of the mounted semiconductor laser element is controlled so as to project on the substrate (see Patent Literature 2).

In a blue laser of the 450-nm wavelength band, it is necessary to increase the In composition of an InGaN layer to about 0.18 (18%) in order to obtain laser oscillation in the wavelength band, the InGaN layer being used for a quantum well layer serving as a luminescent layer.

Generally, a nitride material used for a nitride semiconductor laser comprises a mixed-crystal semiconductor that is a mixture of at least two of InN, GaN, and AlN. The lattice constants of InN, GaN, and AlN are 3.54 Å, 3.182 Å, and 3.11 Å, respectively. In this case, InGaN that is a mixture of InN and GaN has a larger lattice constant than GaN, so that GaN has lattice misfit. Specifically, lattice misfit equivalent to a large value of 2.1% occurs between the InGaN quantum well layer, which has an In composition of 0.19 for the luminescent layer of the blue laser, and a GaN substrate.

In contrast, in a conventional violet laser of the 405-nm wavelength band for a Blu-ray (registered trademark) optical disk system, the In composition of InGaN used for a quantum well is about 0.07 (7%). In this case, lattice misfit relative to the GaN substrate is 0.74%. Hence, in the blue laser of the 450-nm wavelength band, a stress generated on the quantum well layer is several times as large as that in the conventional violet laser of the 405-nm wavelength band. An increasing stress may cause, in addition to a lattice defect, an electric field generated by a piezoelectric effect in a crystal having a wurtzite (WZ) crystal structure like a nitride material. The electric field generated by the piezoelectric effect may interrupt current injection into an active layer. This may cause phenomena such as an increase in operating voltage and a reduction in luminous efficiency.

In order to effectively achieve a high-temperature high-power operation, a quantum-well active layer serving as a luminescent layer is mounted junction-down near a submount substrate where a semiconductor laser element is mounted. This reduces a thermal resistance and suppresses a temperature increase of the semiconductor laser element. In this case, a distance between the quantum-well active layer and the submount decreases so as to increase a stress applied to the quantum-well active layer due to a difference in thermal expansion coefficient between a submount material and the semiconductor laser element.

Furthermore, in a nitride semiconductor laser element for an operation with high-wattage output, it is necessary to form a current non-injection window region on the quantum-well active layer of a region near cavity end face, suppress a reduction in the bandgap energy of the active layer when the bandgap energy is reduced by heat generated by non-radiative recombination on the cavity end face, and suppress the occurrence of catastrophic optical damage (COD) in which laser light destroys the cavity end face.

In this case, if a piezoelectric field is generated by a stress of the quantum-well active layer in a direction that accelerates current injection in the semiconductor laser element toward the cavity end face, current is likely to leak into the current non-injection window region. This may increase the occurrence of non-radiative recombination. Therefore, the COD level of the semiconductor laser element may be lowered.

Hence, in a semiconductor laser element of the 450-nm wavelength band, an operation with high-wattage output for an extended period of at least several thousand hours at a high temperature of 85° C. is not always sufficiently guaranteed only by suppressing a temperature increase of the semiconductor laser element when the temperature is raised by reducing a thermal resistance. Specifically, in addition to the suppression of a temperature increase of the semiconductor laser element, it is necessary to suppress the spread of current into the current non-injection window region near the cavity end face by controlling a stress generated on the quantum-well active layer serving as a luminescent layer, and improve the efficiency of current injection into the quantum-well active layer that receives injected current.

An object of the present disclosure is to provide a nitride light emitter that can achieve both the suppression of a temperature increase of a quantum-well active layer and the improvement of the efficiency of current injection into the quantum-well active layer.

SUMMARY

A nitride light emitter according to an aspect of the present disclosure includes: a nitride semiconductor light-emitting element including an $Al_xGa_{1-x}N$ substrate, where x ranges from 0 to 1, inclusive, and a multilayer structure disposed above an $Al_xGa_{1-x}N$ substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and a submount substrate on which the nitride semiconductor light-emitting element is mounted, wherein the nitride semiconductor light-emitting element is mounted on the submount substrate such that the multilayer structure and submount substrate are opposed to each other, the submount substrate comprises diamond, and the nitride semiconductor light-emitting element has a concave warp on a surface closer to the $Al_xGa_{1-x}N$ substrate.

The present disclosure can provide a nitride light emitter that can achieve both the suppression of a temperature increase of a quantum-well active layer and the improvement of the efficiency of current injection into the quantum-well active layer.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Observation Based on which the Present Disclosure has been Made)

Prior to the embodiments of the present disclosure, the observation based on which the present disclosure has been made is described.

As has been discussed, as light-emitting elements used for the light sources of headlights, for example, extra-high output blue semiconductor lasers are demanded. Such semiconductor lasers can operate in a 450-nm wavelength band with high-wattage output for an extended period of at least several thousand hours even at a high temperature of 85° C. If a phosphor is excited by such an extra-high output blue semiconductor laser and yellow light can be obtained, an extra-high output light source can be achieved with radiation of entirely white light.

Figure 53:
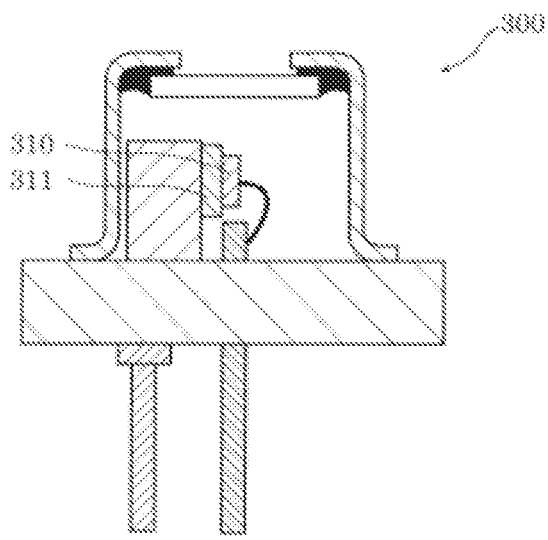
FIG. 53 is a cross-sectional view illustrating an example of the configuration of a semiconductor light emitter according to the related art.
Figure 54:
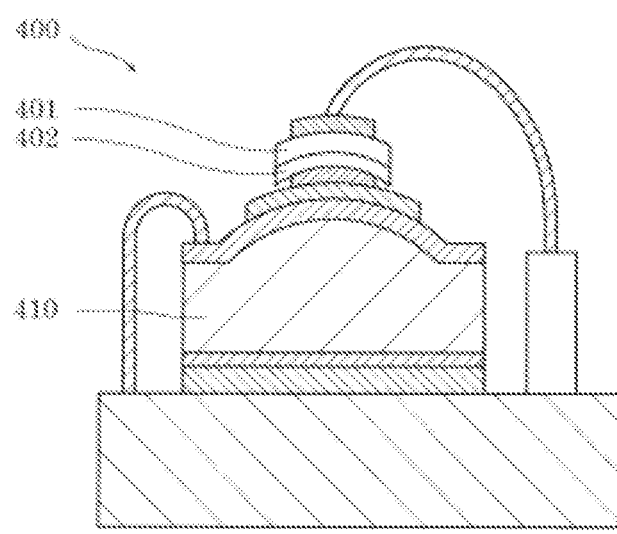
FIG. 54 is a cross-sectional view illustrating another example of the configuration of the semiconductor light emitter according to the related art.

In order to achieve such an extra-high output blue semiconductor laser with reliability, it is necessary to minimize a temperature increase of a semiconductor laser element during laser oscillation. Thus, it is quite effective to mount the semiconductor laser element junction-down on a highly heat-dissipative submount and reduce the thermal resistance of the semiconductor laser element. The configuration of a semiconductor light emitter of the related art will be described below in accordance with the accompanying drawings. FIG. 53 is a cross-sectional view illustrating an example of the configuration of the semiconductor light emitter according to the related art. FIG. 54 is a cross-sectional view illustrating another example of the configuration of the semiconductor light emitter according to the related art. FIGS. 53 and 54 illustrate the configurations of the semiconductor light emitters disclosed in Patent Literature 1 and Patent Literature 2, respectively.

For example, Patent Literature 1 discloses a method of reducing the thermal resistance of nitride light-emitting element 310 that is mounted junction-down on diamond submount substrate 311 in semiconductor light-emitter 300 as illustrated in FIG. 53. Diamond has a thermal conductivity of at least about 1000 W/m·K, which is quite higher than those of materials used for other submounts, for example, SiC (a thermal conductivity of about 200 W/m·K) and AlN (a thermal conductivity of about 150 W/m·K). Thus, diamond is suitable for obtaining high heat dissipation.

However, it is known that in the use of a GaN substrate having a GaN crystal (0001) face (C-face) as a principal face, GaN having a wurtzite (WZ) crystal structure exhibits a piezoelectric property (piezoelectric effect) because of the atomic arrangement of GaN. In this case, when a stress is applied to the crystal, a piezoelectric field is generated in the crystal by polarization according to the stress.

As described above, in the nitride semiconductor laser element for an operation with high-wattage output, it is necessary to form the current non-injection window region on the quantum-well active layer of a region near the cavity end face so as to suppress a reduction in the bandgap energy of the quantum-well active layer when the bandgap energy is reduced by heat generated by non-radiative recombination on the cavity end face. This may suppress the occurrence of COD.

However, a piezoelectric field may be generated by a stress of the quantum-well active layer in a direction that accelerates current injection in the semiconductor laser element toward the cavity end face. In this case, current is likely to leak into the current non-injection window region. This may increase the occurrence of non-radiative recombination. Thus, heat is generated and the COD level of the semiconductor laser element may be lowered.

In the semiconductor laser element, a current of at least several amperes is injected during an operation with high-wattage output at a high temperature of 85° C. Thus, it is necessary to control the direction of a piezoelectric field generated on the quantum-well active layer such that current injected into the semiconductor laser element is unlikely to flow toward the cavity end face. Thus, even if the current non-injection window region is formed around the cavity end face, the semiconductor laser element may be deteriorated with a reduction of the COD level unless the occurrence of leakage current toward the cavity end face is minimized.

Patent Literature 1 does not disclose a method of controlling the direction of a piezoelectric field such that current injected into the semiconductor laser element is unlikely to flow toward the cavity end face.

As illustrated in FIG. 54, semiconductor light emitter 400 disclosed according to Patent Literature 2 is configured such that light-emitting element 402 on GaN substrate 401 is mounted junction-down on convex submount substrate 410 so as to project to GaN substrate 401. This configuration is aimed at controlling a stress generated on an active layer and suppressing a deterioration of the active layer.

However, Patent Literature 2 does not disclose a method of controlling a stress generated in the cavity direction and controlling the direction of a piezoelectric field generated on the active layer such that current injected into the semiconductor laser element is unlikely to flow toward the cavity end face.

Moreover, if diamond is used as the submount substrate, it is quite difficult to form a smoothly curved convex shape on the diamond submount during working as disclosed in Patent Literature 2 because diamond is extremely hard. Thus, the cost may be increased. Furthermore, a light-emitting surface may be disadvantageously tilted unless the mounting position of the element onto the submount is accurately controlled.

As described above, in order to suppress a reduction of the COD level that is a main cause of a deterioration in the semiconductor laser with high-wattage output, it is effective to form the current non-injection window region, in which current is not injected, in a region near the cavity end face. In this case, in order to reduce current leakage from a current injection region to the current non-injection window region, it is necessary to minimize a element temperature during an operation and suppress an increase in operating current. Moreover, it is necessary to control the direction of a piezoelectric field generated on the active layer such that current is unlikely to flow toward the cavity end face.

An object of the present disclosure is to provide an extra-high output semiconductor laser that can operate with high-wattage output and low power consumption for an extended period even at a high temperature of 85° C. while suppressing a temperature increase of a semiconductor laser element and leakage current into the current non-injection window region.

In accordance with an aspect of the present disclosure, there is provided a nitride light emitter includes: a nitride semiconductor light-emitting element including an $Al_xGa_{1-x}N$ substrate, where x ranges from 0 to 1, inclusive, and a multilayer structure disposed above an $Al_xGa_{1-x}N$ substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and a submount substrate on which the nitride semiconductor light-emitting element is mounted, wherein the nitride semiconductor light-emitting element is mounted on the submount substrate such that the multilayer structure and submount substrate are opposed to each other, the submount substrate comprises diamond, and the nitride semiconductor light-emitting element has a concave warp on a surface closer to the $Al_xGa_{1-x}N$ substrate.

In the nitride light emitter according to the aspect of the present disclosure, it is also possible that the $Al_xGa_{1-x}N$ substrate is a GaN substrate.

In the nitride light emitter according to the aspect of the present disclosure, it is further possible that the multilayer structure has a compressive mean strain relative to the $Al_xGa_{1-x}N$ substrate.

In the nitride light emitter according to the aspect of the present disclosure, it is still further possible that at least one of the first light guide layer or the second light guide layer contains In.

In the nitride light emitter according to the aspect of the present disclosure, it is still further possible that the first light guide layer and the second light guide layer each include an In composition of 6% or less.

In the nitride light emitter according to the aspect of the present disclosure, it is still further possible to include a buffer layer between the $Al_xGa_{1-x}N$ substrate and the first clad layer, the buffer layer including a nitride semiconductor layer having a compressive mean strain relative to the $Al_xGa_{1-x}N$ substrate.

In the nitride light emitter according to the aspect of the present disclosure, it is still further possible that the buffer layer contains In.

In the nitride light emitter according to the aspect of the present disclosure, it is still further possible that the buffer layer further includes an AlGaN layer.

In the nitride light emitter according to the aspect of the present disclosure, it is still further possible that the quantum-well active layer includes a quantum well layer and a barrier layer, and the barrier layer contains an In composition that is equal to or higher than an In composition of each of the first light guide layer and the second light guide layer.

In the nitride light emitter according to the aspect of the present disclosure, it is still further possible that the second clad layer includes a ridge.

In the nitride light emitter according to the aspect of the present disclosure, it is still further possible that the ridge includes one of a layer including In and a layer including GaN, the one of the layer including In and the layer including GaN being located closer to the second light guide layer.

In the nitride light emitter according to the aspect of the present disclosure, it is still further possible that the GaN substrate has a plane orientation that is non-polar or semi-polar, and the multilayer structure contains an Al composition of at most 1%.

In the nitride light emitter according to the aspect of the present disclosure, it is still further possible that the multilayer structure does not include Al.

In the nitride light emitter according to the aspect of the present disclosure, it is still further possible to include a first barrier layer, a first pad electrode layer, a second barrier layer, and a bonding layer that are disposed between the multilayer structure and the submount substrate and are arranged in stated order from the second clad layer, and the second barrier layer includes a shorter side having a width smaller than a width of a shorter side of the first barrier layer.

In the nitride light emitter according to the aspect of the present disclosure, it is still further possible to include a first barrier layer, a first pad electrode layer, a second barrier layer, and a bonding layer that are disposed between the multilayer structure and the submount substrate and are arranged in stated order from the second clad layer, and the bonding layer is further placed inward from an end of the second barrier layer in a region between second barrier layer and the first barrier layer.

In accordance with another aspect of the present disclosure, there is provided a nitride semiconductor light-emitting element including an $Al_xGa_{1-x}N$ substrate, where x ranges from 0 to 1, inclusive, and a multilayer structure disposed above the $Al_xGa_{1-x}N$ substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and a submount substrate on which the nitride semiconductor light-emitting element is mounted, wherein the multilayer structure has a compressive mean strain relative to the $Al_xGa_{1-x}N$ substrate, the nitride semiconductor light-emitting element is mounted on the submount substrate such that the multilayer structure and the submount substrate are opposed to each other, and the submount substrate comprises diamond.

In accordance with still another aspect of the present disclosure, there is provided a nitride light emitter including: a nitride semiconductor light-emitting element including an $Al_xGa_{1-x}N$ substrate, where x ranges from 0 to 1, inclusive, and a multilayer structure disposed above the $Al_xGa_{1-x}N$ substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and a submount substrate on which the nitride semiconductor light-emitting element is mounted, the multilayer structure has a tensile or compressive mean strain of at most $5.2\times10^{-4}$ relative to the $Al_xGa_{1-x}N$ substrate, the $Al_xGa_{1-x}N$ substrate has a thickness of 75 μm to 95 μm, inclusive, the nitride semiconductor light-emitting element is mounted on the submount substrate such that the multilayer structure and submount substrate are opposed to each other, and the submount substrate comprises diamond.

Hereinafter, certain exemplary embodiments of the present disclosure are described in greater detail with reference to the accompanying Drawings. It should be noted that all the embodiments described below are generic and specific examples of the present disclosure. Numerical values, shapes, materials, constituent elements, arrangement positions and the connection configuration of the constituent elements, steps, the order of the steps, and the like described in the following embodiments are merely examples, and are not intended to limit the present disclosure. The present disclosure is characterized by the appended claims.

It should also be noted that each figure in the Drawings is a schematic diagram and is not necessarily an exact diagram. In each figure, substantially identical constituent elements are assigned with a same reference sign, and explanation of such substantially identical constituent elements is not repeated or simplified.

In the present specification, the terms "above" and "below" do not indicate upward (vertically upward) and downward (vertically downward) in the absolute recognition of space, but are rather used as terms defined by a relative positional relation based on the stacking order in a stacked configuration. Furthermore, the terms "above" and "below" are used not only when two elements are spaced apart from each other and another element is present therebetween, but also when two elements are in close contact with each other and touch each other.

Hereinafter, certain exemplary embodiments of the present disclosure are described in greater detail with reference to the accompanying Drawings.

Embodiment 1

A nitride light emitter according to Embodiment 1 will be described below. First, semiconductor laser element 11 will be described below in accordance with the accompanying drawings. Semiconductor laser element 11 is an example of a nitride semiconductor light-emitting element used in the nitride light emitter according to Embodiment 1.

Figure 1A:
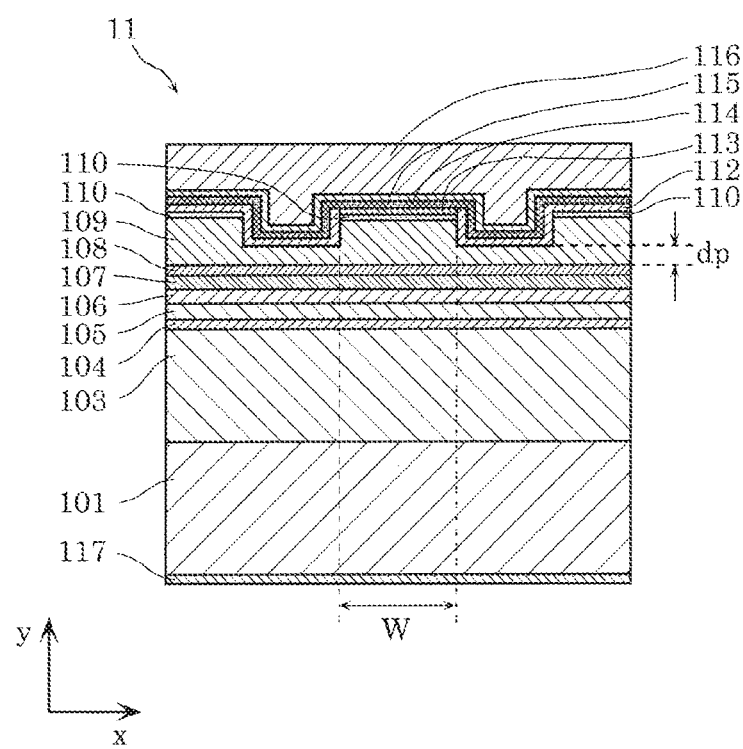
FIG. 1A is a schematic cross-sectional view illustrating the configuration of a semiconductor laser element according to Embodiment 1.
Figure 1B:
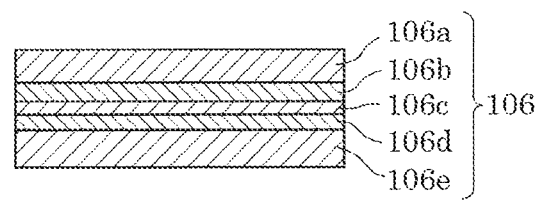
FIG. 1B is a schematic cross-sectional view illustrating the configuration of quantum-well active layer 106 in the semiconductor laser element according to Embodiment 1.
Figure 1C:
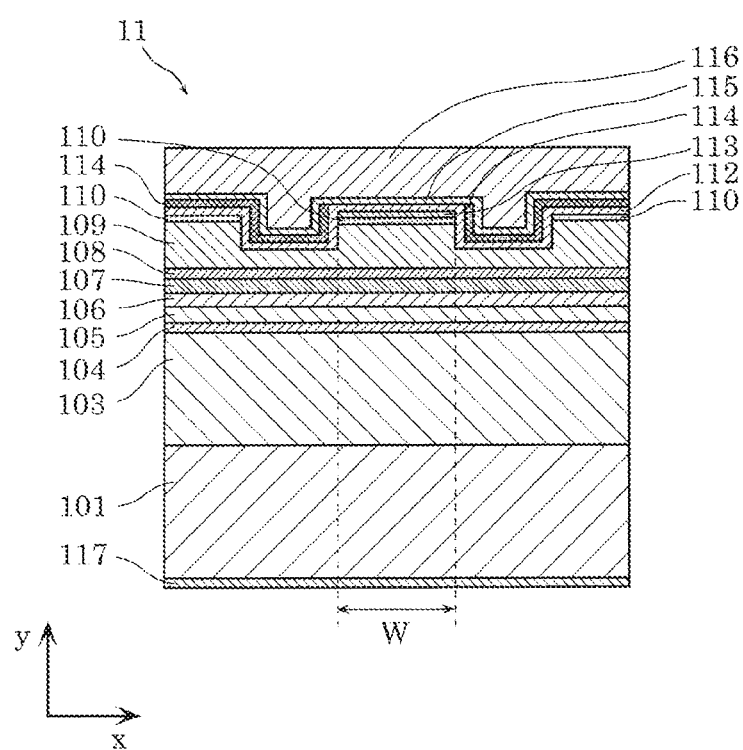
FIG. 1C is a schematic cross-sectional view illustrating a configuration near the cavity end of the semiconductor laser element according to Embodiment 1.

FIG. 1A is a schematic cross-sectional view illustrating the configuration of semiconductor laser element 11 according to Embodiment 1. FIG. 1A illustrates a cross section perpendicular to the cavity length direction of semiconductor laser element 11. FIG. 1B is a schematic cross-sectional view illustrating the configuration of quantum-well active layer 106 in semiconductor laser element 11 according to Embodiment 1. FIG. 1C is a schematic cross-sectional view illustrating a configuration near the cavity end of semiconductor laser element 11 according to Embodiment 1. FIG. 1C illustrates a cross section of a part where a current non-injection window region is formed.

As illustrated in FIG. 1A, semiconductor laser element 11 is a nitride semiconductor light-emitting element including GaN substrate 101 and a multilayer structure in which first clad layer 103 of a first conductivity type, first light guide layer 105, quantum-well active layer 106, second light guide layer 107, and second clad layer 109 of a second conductivity type are stacked on GaN substrate 101 sequentially from GaN substrate 101. In Embodiment 1, semiconductor laser element 11 further includes N-type GaN layer 104, electron barrier layer 108, contact layer 110, current block layer 112, P-side ohmic electrode 113, P-side first adhesive layer 114, first barrier layer 115, pad electrode 116, and N-side electrode 117.

GaN substrate 101 is an example of an $Al_xGa_{1-x}N$ ($0\le x\le 1$) substrate serving as a base substance of semiconductor laser element 11.

First clad layer 103 is a clad layer of the first conductivity type on GaN substrate 101. In the present embodiment, first clad layer 103 comprises N-type AlGaN. The thickness of first clad layer 103 is 1.2 μm in Embodiment 1 but is not particularly limited thereto.

N-type GaN layer 104 is an example of a light guide layer of the first conductivity type. N-type GaN layer 104 is disposed on first clad layer 103 and guides light generated in quantum-well active layer 106. In the present embodiment, N-type GaN layer 104 comprises N-type GaN. The thickness of N-type GaN layer 104 is 100 nm in Embodiment 1 but is not particularly limited thereto.

First light guide layer 105 is disposed between first clad layer 103 and quantum-well active layer 106 and guides light generated in quantum-well active layer 106. In the present embodiment, first light guide layer 105 comprises undoped InGaN. The thickness of first light guide layer 105 is 200 nm in Embodiment 1 but is not particularly limited thereto.

Quantum-well active layer 106 is an undoped multilayer quantum-well active layer that generates light in semiconductor laser element 11. The structure of quantum-well active layer 106 will be described later.

Second light guide layer 107 is a layer that is disposed between second clad layer 109 and quantum-well active layer 106 and guides light generated in quantum-well active layer 106. In the present embodiment, second light guide layer 107 comprises undoped InGaN. The thickness of second light guide layer 107 is 180 nm in Embodiment 1 but is not particularly limited thereto.

Electron barrier layer 108 is a layer for suppressing the leak of electrons injected into quantum-well active layer 106. Electron barrier layer 108 suppresses carrier overflow in which electrons injected in quantum-well active layer 106 are thermally excited and leak into second clad layer 109, thereby improving temperature characteristics. Electron barrier layer 108 in the present embodiment has an Al composition of 0.3 (30%) and comprises AlGaN with a thickness of 5 nm.

Second clad layer 109 is a clad layer of the second conductivity type above quantum-well active layer 106. In the present embodiment, second clad layer 109 comprises P-type AlGaN. The thickness of second clad layer 109 is 660 nm in Embodiment 1 but is not particularly limited thereto.

Contact layer 110 is a layer for forming ohmic contact. In the present embodiment, contact layer 110 comprises P-type GaN. The thickness of contact layer 110 is 0.1 μm in Embodiment 1 but is not particularly limited thereto.

Current block layer 112 is a layer for limiting a current path. Current block layer 112 is transparent to a light distribution, that is, current block layer 112 comprises a transparent material substantially free from light absorption from quantum-well active layer 106. In Embodiment 1, current block layer 112 comprises $SiO_2$. The thickness of current block layer 112 is 0.2 μm in Embodiment 1 but is not particularly limited thereto.

P-side ohmic electrode 113 is a layer for forming ohmic contact. P-side ohmic electrode 113 includes, for example, a Pd layer having a thickness of 40 nm and a Pt layer having a thickness of 35 nm.

P-side first adhesive layer 114 is disposed between P-side ohmic electrode 113 and first barrier layer 115. P-side first adhesive layer 114 comprises, for example, Ti with a thickness of 10 nm.

First barrier layer 115 is a layer disposed between P-side first adhesive layer 114 and pad electrode 116. First barrier layer 115 comprises, for example, Pt with a thickness of 10 nm.

Pad electrode 116 is a pad electrode disposed on first barrier layer 115. Pad electrode 116 comprises, for example, 0.6-μm-thick Au, 35-nm-thick Pt, and 1-μm-thick Au.

N-side electrode 117 is an electrode formed on the underside of GaN substrate 101, that is, a surface opposite to the principal surface where first clad layer 103 is formed. N-side electrode 117 comprises, for example, 10-nm-thick Ti, 35-nm-thick Pt, and 2-μm-thick Au.

As illustrated in FIG. 1A, second clad layer 109 of semiconductor laser element 11 has a ridge having a width W. The width W of the ridge is 30 μm in Embodiment 1 but is not particularly limited thereto.

In this case, distance dp between the lower end of the ridge and quantum-well active layer 106 is 0.2 μm.

In order to obtain an optical output of several watts even in a high-temperature operation at an environmental temperature of at least 85° C., semiconductor laser element 11 has a cavity length of 1200 μm. As illustrated in FIG. 1C, on P-type GaN contact layer 110 of the ridge near the cavity end face at cavity front and rear surfaces, an insulating film of $SiO_2$ (0.2 μm thick) is formed in a region at a distance of 30 μm or less from the cavity end, forming a current non-injection window region. If semiconductor laser element 11 does not include the current non-injection window region, heat is generated by non-radiative recombination with the operating carrier density of quantum-well active layer 106. This may lead to lower bandgap energy. At this point, light absorption increases, optical output decreases, and heat generated by the semiconductor laser element increases, resulting in COD that may destroy the cavity end face. Moreover, current injection into the end face of a laser cavity can be suppressed by forming the current non-injection window region near the cavity end face of semiconductor laser element 11. This can suppress an increase in operating carrier density in the quantum-well active layer near the end face. Thus, a temperature increase in the quantum-well active layer of semiconductor laser element 11 is suppressed, thereby reducing the occurrence of COD.

If the Al composition is increased in first clad layer 103 comprising N-type AlGaN and second clad layer 109 comprising P-type AlGaN, a refractive index difference between quantum-well active layer 106 and the clad layer can be increased. This can securely confine light perpendicularly to the quantum-well active layer (along a substrate normal line), thereby reducing a lasing threshold current value. However, if the Al composition of the AlGaN clad layer is excessively increased, a lattice defect or a crack may occur and lead to lower reliability because of a difference in thermal expansion coefficient between the AlGaN clad layer and GaN substrate 101.

Since the bandgap energy of each AlGaN clad layer increases with the Al composition, an increase of the Al composition may raise an operating voltage. Hence, it is necessary to produce semiconductor laser element 11 in a state where the Al composition of the AlGaN clad layer is 0.05 (5%) or less.

In Embodiment 1, in order to reduce the occurrence of lattice defects and cracks and suppress an operating voltage while increasing an optical confinement factor for the active layer in a vertical direction, the Al composition of the AlGaN clad layer is set at 3.5%.

Moreover, quantum-well active layer 106 according to Embodiment 1 has a double quantum well (DQW) structure for obtaining laser oscillation at a wavelength of 450 nm. Referring to FIG. 1B, the structure of quantum-well active layer 106 will be described below. As illustrated in FIG. 1B, quantum-well active layer 106 has a DQW structure of two InGaN quantum well layers 106b and 106d, each having a thickness of 30 Å and an In composition of 0.18 (18%). Quantum-well active layer 106 further includes InGaN barrier layers 106a, 106c, and 106e. Barrier layers 106a, 106c, and 106e are, for example, 3 nm, 7 nm, and 3 nm in thickness. The larger the thickness of barrier layer 106c between quantum well layers 106b and 106d, the greater the suppression of wave function coupling between quantum well layers 106b and 106d. For suppressing the wave function coupling to a certain degree, the barrier layer between the quantum well layers may have any thickness of at least 5 nm. For example, barrier layers 106a, 106c, and 106e may be 7 nm, 7 nm, and 5 nm thick, 5 nm, 5 nm, and 3 nm thick, 5 nm, 7 nm, and 5 nm thick, 10 nm, 10 nm, and 8 nm thick, or 15 nm, 15 nm, and 13 nm thick.

Figure 2:
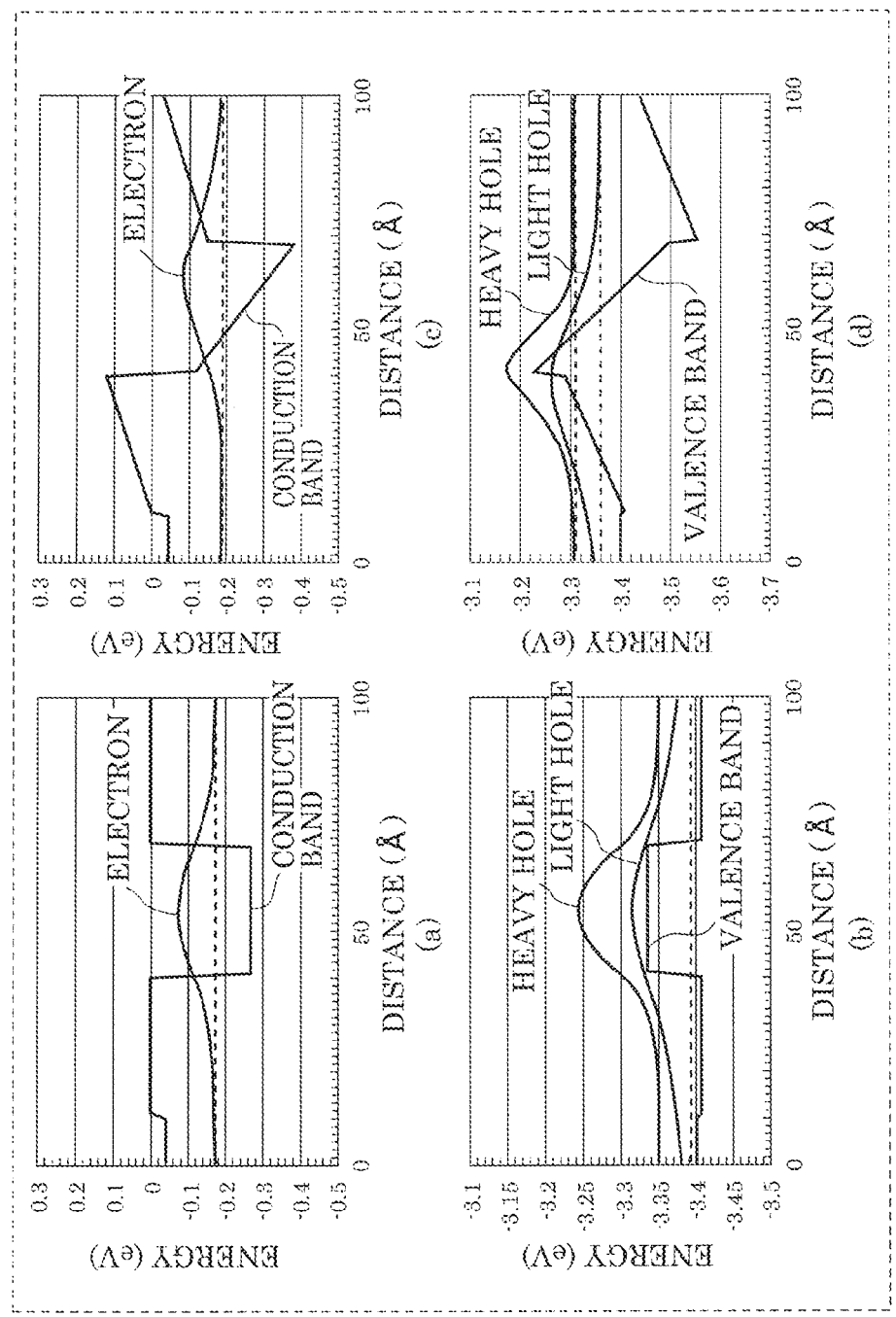
FIG. 2 shows the band structure of the quantum-well active layer.

FIG. 2 shows the band structure of the quantum-well active layer. FIG. 2 shows the band structure in which the In composition of the quantum well layer is 0.145 (14.5%) and the In composition of the barrier layer is 0.008 (0.8%). Graph (a) in FIG. 2 indicates the band structure of a conduction band and the wave function of an electron confined in the quantum well layer regardless of the piezoelectric effect. Graph (b) in FIG. 2 indicates the band structure of a valence band and the wave function of a hole confined in the quantum well layer regardless of the piezoelectric effect. Graph (c) in FIG. 2 indicates the band structure of a conduction band and the wave function of an electron confined in the quantum well layer in consideration of the piezoelectric effect. Graph (d) in FIG. 2 indicates the band structure of a valence band and the wave function of a hole confined in the quantum well layer in consideration of the piezoelectric effect.

A piezoelectric field is generated in the quantum well layer by the piezoelectric effect. The band structures of quantum well layers 106b and 106d incline so as to reduce a potential near second clad layer 109 of P-type AlGaN. In this case, the wave function of the electron spreads to second clad layer 109 of P-type AlGaN. In contrast, the wave function of the hole is biased and spread to first clad layer 103 of N-type AlGaN.

This reduces the distribution overlap integral of the electron wave function and the hole wave function, deteriorates the interaction between the electron and the hole, and reduces a quantum well gain, thereby increasing a lasing threshold current value.

In order to suppress the spread of the electron wave function to second clad layer 109 of P-type AlGaN, barrier layer 106e may be reduced in thickness and second light guide layer 107 may be brought close to the quantum-well active layer if the bandgap energy of second light guide layer 107 is larger than that of barrier layer 106e. This configuration increases a difference between the quantum level energy of an electron and the conduction band energy of second light guide layer 107, thereby increasing the attenuation of the electron wave function to second clad layer 109 of P-type AlGaN.

In the region of barrier layer 106a closest to first clad layer 103 including an N-type AlGaN layer, the hole wave function is likely to spread to first clad layer 103. This may reduce the distribution overlap integral of the electron wave function and the hole wave function. In order to suppress the spread of the hole wave function to first clad layer 103, barrier layer 106a may be reduced in thickness and first light guide layer 105 may be brought close to the quantum-well active layer if the bandgap energy of first light guide layer 105 is larger than that of barrier layer 106a.

In this configuration, the effective masses of a heavy hole and a light hole in quantum well layers 106b and 106d are about eight times and 1.6 times, respectively, as large as the effective mass of an electron. Thus, the spread of the wave function of the heavy hole to first clad layer 103 is smaller than that of the wave function of an electron in barrier layer 106e to the second clad layer.

Furthermore, barrier layer 106c between the quantum well layers has an electron wave function that spreads from quantum well layer 106b to second clad layer 109 of P-type AlGaN and the wave functions of the heavy hole and the light hole, the wave functions spreading from quantum well layer 106d to first clad layer 103 of N-type AlGaN. This suppresses a deterioration of the interaction between an electron and the hole in barrier layer 106c between the quantum well layers.

Therefore, regardless of the presence or absence of the influence of the wave function coupling between the quantum well layers, if the bandgap energy of first light guide layer 105 and second light guide layer 107 is larger than that of barrier layer 106a and barrier layer 106e, at least the thickness of the barrier layer closest to second clad layer 109 comprising P-type AlGaN is set smaller than that of the barrier layer between the quantum well layers, so that a reduction in quantum well gain is suppressed when the gain is reduced by a deterioration of the interaction between the wave functions of an electron and the hole. This can reduce the lasing threshold current value. Moreover, the thickness of the barrier layer closest to first clad layer 103 of N-type AlGaN is set smaller than that of the barrier layer between the quantum well layers, so that a reduction in quantum well gain is further suppressed when the gain is reduced by a deterioration of the interaction between the wave functions of an electron and the hole. This can reduce the lasing threshold current value.

If the barrier layer between the quantum well layers is at most 5 nm in thickness, the influence of the wave function coupling between the quantum well layers increases. In this case, as described above, a region between the quantum well layers has the electron wave function that spreads to second clad layer 109 and the wave functions of the heavy hole and the light hole, the wave functions spreading from quantum well layer 106d to first clad layer 103. This suppresses a deterioration of the interaction between an electron and the hole in barrier layer 106c between the quantum well layers. Thus, even if the barrier layers between the quantum well layers are 5 nm or less in thickness, for example, barrier layers 106a, 106c, and 106e are 3 nm, 3 nm, and 1 nm or 5 nm, 5 nm, and 3 nm in thickness, the spread of the electron wave function to second clad layer 109 decreases. This reduces an increase in lasing threshold current value when the lasing threshold current value increases as a gain decreases due to coupling between quantum wells.

Alternatively, if barrier layers 106a, 106c, and 106e are, for example, 1 nm, 3 nm, and 1 nm or 3 nm, 5 nm, and 3 nm, the spread of the hole wave function to first clad layer 103 and the spread of the electron wave function to second clad layer 109 can be suppressed. This can further reduce an increase in lasing threshold current value when the lasing threshold current value increases as a gain decreases due to coupling between quantum wells.

Therefore, also in the presence of at least three quantum well layers, if the bandgap energy of first light guide layer 105 and second light guide layer 107 is larger than that of the barrier layers, at least the thickness of the barrier layer closest to second clad layer 109 comprising P-type AlGaN is set smaller than that of the barrier layer between the quantum well layers, so that a reduction in quantum well gain is suppressed when the gain is reduced by a deterioration of the interaction between the wave functions of an electron and the hole. This can reduce the lasing threshold current value. Moreover, the thickness of the barrier layer closest to first clad layer 103 of N-type AlGaN is set smaller than that of the barrier layer between the quantum well layers, so that a reduction in quantum well gain is further suppressed when the gain is reduced by a deterioration of the interaction between the wave functions of an electron and the hole. This can reduce the lasing threshold current value.

In order to obtain laser oscillation light in a 450-nm range, it is required that the In composition of the quantum well layer is about 15%. In this case, a lattice misfit relative to GaN is at least 1.7%. An extremely large thickness may cause a lattice defect. Conversely, an extremely small thickness may reduce the optical confinement factor perpendicular to the quantum well layer and increase the lasing threshold current value and the operating carrier density. This may increase leakage current during a high-temperature operation. Thus, in order to sufficiently increase the optical confinement factor perpendicular (a stacking direction, that is, the y-axis direction in FIG. 1A) to the quantum well layer while suppressing the occurrence of lattice defects, the quantum well layer may have a thickness of 27 Å to 33 Å. In Embodiment 1, the quantum well layer has a thickness of 30 Å.

If the In composition is small in first light guide layer 105 and second light guide layer 107, an optical confinement factor decreases perpendicularly to quantum-well active layer 106, increasing the lasing threshold current value and the operating carrier density. This may increase leakage current during a high-temperature operation. Hence, at least one of first light guide layer 105 and second light guide layer 107 may contain In. This can suppress leakage current.

Conversely, if the In composition is large in first light guide layer 105 and second light guide layer 107, a lattice misfit relative to GaN may increase so as to cause a lattice defect. Thus, in order to increase the optical confinement factor perpendicularly to the quantum well layer without causing a lattice defect, the In composition may be 0.025 (2.5%) to 0.07 (7%) in first light guide layer 105 and second light guide layer 107. In Embodiment 1, the In composition is 0.03 (3%) in first light guide layer 105 and second light guide layer 107, thereby suppressing the occurrence of lattice defects and increasing the optical confinement factor perpendicularly to the quantum well layer.

Moreover, as illustrated in FIG. 1A, current block layer 112 that is a dielectric of $SiO_2$ is formed on a side of the ridge in semiconductor laser element 11. In this structure, current injected from contact layer 110 of P-type GaN is narrowed only by the ridge through current block layer 112 and is intensively injected into quantum-well active layer 106 disposed below the bottom of the ridge. Thus, carrier population inversion distribution necessary for laser oscillation can be achieved by injected current of about 100 mA. Light radiated by recombination of a carrier including an electron injected into quantum-well active layer 106 and a positive hole is confined by first light guide layer 105, second light guide layer 107, first clad layer 103, and second clad layer 109 in a direction (the y-axis direction in FIG. 1A) perpendicular to quantum-well active layer 106. In a direction parallel to quantum-well active layer 106 (a direction perpendicular to y-axis of FIG. 1A, hereinafter will be referred to a horizontal direction), light is confined because current block layer 112 has a lower refractive index than the clad layers. Current block layer 112 is transparent to laser oscillation light and thus does not absorb light, achieving a low-loss waveguide. The light distribution through the waveguide can largely spread into the current block layer and thus ΔN (a difference in effective refractive index in the vertical direction inside and outside the ridge) on the order of $1\times10^{-3}$ suitable for the output operation can be easily obtained. Furthermore, ΔN can be precisely controlled on the order of $10^{-3}$ by adjusting distance dp between current block layer 112 and quantum-well active layer 106. Thus, high-output semiconductor laser element 11 can be obtained with a low operating current while precisely controlling the light distribution. In Embodiment 1, ΔN of $5\times10^{-3}$ allows confinement of light in the horizontal direction.

Moreover, in the structure of semiconductor laser element 11, the mean value of a stress generated over the multilayer structure formed above GaN substrate 101 is controlled by changing the In compositions of first light guide layer 105, second light guide layer 107, barrier layers 106a, 106c, and 106e, thereby controlling the direction of warping of GaN substrate 101 after crystal growth.

Specifically, for example, if the In composition is increased in first light guide layer 105 and second light guide layer 107, the lattice constant of the InGaN layer is larger than that of GaN substrate 101. Thus, the mean value of the lattice constants of the multilayer structure is larger than that of the lattice constant of GaN substrate 101. Thus, the overall multilayer structure is compressed by GaN substrate 101. In other words, the multilayer structure receives a compressive stress from GaN substrate 101. Put another way, the multilayer structure has a compressive mean strain relative to GaN substrate 101. Resultant warpage on GaN substrate 101 after crystal growth will be described below in accordance with the accompanying drawings.

Figure 3A:
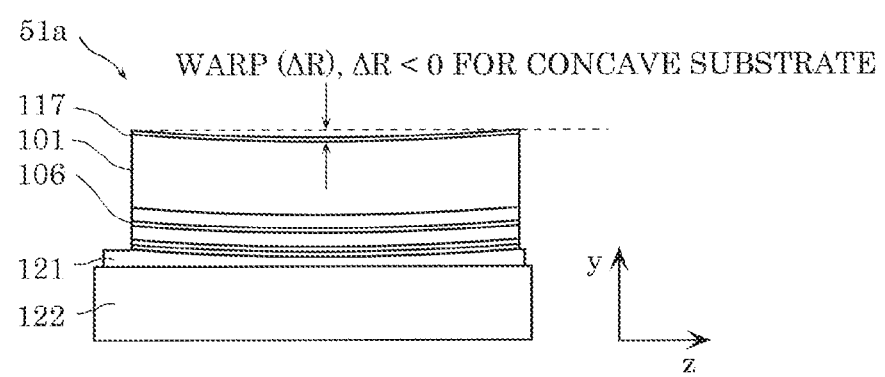
FIG. 3A is a schematic side view illustrating an example of the appearance of a semiconductor laser according to Embodiment 1.
Figure 3B:
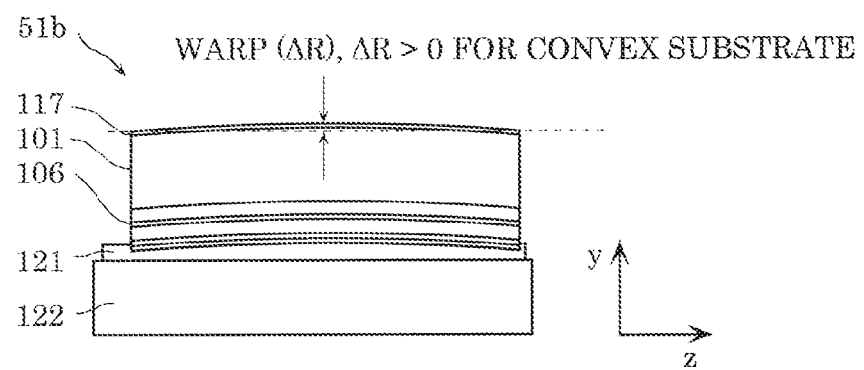
FIG. 3B is a schematic side view illustrating another example of the appearance of a semiconductor laser according to Embodiment 1.

FIGS. 3A and 3B are schematic side views illustrating the appearances of semiconductor lasers 51a and 51b according to Embodiment 1.

Semiconductor laser 51a in FIG. 3A is an example of a nitride light emitter that includes a nitride semiconductor light-emitting element and submount substrate 122 on which the nitride semiconductor light-emitting element is mounted. Semiconductor laser 51a includes semiconductor laser element 11 as a nitride semiconductor light-emitting element. In semiconductor laser 51a, semiconductor laser element 11 is mounted on submount substrate 122 such that a multilayer structure and submount substrate 122 are opposed to each other. Submount substrate 122 comprises diamond. In Embodiment 1, semiconductor laser element 11 is mounted on submount substrate 122 with bonding layer 121 interposed between semiconductor laser element 11 and submount substrate 122. Bonding layer 121 comprises AuSn solder or the like. In this configuration, the multilayer structure of semiconductor laser element 11 has a compressive mean strain relative to GaN substrate 101. Semiconductor laser 51b in FIG. 3B is identical to semiconductor laser 51a in FIG. 3A except that the multilayer structure of semiconductor laser element 11 has a tensile mean strain relative to GaN substrate 101.

If the multilayer structure of semiconductor laser element 11 has a compressive mean strain relative to GaN substrate 101, semiconductor laser element 11 is warped into a concave shape near GaN substrate 101 as illustrated in FIG. 3A. In FIG. 3A, semiconductor laser element 11 in FIG. 1A is mounted junction-down on the submount substrate such that the top surface (outer surface) of GaN substrate 101 is recessed relative to the cavity direction (z-axis direction). In FIG. 3A, ΔR indicates an amount of warpage (distance) at the center of semiconductor laser element 11 in the cavity direction. AR becomes a negative value if the upper side of GaN substrate 101 is concave, whereas ΔR becomes a positive value if the upper side is convex.

Conversely, if the In composition is reduced in first light guide layer 105 and second light guide layer 107, the lattice constants of first clad layer 103 of N-type AlGaN and second clad layer 109 of P-type AlGaN are smaller than that of GaN substrate 101. Thus, the multilayer structure has a tensile mean strain relative to GaN substrate 101. Hence, as illustrated in FIG. 3B, GaN substrate 101 placed on top of the semiconductor laser element is warped into a convex shape after crystal growth. In FIG. 3B, semiconductor laser element 11 in FIG. 1A is mounted junction-down on the submount substrate such that GaN substrate 101 is convex relative to the cavity direction.

If a nitride layer is formed on the C-face of GaN substrate 101, a strain generated according to a lattice misfit may cause piezo polarization charge on an interface where the lattice misfit occurs. This generates a piezoelectric field in the normal direction (y-axis direction in FIGS. 3A and 3B) of GaN substrate 101, thereby changing a band structure in the direction of a growth layer. If a shear stress, which is a rotational (torsional) stress, is generated in an element structure, a piezoelectric field is generated also in a direction parallel to the growth layer (z direction in FIGS. 3A and 3B) by the shear stress (a rotational stress in the zy-plane in FIGS. 3A and 3B). The piezoelectric field generated in the direction parallel to the growth layer (z direction) by the shear stress changes the band structure in the z-axis direction, thereby affecting the distribution of ease of current injection with respect to the cavity direction.

If a shear stress is generated in the cavity direction of semiconductor laser element 11, warpage may occur on semiconductor laser element 11. The warpage and the shear stress in the cavity direction of semiconductor laser element 11 are closely related to each other, for example, in proportion to each other.

Thus, shear stresses on quantum well layers 106b and 106d of quantum-well active layer 106 were estimated in simulation on conditions that the element having the structure of FIG. 1A is mounted junction-down for various submount substrate materials and an amount of warp (ΔR) is changed from −1 μm to 1 μm in 0.5-μm intervals. The results will be described below in accordance with the drawings.

Figure 4:
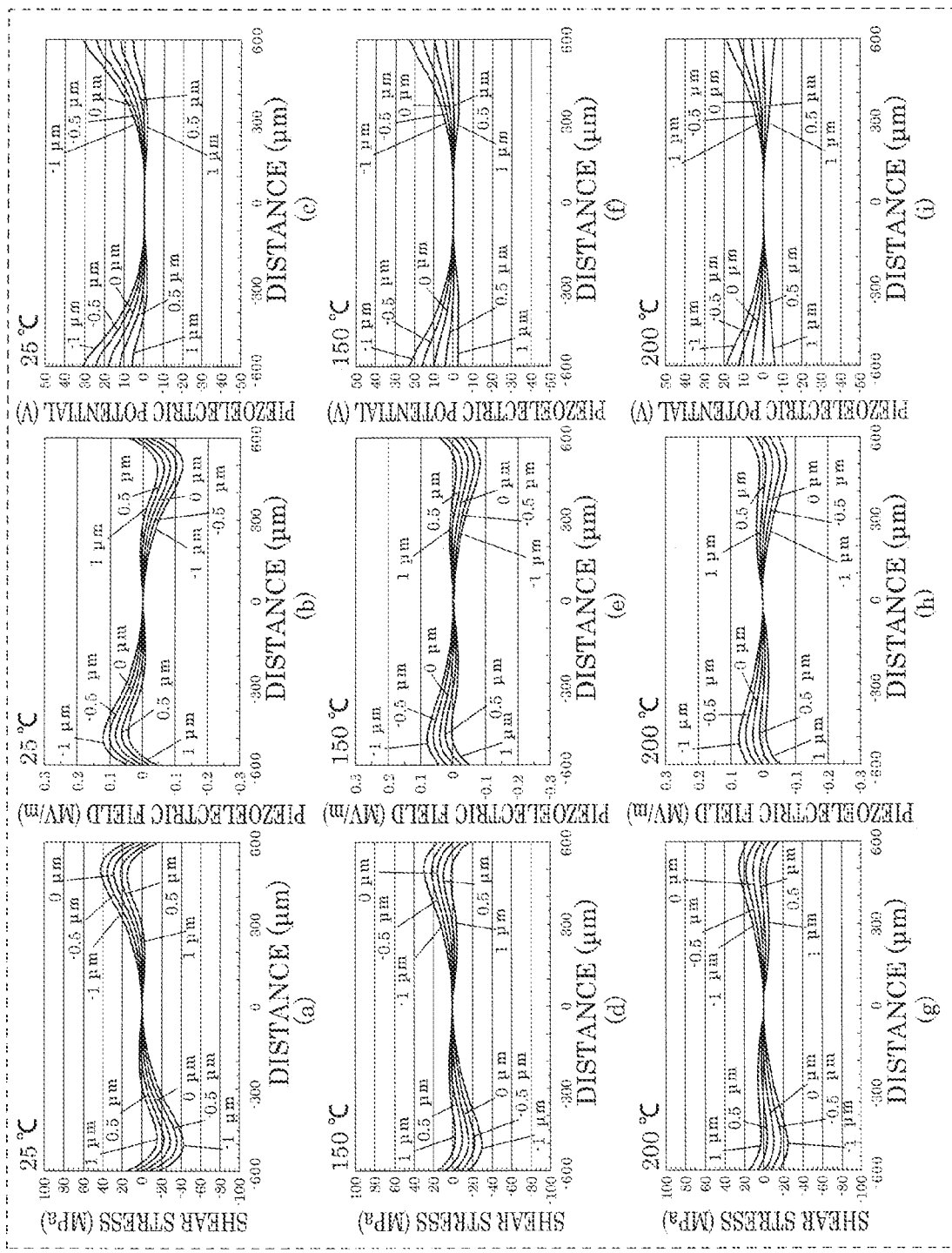
FIG. 4 shows graphs indicating the distributions of shear stresses and piezoelectric fields in a cavity length direction if a submount substrate comprises diamond.
Figure 5:
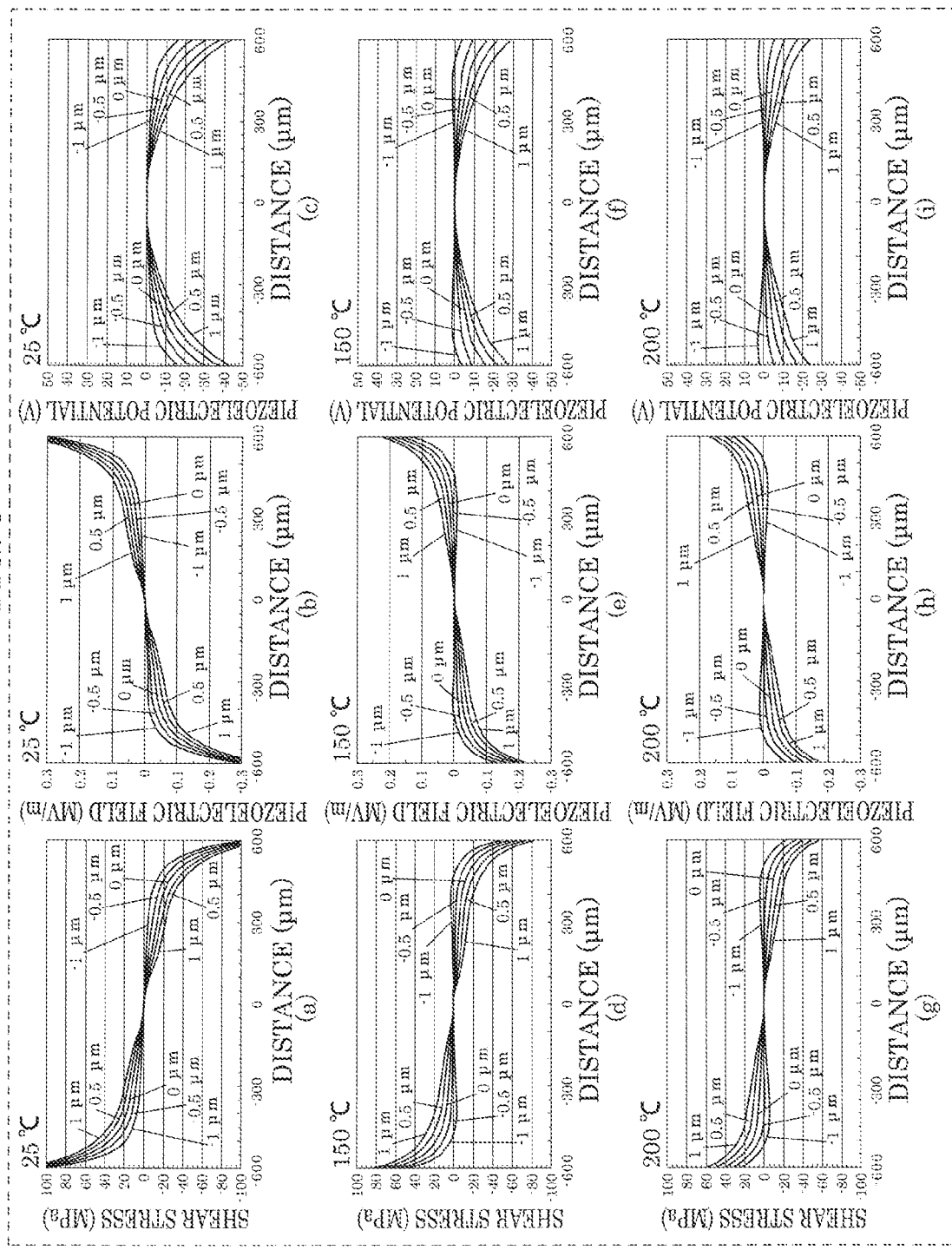
FIG. 5 shows graphs indicating the distributions of shear stresses and piezoelectric fields in the cavity length direction if the submount substrate comprises diamond.
Figure 6:
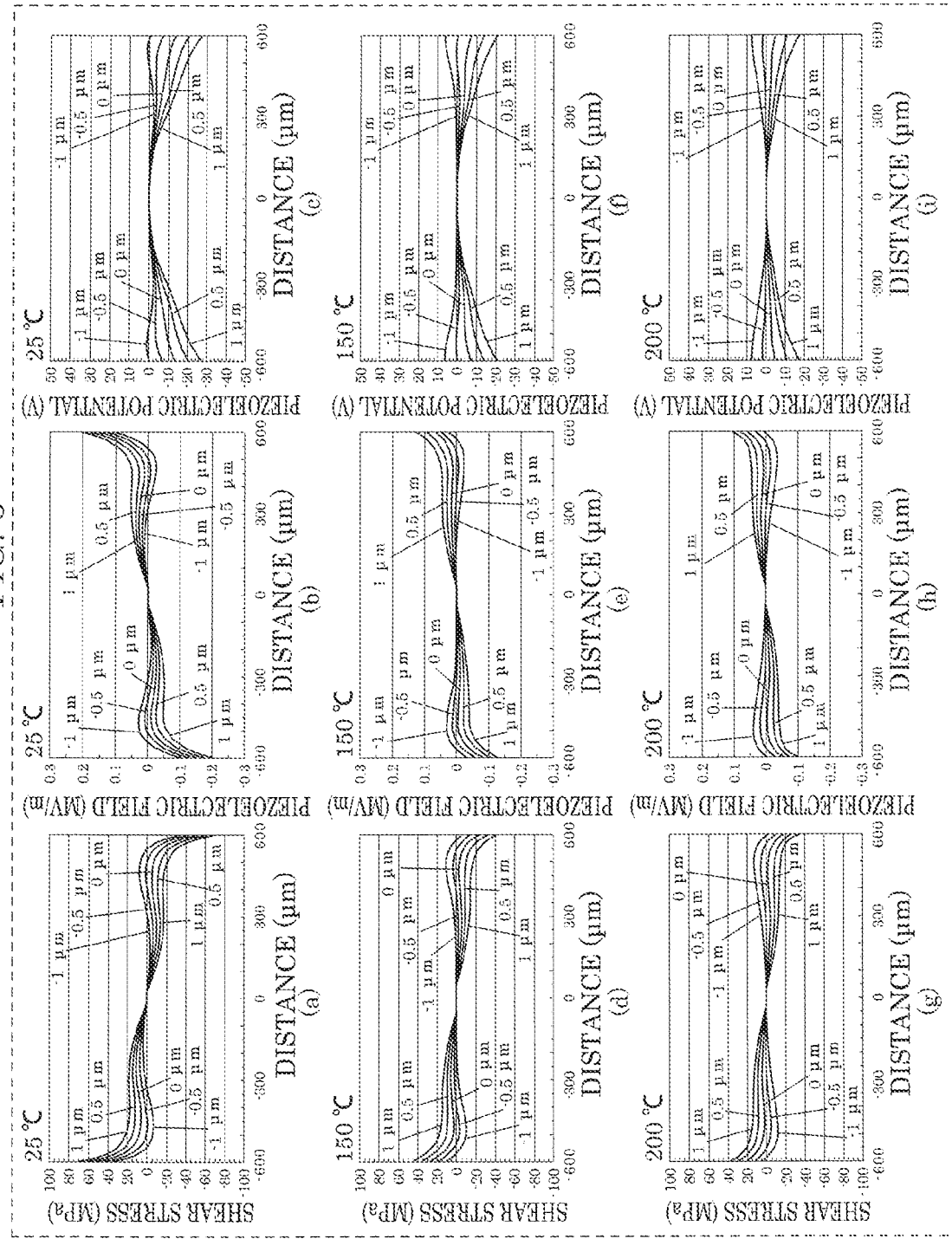
FIG. 6 shows graphs indicating the distributions of shear stresses and piezoelectric fields in the cavity length direction if the submount substrate comprises aluminum nitride (AlN)

FIGS. 4, 5, and 6 are graphs indicating the distributions of shear stresses and piezoelectric fields in the cavity length direction in the case where submount substrate 122 comprises diamond, silicon carbide (SiC), or aluminum nitride (AlN). SiC and AlN are widely used as submount substrate materials with excellent heat dissipation and high thermal conductivities when the semiconductor laser element is mounted.

Graphs (a), (b), and (c) in FIGS. 4 to 6 show the distributions of shear stresses, piezoelectric fields, and piezoelectric potentials (piezoelectric voltages) generated by the piezoelectric fields at 25° C. in the cavity direction. Semiconductor laser element 11 has a cavity length of 1200 µm and the coordinate of the center of semiconductor laser element 11 is 0 µm in the cavity direction.

Likewise, graphs (d), (e), and (f) in FIGS. 4 to 6 show the distributions of shear stresses, piezoelectric fields, and piezoelectric potentials generated by the piezoelectric fields at 150° C. in the cavity direction.

Similarly, graphs (g), (h), and (i) in FIGS. 4 to 6 show the distributions of shear stresses, piezoelectric fields, and piezoelectric potentials generated by the piezoelectric fields at 200° C. in the cavity direction.

The piezoelectric potential is 0 V at the center in the cavity direction. For example, in a 3-watt operation of an extra-high output semiconductor laser that comprises a nitride material and operates with high-wattage output, the quantum-well active layer has an extremely high optical density of several tens MW/cm$^2$ on the cavity end face. Thus, in order to prevent the occurrence of COD on the end face, a current non-injection window region is formed on the end face and non-radiative recombination is suppressed in a region near the end face so as to suppress a reduction of the COD level. It is thus necessary to suppress the leakage of injected current into the current non-injection window region. However, the piezoelectric potential may be lower in a region near the cavity end face than at the center in the cavity direction. In this case, current is likely to leak into the current non-injection window region and increases the occurrence of non-radiative recombination. This may generate heat and lower the COD level.

Thus, a large current of at least several amperes is injected in the semiconductor laser element during an operation with high-wattage output at a high temperature of 85° C. Hence, the direction of a piezoelectric field generated on the quantum-well active layer is controlled such that current injected into the semiconductor laser element is unlikely to flow toward the cavity end face. Consequently, even if the current non-injection window region is formed on the cavity end face, the semiconductor laser element may be deteriorated by a reduction in the COD level unless the occurrence of leakage current toward the cavity end face is minimized.

If the semiconductor laser element is operated at an environmental temperature of 85° C., the quantum-well active layer of the semiconductor laser element is heated to a high temperature of about 150° C. by heat generated by the power consumption of the semiconductor laser element. It is thus necessary to generate a piezoelectric potential so as to prevent leakage current into the current non-injection window region even at 150° C. or higher as well as at a room temperature.

If diamond is used for submount substrate 122, as shown in FIG. 4, a piezoelectric potential near the cavity end face is higher than that at the center in the cavity direction. If SiC and AlN are used for the submount, as shown in FIGS. 5 and 6, a piezoelectric potential near the cavity end face is lower than that at the center in the cavity direction.

This is because SiC has a thermal expansion coefficient of $6.6 \times 10^{-6}$ and AlN has a thermal expansion coefficient of $4.15 \times 10^{-6}$, whereas diamond has a thermal expansion coefficient of $1.1 \times 10^{-6}$, which is lower than $5.59 \times 10^{-6}$, a thermal expansion coefficient of GaN. A thermal residual stress will be described below. A thermal residual stress is generated when semiconductor laser element 11 is mounted on submount substrate 122 comprising diamond having a low thermal expansion coefficient.

When semiconductor laser element 11 is mounted on submount substrate 122 at a high temperature of about 300° C. with bonding layer 121 of AuSn solder, the influence of a thermal residual stress caused by a difference in thermal expansion coefficient between diamond submount substrate 122 and semiconductor laser element 11 is greater than that in the use of a submount substrate of SiC or AlN. Thus, if semiconductor laser element 11 is mounted on diamond submount substrate 122, a tensile stress in the cavity direction (z-axis direction) of semiconductor laser element 11 is larger than that of semiconductor laser element 11 mounted on a submount substrate of SiC or AlN. At this point, a shear stress in the yz-plane is generated in a direction that allows a piezoelectric potential on the cavity end face to be higher than that at the center in the cavity direction. This maximizes, if diamond submount substrate 122 is used, the effect of generating a higher piezoelectric potential in a region near the cavity end face than at the center in the cavity direction at a high temperature from 25° C. to 150° C. An analysis by the inventors proved that the effect is enhanced when a concave warp is formed in the cavity direction while GaN substrate 101 of semiconductor laser element 11 is placed on top of the multilayer structure. In the use of diamond submount substrate 122, if warp ΔR is 0.5 µm or less on GaN substrate 101, a higher piezoelectric potential is generated in a region near the cavity end face than at the center in the cavity direction even at a high temperature of 200° C.

Therefore, if diamond is used for submount substrate 122 and semiconductor laser element 11 is mounted with ΔR of 0.5 µm or less on GaN substrate 101 placed on top of the multilayer structure, a piezoelectric potential in a region near the cavity end face can be higher than that at the center in the cavity direction. Moreover, if diamond is used for submount substrate 122 and semiconductor laser element 11 is mounted with ΔR of less than 0 µm (a concave warp) on GaN substrate 101 placed on top of the multilayer structure, a piezoelectric potential in a region near the cavity end face can be further raised from that at the center in the cavity direction.

If SiC is used for the submount substrate, as shown in graphs (c), (f), and (i) in FIG. 5, it is difficult to raise a piezoelectric potential in a region near the cavity end face to a potential higher than that at the center in the cavity direction.

If AlN is used for the submount substrate, as shown in graphs (c), (f), and (i) in FIG. 6, it is necessary to control ΔR in a range of −1 µm or less in order to raise a piezoelectric potential in a region near the cavity end face to a potential higher than that at the center in the cavity direction.

In order to control warp ΔR of semiconductor laser element 11 to −1 µm or less for the element having a cavity length of 1200 µm, it is necessary to considerably increase the In composition in the InGaN layer (e.g., first light guide layer 105 and second light guide layer 107) used for the multilayer structure of the semiconductor laser element or considerably increase the thickness of the InGaN layer. In this case, a lattice defect is likely to occur in first light guide layer 105 and second light guide layer 107 due to a lattice misfit. Thus, warp ΔR excessively reduced in the negative direction is not suitable in view of the reliability of semiconductor laser element 11.

Diamond has a thermal conductivity of about 1000 W/m·K, which is quite higher than those of SiC (about 200 W/m·K) and AlN (about 150 W/m·K). Thus, semiconductor laser element 11 mounted junction-down with ΔR of 0.5 µm or less on diamond submount substrate 122 can achieve higher heat dissipation and a higher piezoelectric potential in a region near the cavity end face than at the center in the cavity direction. In order to further increase heat dissipation and a piezoelectric potential in a region near the cavity end face, the semiconductor laser element may be mounted with ΔR of 0 µm or less. This mounting configuration is quite suitable as a mounting configuration of a nitride blue semiconductor laser element that can guarantee reliability for an extended period in a high-temperature high-power operation.

A method of forming ΔR of 0.5 µm or less or obtaining a negative state (a concave warp with GaN substrate 101 placed on top of the multilayer structure) will be described below.

Since InN has a larger lattice constant than GaN, a compressive strain increases with the In composition in the InGaN layer. Thus, for example, if the In composition is increased in first light guide layer 105 and second light guide layer 107 that comprise InGaN in the structure of FIG. 1A, a compressive strain increases in the mean strain of the multilayer structure formed above GaN substrate 101, so that a concave warp tends to be formed with the substrate placed on top of the multilayer structure. By maximizing the In composition in an In-containing layer, ΔR can be reduced and a negative state can be obtained.

In this case, the mean strain ($\varepsilon_{ave}$) is defined by following Expression 1:

[Expression 1]

$$\varepsilon_{ave}(T) = \int_0^T \varepsilon(y) dy / T \qquad \text{(Expression 1)}$$

where ε(y) is an amount of a lattice misfit (strain) of each layer relative to GaN substrate 101 in the direction of the growth layer (position y) and T is a distance from GaN substrate 101 in the direction of the growth layer (i.e., the thickness of the multilayer structure) in the multilayer structure formed above GaN substrate 101. The lattice misfit is determined by following Expression 2:

$$(L_s - L_y)/L_s \qquad \text{(Expression 2)}$$

where $L_s$ is a lattice constant of GaN and $L_y$ is a lattice constant at each position in the direction of the growth layer. $\varepsilon_{ave}$ (T) indicates a mean strain amount from GaN substrate 101 to the position of thickness T in the multilayer structure on GaN substrate 101. Thus, if T is the thickness of the overall multilayer structure, $\varepsilon_{ave}$ (T) indicates an amount of a mean lattice misfit of the overall multilayer structure (the means strain of the overall multilayer structure: $\varepsilon_{tave}$). According to Expression 2, a strain has a negative value in the layer that receives a compressive strain.

Figure 7A:
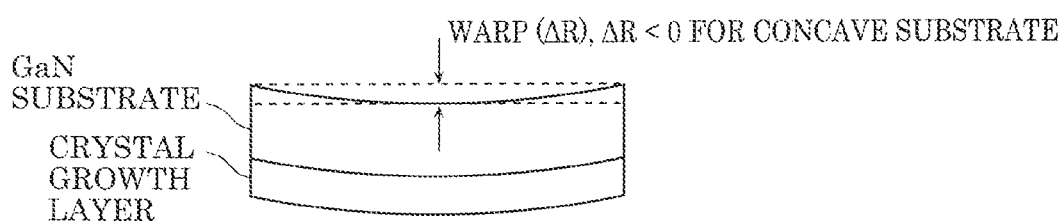
FIG. 7A is a schematic diagram for explaining the definition of warp ΔR.
Figure 7B:
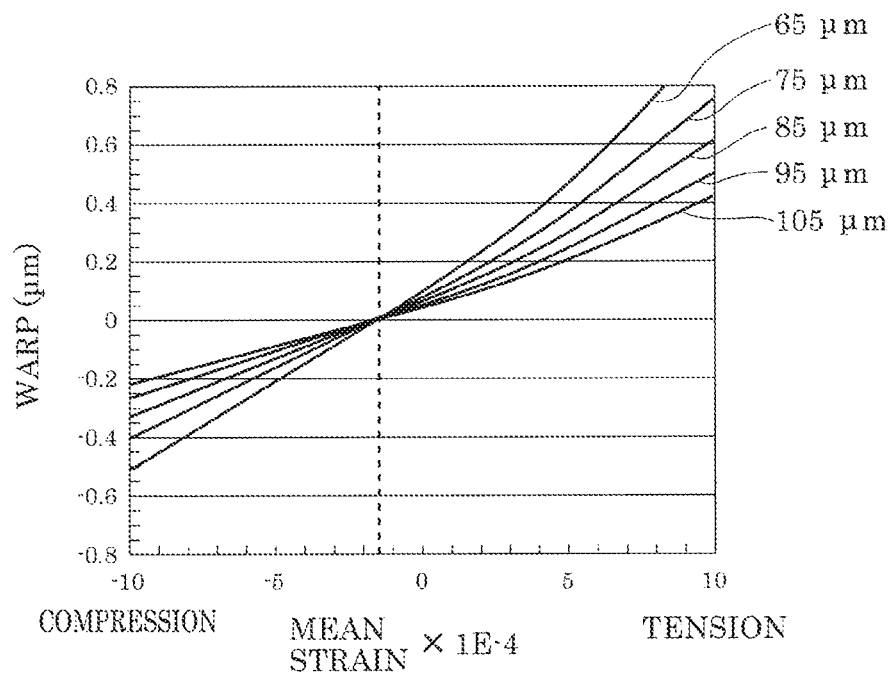
FIG. 7B is a graph showing the relationship between the mean strain and warp ΔR of the multilayer structure.

The relationship between warp ΔR and mean strain $\varepsilon_{tave}$ will be described below in accordance with the accompanying drawings. FIG. 7A is a schematic diagram for explaining the definition of warp ΔR. FIG. 7B is a graph showing the relationship between the mean strain and warp ΔR of the multilayer structure. FIG. 7B shows the calculation results of the mean strain dependence of warp ΔR in the overall multilayer structure if the thickness of GaN substrate 101 is changed from 65 µm to 105 µm in 10-µm intervals.

As illustrated in FIG. 7A, if GaN substrate 101 disposed on a crystal growth layer constituting the multilayer structure has a concave top surface, warp ΔR is defined as a negative value.

As shown in FIG. 7B, warp ΔR of semiconductor laser element 11 hardly depends upon the thickness of GaN substrate 101. If mean strain $\varepsilon_{tave}$ of the overall multilayer structure is a compressive strain of $-1.5 \times 10^{-4}$ or less, warp ΔR has a negative value (a concave warp with GaN substrate 101 placed on top of the multilayer structure). Furthermore, it is understood that the smaller the thickness of GaN substrate 101, the larger the change of a warp relative to mean strain $\varepsilon_{tave}$. This is because the smaller the thickness of GaN substrate 101, the greater the influence of mean strain $\varepsilon_{tave}$ of the multilayer structure on the warp of overall semiconductor laser element 11. If GaN substrate 101 has a small thickness, a crack is likely to occur during a working process on a wafer after crystal growth. Conversely, if the thickness is too large, it is difficult to form a wafer cleavage for forming the cavity end face of the laser element. In order to facilitate cleavage and prevent damage to the wafer during other working processes on semiconductor laser element 11, GaN substrate 101 may have a thickness of 75 µm to 95 µm or 85 µm±5 In this case, if mean strain $\varepsilon_{tave}$ of the overall multilayer structure is controlled to 0 or less to be a compressive strain, ΔR has a value of 0.1 µm or less. If mean strain $\varepsilon_{tave}$ is $-1.5 \times 10^{-4}$ or less, ΔR has a negative value (a concave warp with GaN substrate 101 placed on top of the multilayer structure). The results of FIG. 4 show that if ΔR is 0.1 µm or less, a piezoelectric potential on the cavity end is stably higher than that at the center in the cavity direction even when quantum-well active layer 106 has a temperature of 200° C. or higher, thereby reducing leakage current into the current non-injection window region.

Figure 8A:
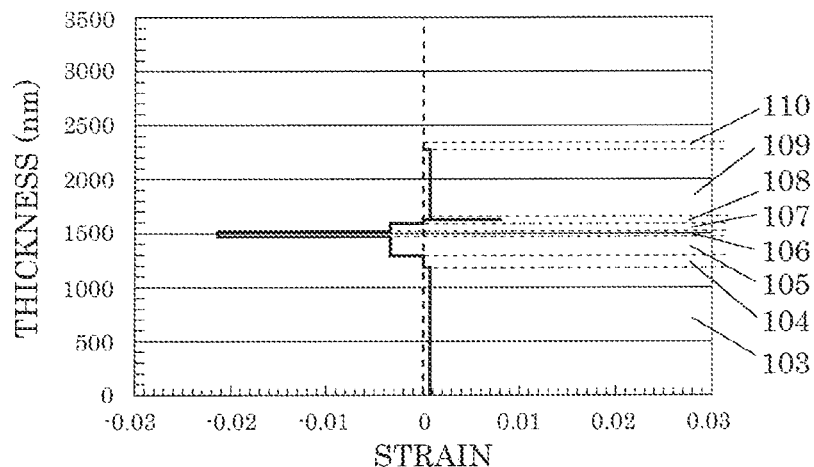
FIG. 8A is a graph showing an example of the distribution of lattice misfits (strains) in a thickness direction in a multilayer structure according to Embodiment 1.
Figure 8B:
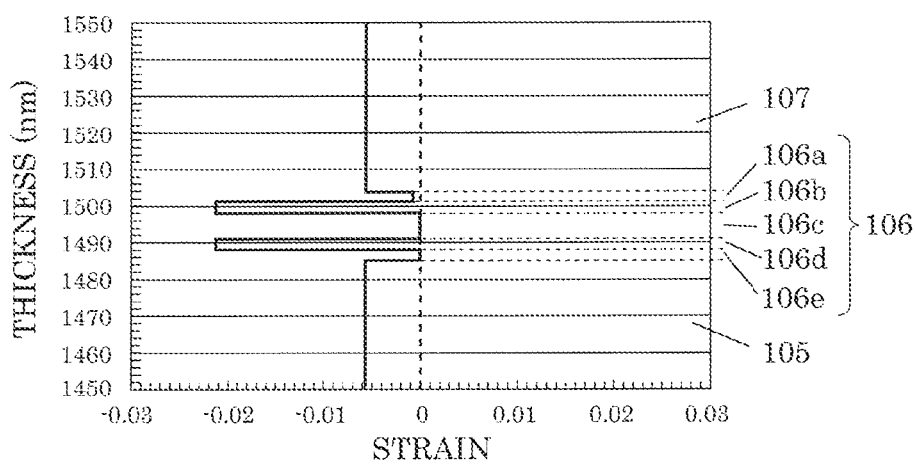
FIG. 8B is an enlarged view of the part of a quantum-well active layer in FIG. 8A.
Figure 8C:
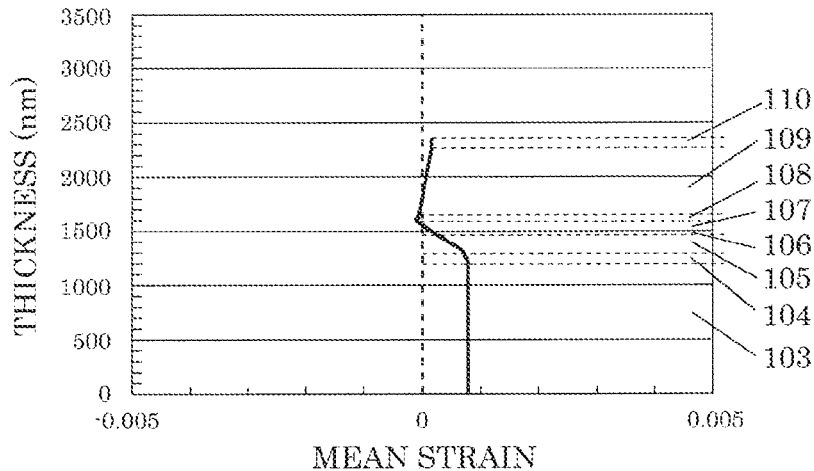
FIG. 8C is a graph showing an example of the distribution of mean strains $\varepsilon_{tave}$ in the direction of a growth layer of the multilayer structure according to Embodiment 1.

Mean strain $\varepsilon_{tave}$ of the multilayer structure according to Embodiment 1 in FIG. 1A will be described below in accordance with the accompanying drawings. FIG. 8A is a graph showing an example of the distribution of lattice misfits (strains) in the thickness direction in the multilayer structure according to Embodiment 1. FIG. 8B is an enlarged view of the part of quantum-well active layer 106 in FIG. 8A. FIG. 8C is a graph showing an example of the distribution of mean strains $\varepsilon_{tave}$ in the direction of the growth layer of the multilayer structure according to Embodiment 1. FIGS. 8A to 8C show strains in the case where the In composition is 0.8% in barrier layers 106a, 106c, and 106e of the multilayer structure, first light guide layer 105 of InGaN and second light guide layer 107 of InGaN are 185 nm and 100 nm, respectively, in thickness, and the In composition is 0.03 (3%) in the light guide layers. It is understood that mean strain $\varepsilon_{tave}$ is $-1.9 \times 10^{-4}$, which is a tensile mean strain, in the overall multilayer structure. Therefore, in the configuration of the multilayer structure, the mean strain of the overall layer is a tensile strain and warp ΔR of the element is positive after crystal growth. It is thus necessary to increase the In composition of the layer or increase the thickness of the layer in order to obtain a compressive mean strain in the overall multilayer structure. In the structure of FIG. 1A, the In composition is to be examined in In-containing layers, that is, first light guide layer 105, second light guide layer 107, and barrier layers 106a, 106c, and 106e.

However, a lattice misfit relative to GaN substrate 101 increases with the In composition of the In-containing layer, so that a lattice defect is likely to occur. Furthermore, a piezo polarization charge increases on a heterointerface and thus changes the band structure. Unfortunately, the operating voltage increases accordingly. It is thus necessary to carefully set the In composition. Referring to FIG. 2, the detail will be described below.

As shown in FIG. 2, the piezoelectric effect biases the wave function to the end of the quantum well layer. The interaction between an electron and a hole that are injected in the quantum well layer increases with the overlap integral of the wave functions of the electron and the hole. Therefore, if the electron and hole wave functions are biased, the interaction decreases. This reduces an amplified gain (hereinafter referred to as "gain") in quantum-well active layer 106 at the same injected current. The lasing threshold current value increases accordingly.

Figure 9A:
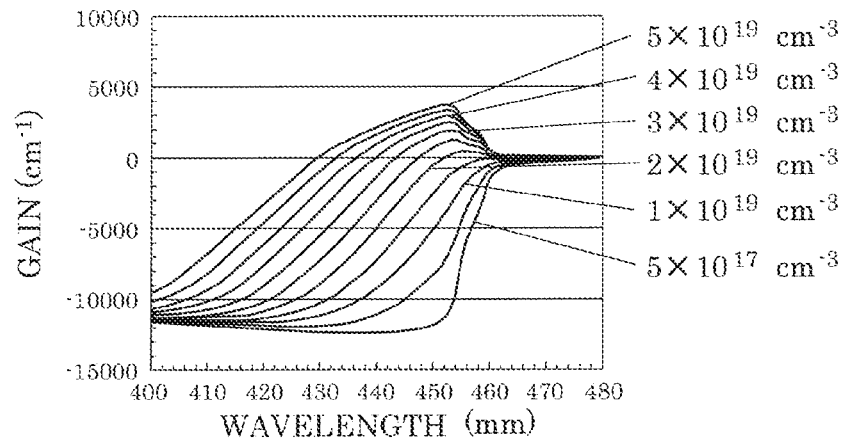
FIG. 9A is a graph showing the calculation results of dependence on carrier densities and the wavelengths of gains obtained in the quantum-well active layer in consideration of a piezoelectric effect.
Figure 9B:
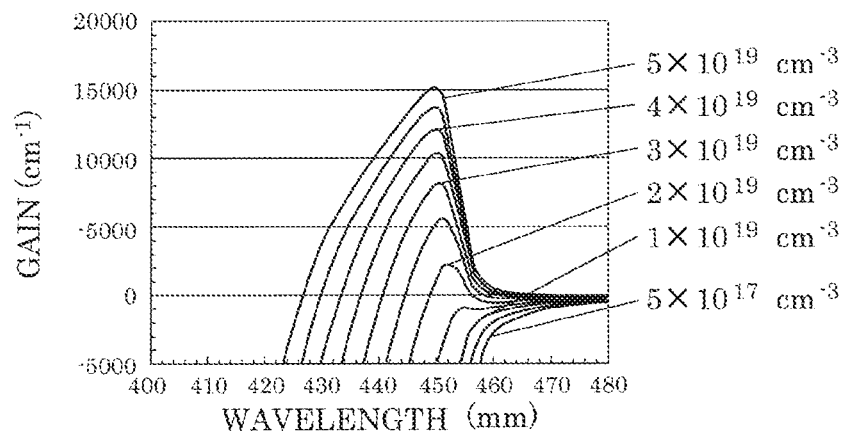
FIG. 9B is a graph showing the calculation results of dependence on carrier densities and the wavelengths of gains obtained in the quantum-well active layer regardless of the piezoelectric effect.
Figure 9C:
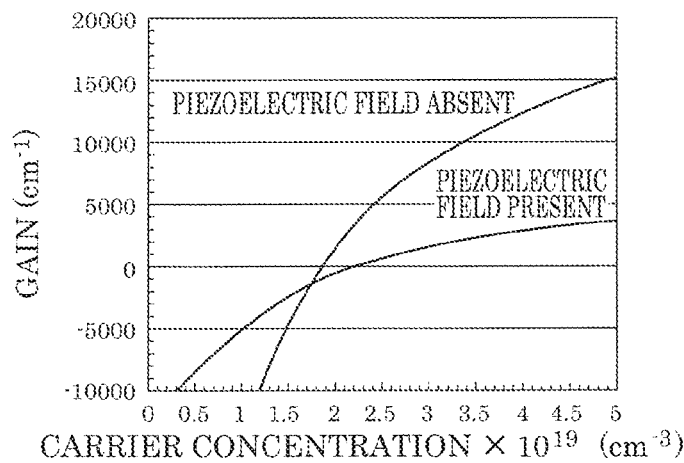
FIG. 9C is a graph showing the calculation results of the dependence of gains on carrier densities in carrier injection into the quantum-well active layer.

A gain obtained in the quantum-well active layer will be described below in accordance with the accompanying drawings. FIG. 9A is a graph showing the calculation results of dependence on carrier densities and the wavelengths of gains obtained in the quantum-well active layer in consideration of the piezoelectric effect. FIG. 9B is a graph showing the calculation results of dependence on carrier densities and the wavelengths of gains obtained in the quantum-well active layer regardless of the piezoelectric effect. FIG. 9C is a graph showing the calculation results of the dependence of gains on carrier densities in carrier injection into the quantum-well active layer. FIG. 9C shows gains in consideration of the piezoelectric effect (in the presence of a piezoelectric field) and regardless of the piezoelectric effect (in the absence of a piezoelectric field). As shown in FIGS. 9A to 9C, the gain is reduced by the piezoelectric effect.

This is because the piezoelectric effect inclines the band structure of the quantum well layer and biases the wave functions in the quantum well layer as shown in graph (c) in FIG. 2. Thus, in order to suppress a bias of the wave functions, the absolute value of a piezoelectric field on the quantum well layer may be reduced.

Figure 10:
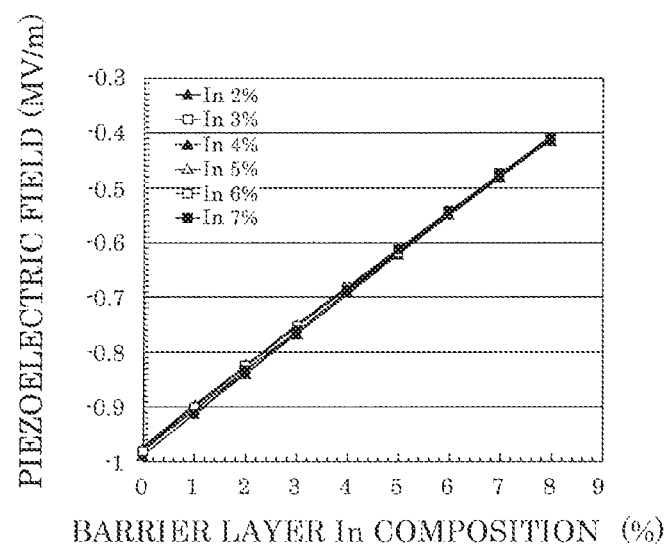
FIG. 10 is a graph showing the dependence of a piezoelectric field, which is generated on the quantum well layer, on the In composition of a barrier layer.

The relationship between a piezoelectric field on the quantum well layer and the In composition of the barrier layer will be described below in accordance with the accompanying drawings. FIG. 10 is a graph showing the dependence of a piezoelectric field, which is generated on the quantum well layer, on the In composition of the barrier layer. FIG. 10 shows the calculation results of the dependence of a piezoelectric field on the In composition of the barrier layer in cases where the first light guide layer and the second light guide layer are used with an In composition of 2% to 7%.

As shown in FIG. 10, a piezoelectric field generated on the quantum well layer does not depend on the In composition of each of the InGaN light guide layers. As the In composition of the barrier layer increases, the absolute value of a piezoelectric field on the quantum well layer decreases. It is thus understood that the In composition of the barrier layer may be increased to suppress a reduction in the gain of the active layer when the gain is reduced by the piezoelectric effect.

Figure 11:
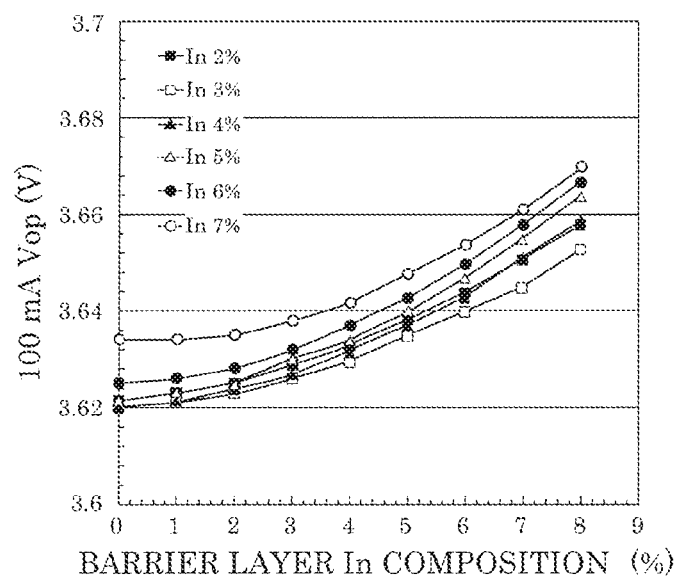
FIG. 11 is a graph showing the calculation results of the dependence of an operating voltage on the In composition of the barrier layer during an operation of the semiconductor laser element at 100 mA.

However, as the In composition of the barrier layer increases, a piezo polarization charge generated on an interface with the light guide layer increases. This may raise the operating voltage. FIG. 11 is a graph showing the calculation results of the dependence of an operating voltage on the In composition of the barrier layer during an operation of the semiconductor laser element at 100 mA. FIG. 11 shows the calculation results of the dependence of an operating voltage on the In composition of the barrier layer in cases where the first light guide layer and the second light guide layer are used with an In composition of 2% to 7%. According to the results of FIG. 11, the operating voltage increases when the In composition of each of the InGaN light guide layers is at least 0.06% (6%). The operating voltage considerably increases when the In composition of the barrier layer is at least 0.06% (6%). It is thus understood that the In composition of each of the light guide layers may be set at 0.06% (6%) or less or 0.05% (5%) or less and the In composition of the barrier layer may be set at 0.06% (6%) or less in order to suppress an increase in operating voltage. Moreover, it is understood that if the In composition of the barrier layer is at least 0.01% (1%), the operating voltage is minimized when the In composition of the guide layer is 0.03% (3%). An increase in operating voltage accelerates self-heat during an operation of the semiconductor laser element, requiring a minimum operating voltage.

The relationship between a piezoelectric field and a gain will be described below in accordance with the accompanying drawings.

Figure 12:
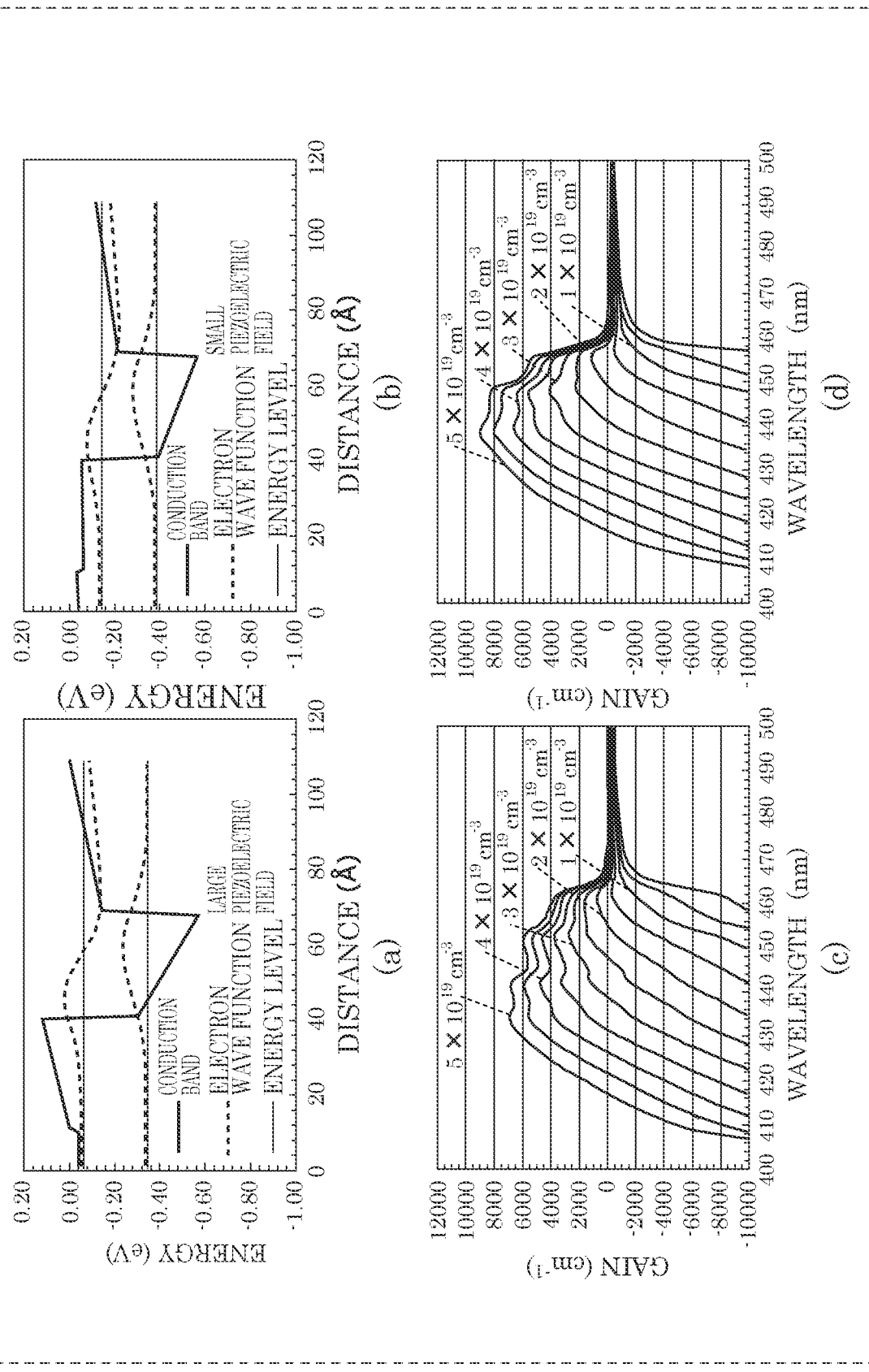
FIG. 12 shows the relationship between a piezoelectric field and a gain of the semiconductor laser element according to Embodiment 1.

FIG. 12 shows the relationship between a piezoelectric field and a gain of semiconductor laser element 11 according to Embodiment 1. Graphs (a) and (b) in FIG. 12 show the band structures of conduction bands when the In compositions of the barrier layer are 0.8% and 4%. Graphs (a) and (b) in FIG. 12 also show electron wave functions and energy levels. Graphs (c) and (d) in FIG. 12 show the wavelength dependence of a gain when the In compositions of the barrier layer are 0.8% and 4%. Graphs (c) and (d) in FIG. 12 show the wavelength dependence of gains in cases where the density of carriers injected into the quantum-well active layer is changed as a parameter. It is understood that the In composition of 4% in the barrier layer generates a smaller piezoelectric field on the quantum well layer and a larger gain for the same injected carrier. This can reduce a lasing threshold current value, thereby reducing the power consumption of the semiconductor laser element.

Figure 13:
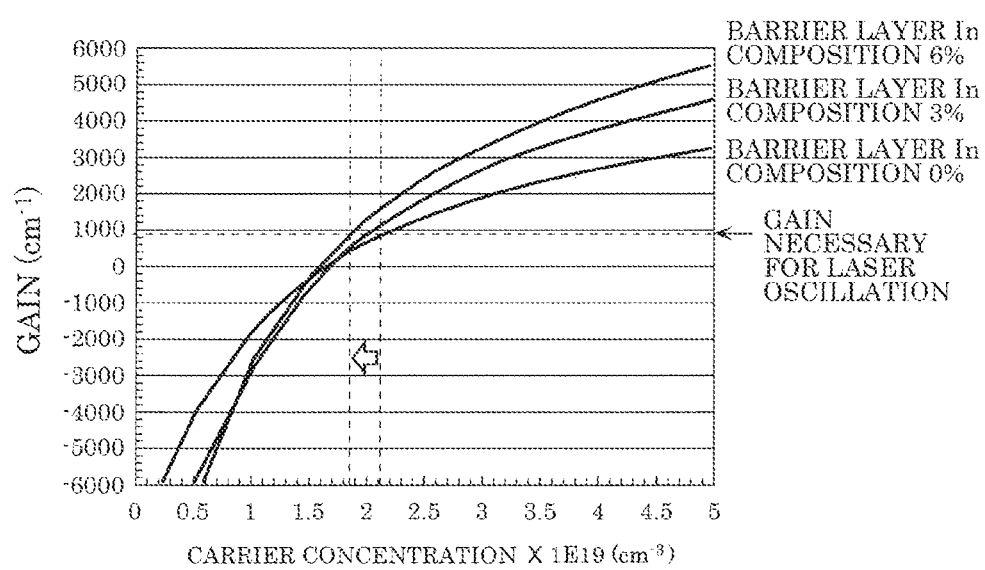
FIG. 13 is a graph showing the dependence of a gain of the semiconductor laser element on a carrier concentration according to Embodiment 1.

The dependence of a gain on a carrier concentration will be described below in accordance with the accompanying drawings. FIG. 13 is a graph showing the dependence of a gain of semiconductor laser element 11 on a carrier concentration according to Embodiment 1. FIG. 13 shows the calculation results of gains at a wavelength of 450 nm when the In compositions of the barrier layer are 0%, 3%, and 6%. In Embodiment 1, the cavity length is 1200 μm and the front end face and the rear end face are coated with a reflectivity of 16% and a reflectivity of 95%, respectively. In this case, the cavity has a mirror loss of 7.8 cm$^{-1}$. A waveguide loss of about 5 cm$^{-1}$ is added to the mirror loss, so that the total loss of the cavity is about 12.8 cm$^{-1}$. In the semiconductor laser element according to Embodiment 1, the quantum-well active layer has quite a small thickness of about 30 Å and thus an optical confinement factor for the DQW active layer typically has a small value of 1% to 2%. In this case, a gain necessary for laser oscillation is 640 cm$^{-1}$ to 1280 cm$^{-1}$. In FIG. 13, a gain necessary for laser oscillation is 800 cm$^{-1}$, which is indicated by a dotted line.

As shown in FIG. 13, when the quantum-well active layer has a gain of 640 cm$^{-1}$ to 1280 cm$^{-1}$ necessary for laser oscillation, laser oscillation can be obtained with a low carrier injection density by increasing the In composition of the barrier layer from 0% to 6%. However, as described above, the operating voltage tends to increase with the In composition of the barrier layer. Thus, in order to reduce the lasing threshold current value and increase the compression of mean strain $\varepsilon_{tave}$ of the multilayer structure without considerably raising the operating voltage, the In composition of the barrier layer is 4% in Embodiment 1.

Figure 14A:
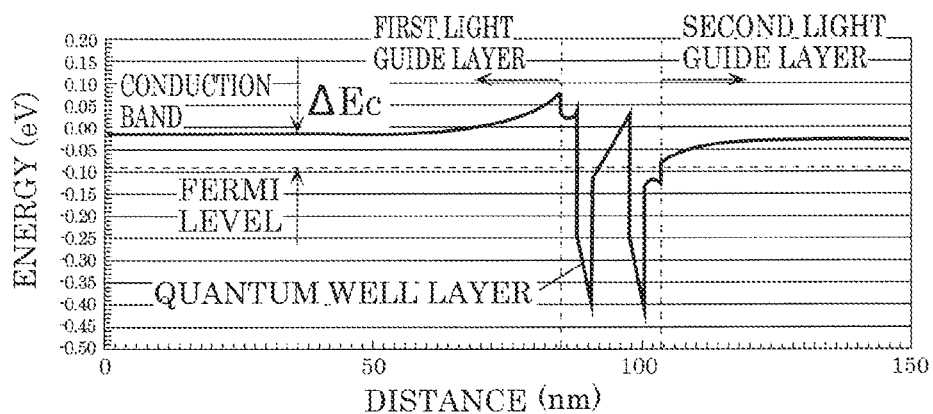
FIG. 14A is a graph showing the relationship between conduction band energy and the Fermi level (Fermi energy) of a region near quantum-well active layer 106 in the semiconductor laser element according to Embodiment 1.
Figure 14B:
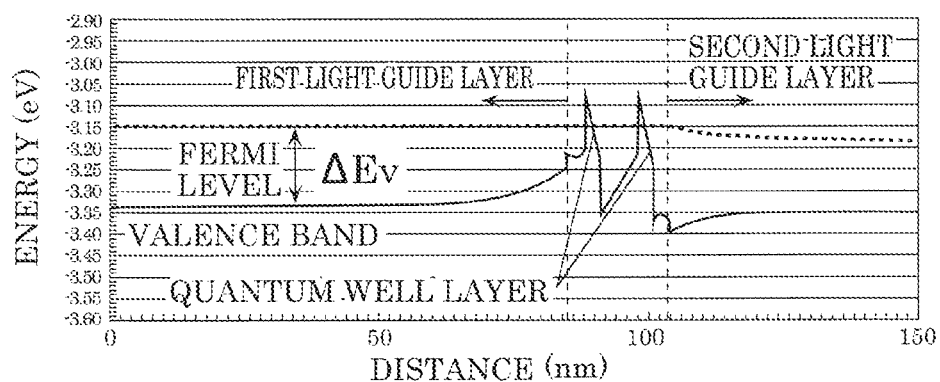
FIG. 14B is a graph showing the relationship between valence band energy and the Fermi level of the region near quantum-well active layer 106 in the semiconductor laser element according to Embodiment 1.
Figure 14C:
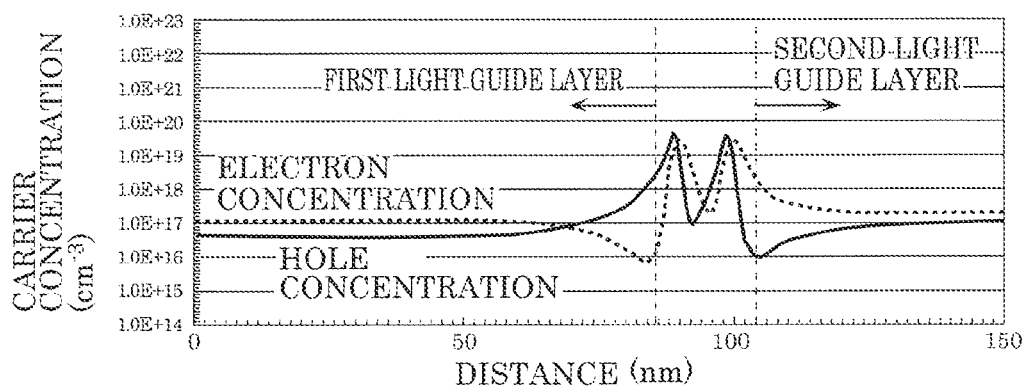
FIG. 14C is a graph showing an electron/hole concentration distribution determined by the relationship between conduction band energy and the Fermi level of the region near quantum-well active layer 106 in the semiconductor laser element according to Embodiment 1.

The influence of the In composition of first light guide layer 105 and second light guide layer 107 that comprise InGaN on a waveguide loss will be described below in accordance with the accompanying drawings. FIG. 14A is a graph showing the relationship between conduction band energy and the Fermi level (Fermi energy) of a region near quantum-well active layer 106 in semiconductor laser element 11 according to Embodiment 1. FIG. 14B is a graph showing the relationship between valence band energy and the Fermi level of a region near quantum-well active layer 106 in semiconductor laser element 11 according to Embodiment 1. FIG. 14C is a graph showing an electron/hole concentration distribution determined by the relationship between conduction band energy and the Fermi level of a region near quantum-well active layer 106 in semiconductor laser element 11 according to Embodiment 1.

FIGS. 14A to 14C show the calculation results of each distribution in the direction of the growth layer during a 100 mA operation if the In composition is 3% in first light guide layer 105 and second light guide layer 107 and the In composition is 5% in the barrier layer. ΔEc in FIG. 14A and ΔEv in FIG. 14B indicate a difference between conduction band energy and Fermi energy (conduction band energy–Fermi energy) and a difference between valence band energy and Fermi energy (Fermi energy–valence band energy), respectively. Small ΔEc indicates that a conduction band contains high-energy electrons on average with a high electron concentration. Likewise, the smaller ΔEv, the higher the hole concentration in the conduction band.

As described above, as the In composition increases in the light guide layers, compression rises in mean strain $\varepsilon_{tave}$ of the multilayer structure. Thus, ΔR can be controlled in the negative direction. However, as the In composition increases in the light guide layers, the band gap energy decreases. Moreover, the free carriers of electrons and holes that are generated in the light guide layers increase during an operation of the semiconductor laser element, thereby increasing a waveguide loss.

In the state of FIG. 14C, first light guide layer 105 contains electrons of $1.2 \times 10^{17}$ cm$^{-3}$ and holes of $6 \times 10^{16}$ cm$^{-3}$ on average and second light guide layer 107 contains holes of $9 \times 10^{16}$ cm$^{-3}$ and electrons of $1.8 \times 10^{17}$ cm$^{-3}$ on average. In this operating state, a free carrier loss occurs according to the carrier concentration. The concentrations of electrons and holes in the light guide layers are affected by the bandgaps of the light guide layers and the barrier layers. Thus, it is necessary to carefully set the bandgaps of the light guide layers and the barrier layers, that is, the In composition.

Figure 15:
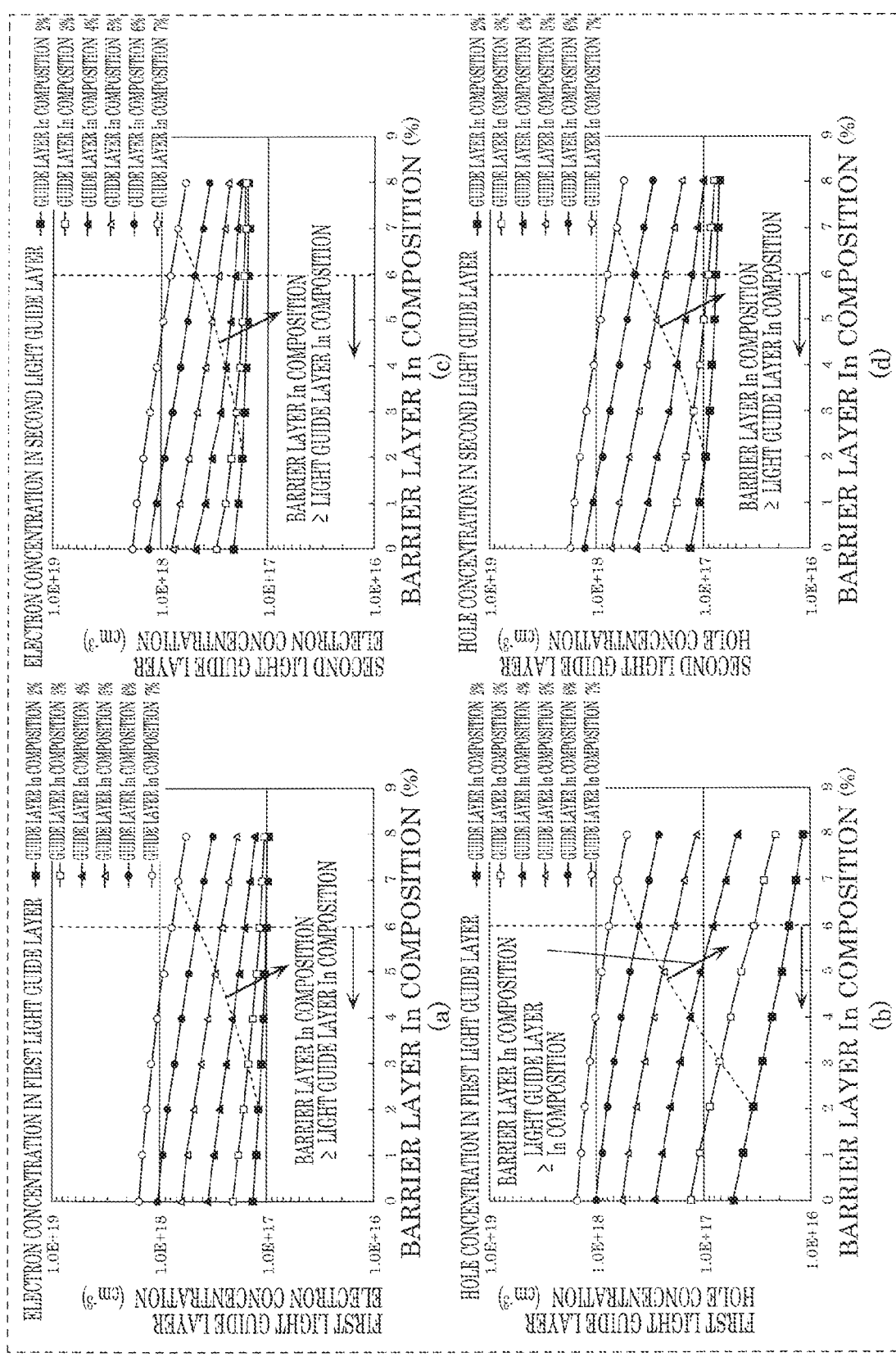
FIG. 15 shows the relationship between carrier concentrations in the light guide layers and In compositions in the barrier layer and the light guide layers in the semiconductor laser element according to Embodiment 1.

The relationship between carrier concentrations in the light guide layers and In compositions in the barrier layer and the light guide layers will be described below in accordance with the accompanying drawings. FIG. 15 shows the relationship between carrier concentrations in the light guide layers and In compositions in the barrier layer and the light guide layers in the semiconductor laser element according to Embodiment 1. Graphs (a) and (b) in FIG. 15 show the dependence of an electron concentration and a hole concentration in first light guide layer 105 on the In composition of the barrier layer in a 100 mA operation. Graphs (c) and (d) in FIG. 15 show the dependence of an electron concentration and a hole concentration in second light guide layer 107 on the In composition of the barrier layer in a 100 mA operation. Each of the graphs shows the dependence of a calculated carrier concentration on the In composition of the barrier layer in cases where the In composition of the light guide layer is changed. In compositions in first light guide layer 105 and second light guide layer 107 are identical to each other.

Each of the graphs in FIG. 15 shows the mean value of electron and hole concentrations in the light guide layers.

As shown in FIG. 15, electron and hole concentrations in the light guide layers increase with the In compositions in the light guide layers. This is because as the In composition increases, bandgap energy in the light guide layer decreases so as to reduce ΔEc and ΔEv. In particular, if the In composition is at least 6% in the light guide layer, electron and hole concentrations in the light guide layer are nearly $1 \times 10^{18}$ cm$^{-3}$, so that a free carrier loss is increased by about 0.5 cm$^{-1}$ from a state where the In composition is at least 2% in the light guide layer. This reduces slope efficiency (ΔP/ΔI) in current-optical output characteristics. Where ΔP is a change of optical output and ΔI is a change of injected current. Thus, in order to control electron and hole concentrations in the light guide layers to $1 \times 10^{18}$ cm$^{-3}$ or less, it is necessary to set the In compositions of the light guide layers to 6% or less. Alternatively, the In compositions of the light guide layers may be set to 5% or less in order to control electron and hole concentrations in the light guide layers to $1 \times 10^{18}$ cm$^{-3}$ or less. By setting the In compositions to 5% or less in the light guide layers, electron and hole concentrations in the light guide layers can be more stably suppressed to $1 \times 10^{18}$ cm$^{-3}$ or less.

According to the calculation results of FIG. 15, electron and hole concentrations in the light guide layers decrease as the In composition in the barrier layer increases. This is because as the In composition of the barrier layer increases, a piezo polarization charge generated between the light guide layer and the quantum-well layer is likely to disperse to an interface between the light guide layer and the barrier layer and an interface between the barrier layer and the quantum well layer and thus as shown in graphs (a) and (b) in FIG. 12 and FIG. 14A, a piezoelectric field generated on an interface between barrier layers 106a and 106e decreases, the barrier layers being each disposed between the light guide layer and the quantum well layer. Thus, ΔEc and ΔEv increase with the In composition of the barrier layer, so that electron and hole concentrations in the light guide layers may decrease.

It is thus understood that in order to attain three objects: (1) to suppress the occurrence of a free carrier loss in the light guide layer, (2) to prevent an increase in operating voltage, and (3) to suppress a piezoelectric field generated on the quantum-well active layer, increase the gain of the quantum-well layer, and reduce the lasing threshold current value, the In composition is to be 6% or less (or 5% or less) in the light guide layer and the barrier layer and the In composition of the barrier layer is to be equal to or higher than that of the light guide layer. Moreover, in order to increase the optical confinement factor perpendicularly to a light distribution, an In composition of at least 2.5% is necessary for the light guide layers. Furthermore, if the In composition is at least 3% in the light guide layers, the occurrence of a carrier overflow can be suppressed even in a high-temperature high-power operation.

In the multilayer structure according to Embodiment 1 illustrated in FIG. 1A, the In composition of the first light guide layer is 3%, the first light guide layer is 200 nm in thickness, the In composition of the second light guide layer is 3%, the second light guide layer is 180 nm in thickness, and the In composition is 4% in barrier layers 106a, 106c, and 106e. Thus, the mean strain $\varepsilon_{tave}$ of the overall multilayer structure is $-1 \times 10^{-5}$, which is a compressive strain.

In this case, ΔR is 0.1 μm or less for the submount substrate comprising diamond. The results of FIG. 4 show that a piezoelectric potential on the cavity end is stably higher than that at the center in the cavity direction even when quantum-well active layer 106 has a high temperature of 200° C. or higher, thereby preventing leakage current into the current non-injection window region.

If the In composition of the first light guide layer is 3%, the first light guide layer is 175 nm in thickness, the In composition of the second light guide layer is 3%, the second light guide layer is 98 nm in thickness, and the In composition is 4% in barrier layers 106a, 106c, and 106e, mean strain $\varepsilon_{tave}$ of the overall multilayer structure is $2.5 \times 10^{-4}$.

The results of graph (i) in FIG. 4 show that when quantum-well active layer 106 has a high temperature of 200° C., the piezoelectric potential distribution of the quantum-well active layer is substantially kept constant in the cavity direction while ΔR is 0.5 μm or more, eliminating the effect of preventing leakage current into the current non-injection window region. Thus, by setting ΔR at 0.25 μm or less, leakage current into the current non-injection window region can be continuously prevented up to a high temperature of 200° C.

In this case, the results of FIG. 7B show that mean strain $\varepsilon_{tave}$ of the overall multilayer structure is $6.2 \times 10^{-4}$ or less when GaN substrate 101 has a thickness of 105 μm, mean strain $\varepsilon_{tave}$ of the overall multilayer structure is $5.2 \times 10^{-4}$ or less when GaN substrate 101 has a thickness of 95 μm, mean strain $\varepsilon_{tave}$ of the overall multilayer structure is $4.2 \times 10^{-4}$ or less when GaN substrate 101 has a thickness of 85 μm, mean strain $\varepsilon_{tave}$ of the overall multilayer structure is $3.2 \times 10^{-4}$ or less when GaN substrate 101 has a thickness of 75 μm, and mean strain $\varepsilon_{tave}$ of the overall multilayer structure is $2.2 \times 10^{-4}$ or less when GaN substrate 101 has a thickness of 65 μm, so that ΔR can be set at 0.25 μm or less.

Hence, if GaN substrate 101 has a thickness of 95 μm or less, mean strain $\varepsilon_{tave}$ of the overall multilayer structure is set at $5.2 \times 10^{-4}$ or less, so that leakage current into the current non-injection window region can be continuously prevented even at a high temperature of 200° C. or higher.

The results of graph (i) in FIG. 4 show that when ΔR is 0.25 μm or less, a piezoelectric potential on quantum-well active layer 106 in the cavity direction starts gradually increasing, at a distance of 300 μm from the center position in the cavity direction, from a potential at the center of the cavity even at a high temperature of 200° C. or higher. A potential difference in the cavity direction is an integral of a piezoelectric field in the cavity direction, the piezoelectric field being generated in the cavity direction. Thus, the larger the distance in the cavity direction, the greater the influence of a piezoelectric field in the cavity direction.

Thus, if the cavity length is at least 600 μm and GaN substrate 101 has a thickness of 95 μm or less, the current non-injection window region can have a higher piezoelectric potential than the cavity center even at a high temperature of 200° C. or higher by setting mean strain $\varepsilon_{tave}$ of the overall multilayer structure at $5.2 \times 10^{-4}$ or less. This can keep the effect of preventing current leakage into the current non-injection window region.

In this case, if the semiconductor laser element is operated with high power, an optical density increases on the cavity end face and catastrophic optical damage (COD) is likely to occur so as to damage the cavity end face by the laser beam of the semiconductor laser element. Thus, the reliability of the semiconductor laser element declines.

According to the present embodiment, the extended cavity achieves the enhanced effect of preventing leakage current into the current non-injection window region in addition to a reduction in the thermal resistance of the semiconductor laser element. Thus, the occurrence of COD can be further suppressed even if the optical output of the semiconductor laser element is increased.

Therefore, the extended cavity length can improve the effect of suppressing the occurrence of COD as well as heat dissipation in the structure of the present embodiment.

However, the extended cavity length may upsize the semiconductor laser element so as to raise the manufacturing cost. For this reason, the cavity length needs to be minimized with respect to desired high power.

For example, at the cavity lengths of 1200 μm, 1500 μm, and 2000 μm, the semiconductor laser element can reliably operate for an extended period at 85° C. with high power of 3 W or more, 3.5 W to 4 W, and 4 W to 4.5 W, respectively. If the cavity length is 2000 μm or longer, the semiconductor laser element can reliably operate for an extended period at 85° C. with at least 4.5 W power.

In the structure of Embodiment 1, electron barrier layer 108 is configured to have the AlGaN layer with an Al composition of 0.3 (30%) and a thickness of 5 nm. Since bandgap energy increases with the Al composition, energy barrier rises for electrons in the conduction band, thereby suppressing leakage current. However, if the Al composition and the thickness of electron barrier layer 108 are excessively increased, a tensile strain increases in the mean strain of the multilayer structure, thereby raising $\varepsilon_{tave}$. Thus, in order to suppress an increase in tensile strain while increasing the energy barrier for electrons, the Al composition may be maximized to at least 30% in electron barrier layer 108, an Al composition in a region within ±1 nm from position X in the thickness direction of the growth film of electron barrier layer 108, in which the maximum Al composition is provided, may be substantially equal to the maximum Al composition, and an Al composition outside the region may decrease away from position X. Moreover, electron barrier layer 108 may have a thickness of 7 nm or less.

In the structure of electron barrier layer 108, specifically, a first region, a second region, and a third region may be sequentially formed. The first region has a thickness of 2 nm and an Al composition of 0.02 (2%), the second region has a thickness of 3 nm and an Al composition that increases from 0.02 (2%) to 0.36 (36%), and the third region has a thickness of 0 nm to 2 nm and a constant Al composition of 0.36 (36%). This configuration reduces the mean Al composition of electron barrier layer 108 while forming the potential barrier for electrons with the maximum Al composition of 0.36 (36%), thereby suppressing an increase in tensile strain.

The first region is formed with a relatively low and constant Al composition in the configuration of electron barrier layer 108, thereby improving the control of an Al composition distribution in the second region formed thereafter in the electron barrier layer. In other words, the formation of the first region facilitates the control of the Al composition distribution in the second region to a desired distribution.

In the configuration of electron barrier layer 108, the same effect can be obtained when the maximum Al composition is 0.3 (30%) or more. When the maximum Al composition is 0.4 (40%) or more, however, a potential barrier for a hole also increases so as to raise the operating voltage. Thus, the maximum Al composition of the electron barrier layer may be 0.3 (30%) to 0.4 (40%).

The mean Al composition of overall electron barrier layer 108 increases with the Al composition of the first region. If the Al composition of the first region is 0.1 (10%) or less, the mean Al composition of the electron barrier layer can be reduced to nearly a half of the maximum Al composition or less.

In this case, ΔR is 0.2 μm or less. The results of FIG. 4 show that even if quantum-well active layer 106 reaches a high temperature of 200° C. or higher, a piezoelectric potential on the cavity end is stably higher than a piezoelectric potential at the center in the cavity direction, thereby preventing leakage current into the current non-injection window region.

In order to increase the compression of mean strain $\varepsilon_{tave}$ of the overall multilayer structure, for example, the first light guide layer may have a thickness of 200 nm with an In composition of 4%, the second light guide layer may have a thickness of 180 nm with an In composition of 4%, and the In composition may be 5% in barrier layers 106a, 106c, and 106e. This can set mean strain $\varepsilon_{tave}$ of the overall multilayer structure at $-1.8 \times 10^{-4}$, thereby increasing compression with negative $\Delta R$.

An AlGaN substrate used instead of GaN substrate 101 can reduce the lattice constant of the substrate. This can improve the compression of the mean lattice strain of the multilayer structure stacked on the substrate. Consequently, as compared with the multilayer structure formed above the GaN substrate, $\Delta R$ can be controlled to be smaller in the range of 0.25 µm or less, thereby enhancing the effect of preventing leakage current into the current non-injection window region.

Embodiment 2

A semiconductor laser element according to Embodiment 2 will be described below. The semiconductor laser element according to Embodiment 2 is identical to semiconductor laser element 11 according to Embodiment 1 except that a buffer layer is provided between GaN substrate 101 and first clad layer 103. Differences of the semiconductor laser element according to Embodiment 2 from semiconductor laser element 11 according to Embodiment 1 will be mainly described below in accordance with the accompanying drawings.

Figure 16A:
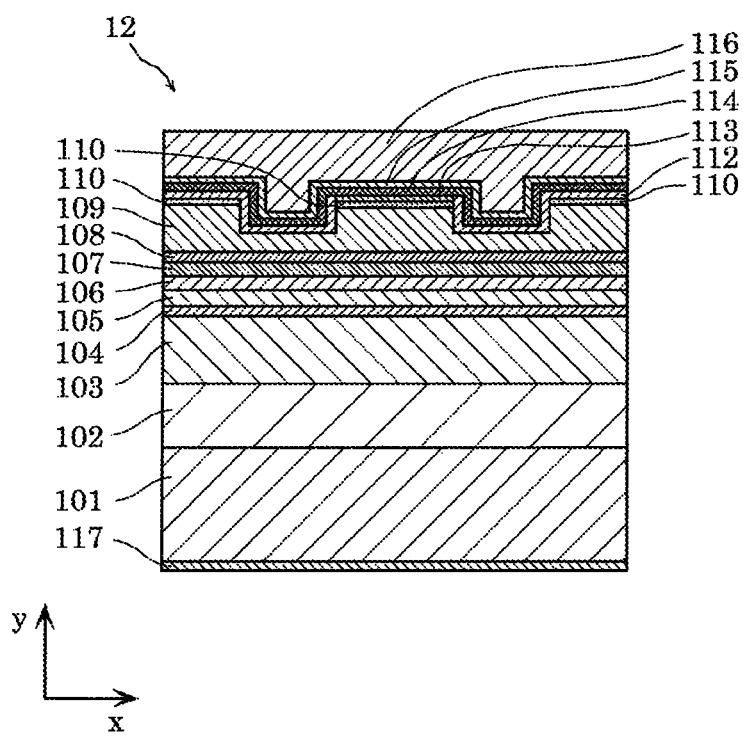
FIG. 16A is a schematic cross-sectional view illustrating the configuration of a semiconductor laser element according to Embodiment 2.
Figure 16B:
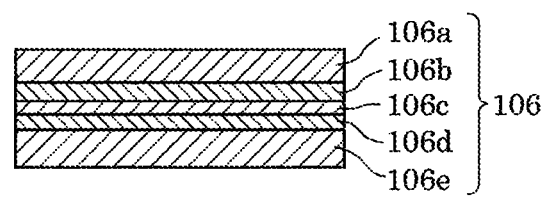
FIG. 16B is a schematic cross-sectional view illustrating the configuration of quantum-well active layer 106 in the semiconductor laser element according to Embodiment 2.

FIG. 16A is a schematic cross-sectional view illustrating the configuration of semiconductor laser element 12 according to Embodiment 2. FIG. 16A illustrates a cross section perpendicular to the cavity length direction of semiconductor laser element 12. FIG. 16B is a schematic cross-sectional view illustrating the configuration of quantum-well active layer 106 in semiconductor laser element 12 according to Embodiment 2.

As illustrated in FIG. 16A, semiconductor laser element 12 according to Embodiment 2 is a nitride semiconductor light-emitting element including GaN substrate 101 and a multilayer structure in which first clad layer 103 of a first conductivity type, first light guide layer 105, quantum-well active layer 106, second light guide layer 107, and second clad layer 109 of a second conductivity type are stacked on GaN substrate 101 sequentially from GaN substrate 101, like semiconductor laser element 11 according to Embodiment 1. As illustrated in FIG. 16B, quantum-well active layer 106 includes quantum well layers 106b and 106d and barrier layers 106a, 106c, and 106e like quantum-well active layer 106 according to Embodiment 1.

Semiconductor laser element 12 further includes buffer layer 102 on GaN substrate 101. Specifically, semiconductor laser element 12 includes buffer layer 102 between GaN substrate 101 and first clad layer 103.

Semiconductor laser element 12 further includes N-type GaN layer 104, electron barrier layer 108, contact layer 110, current block layer 112, P-side ohmic electrode 113, P-side first adhesive layer 114, first barrier layer 115, pad electrode 116, and N-side electrode 117 like semiconductor laser element 11 according to Embodiment 1.

In the present embodiment, first clad layer 103 has a thickness of 1.5 µm. N-side electrode 117 comprises, for example, 40-nm-thick Pd, 35-nm-thick Pt, and 1-µm-thick Au. Pad electrode 116 comprises 1-µm-thick Au. Ridge width W is 30 µm as in semiconductor laser element 11 according to Embodiment 1 and distance dp between the lower end of a ridge and quantum-well active layer 106 is 0.2 µm.

Semiconductor laser element 12 has a cavity length of 1200 µm like semiconductor laser element 11 according to Embodiment 1 and has a current non-injection window region near a cavity end face at cavity front and rear surfaces.

Also in Embodiment 2, in order to reduce the occurrence of lattice defects and cracks and suppress an increase in operating voltage while increasing an optical confinement factor for the active layer in a vertical direction, the Al composition of the AlGaN clad layer is set at 3.5% as in Embodiment 1.

As illustrated in FIG. 16B, quantum-well active layer 106 according to Embodiment 2 has a DQW structure of two InGaN quantum well layers 106b and 106d, each having a thickness of 30 Å and an In composition of 0.18 (18%) as in Embodiment 1. Quantum-well active layer 106 further includes InGaN barrier layers 106a, 106c, and 106e. Barrier layers 106a, 106c, and 106e are 3 nm, 7 nm, and 3 nm in thickness.

As in Embodiment 1, the In composition in first light guide layer 105 and second light guide layer 107 is 3% and the In composition in barrier layers 106a, 106c, and 106e is 4%, thereby increasing the optical confinement factor perpendicularly to a light distribution, suppressing the occurrence of a free carrier loss in the light guide layer, suppressing an increase in operating voltage, suppressing a piezoelectric field generated on the quantum-well active layer, and also increasing the gain of the quantum-well active layer.

As described above, semiconductor laser element 12 according to Embodiment 2 includes buffer layer 102 between GaN substrate 101 and the first clad layer. Buffer layer 102 is a strain control layer including a nitride semiconductor layer having a compressive strain relative to GaN substrate 101. In semiconductor laser element 12 including buffer layer 102, the mean strain of the overall multilayer structure grown on GaN substrate 101 becomes more compressive and the warp of GaN substrate 101 placed on top of the multilayer structure can be controlled to a concave shape ($\Delta R<0$). The configuration of buffer layer 102 is not particularly limited as long as the buffer layer has a compressive strain. Buffer layer 102 may contain In. Thus, buffer layer 102 has a compressive strain relative to GaN substrate 101. Buffer layer 102 may further include an AlGaN layer. In Embodiment 2, buffer layer 102 is a laminated film in which a 300-nm-thick AlGaN layer with an Al composition of 1% and a 200-nm-thick InGaN layer with an In composition of 4% are sequentially formed.

Moreover, an electrode structure in semiconductor laser element 12 according to Embodiment 2 is not limited to the structure of FIG. 16A. Variations of the electrode configuration of the semiconductor laser element according to Embodiment 2 will be described below in accordance with the accompanying drawings.

Figure 16C:
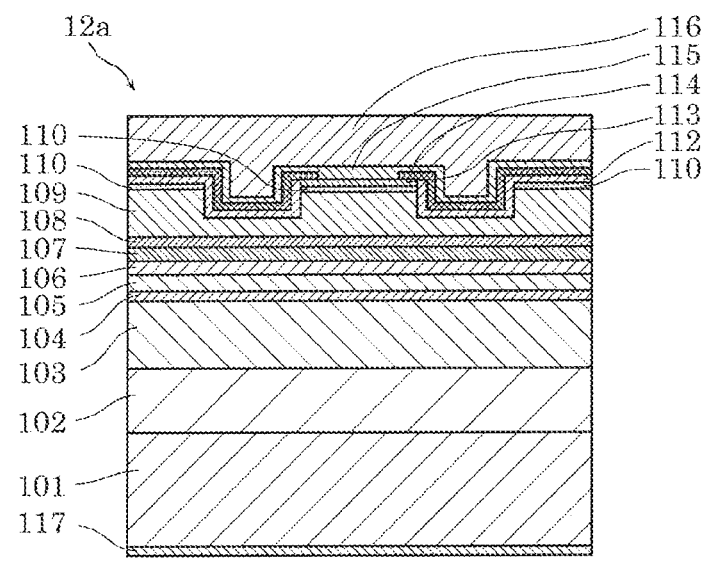
FIG. 16C is a schematic cross-sectional view illustrating the configuration of a semiconductor laser element according to a variation of Embodiment 2.
Figure 16D:
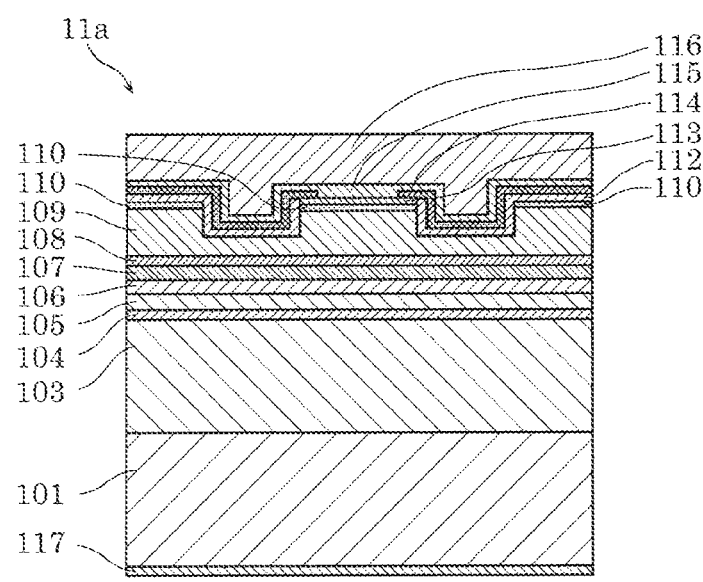
FIG. 16D is a schematic cross-sectional view illustrating the configuration of a semiconductor laser element according to a variation of Embodiment 1.

FIG. 16C is a schematic cross-sectional view illustrating the configuration of semiconductor laser element 12a according to a variation of Embodiment 2. FIG. 16D is a schematic cross-sectional view illustrating the configuration of semiconductor laser element 11a according to a variation of Embodiment 1.

In the electrode configuration, as illustrated in FIG. 16C, P-side first adhesive layer 114 comprising Ti needs not to be formed on a ridge. This configuration can reduce the resistance of semiconductor laser element 12a and allows semiconductor laser element 12a to perform a low-voltage operation. The electrode configuration of FIG. 16C may be applied to semiconductor laser element 11 according to Embodiment 1 as in semiconductor laser element 11a illustrated in FIG. 16D. Thus, like semiconductor laser element 12a, semiconductor laser element 11a can perform an operation at a lower voltage than semiconductor laser element 11.

The mean strain of the multilayer structure according to Embodiment 2 will be described below in accordance with the accompanying drawings. Prior to the mean strain of the multilayer structure according to Embodiment 2, another example of the mean strain of the multilayer structure according to Embodiment 1 will be described below in accordance with the accompanying drawings.

Figure 17A:
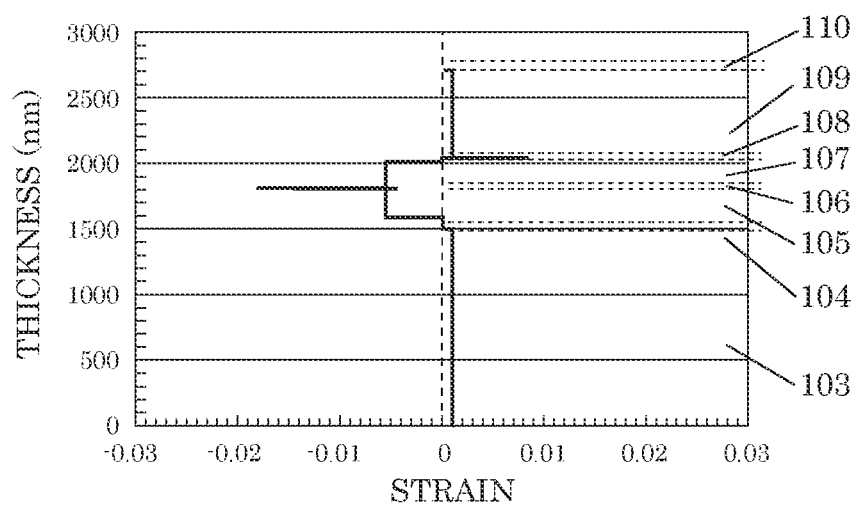
FIG. 17A is a graph showing another example of the distribution of lattice misfits (strains) in the thickness direction in the multilayer structure according to Embodiment 1.
Figure 17B:
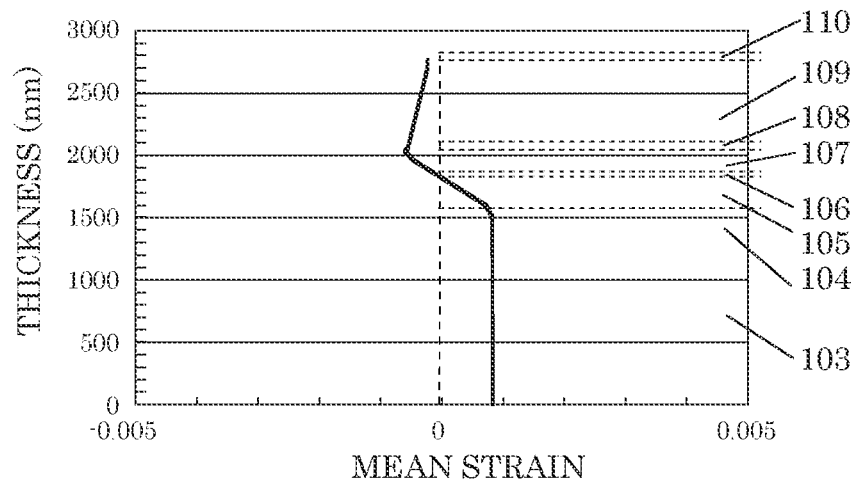
FIG. 17B is a graph showing another example of the distribution of mean strains in the direction of the growth layer of the multilayer structure according to Embodiment 1.

FIG. 17A is a graph showing another example of the distribution of lattice misfits (strains) in the thickness direction in the multilayer structure according to Embodiment 1. FIG. 17B is a graph showing another example of the distribution of mean strains in the direction of the growth layer of the multilayer structure according to Embodiment 1. FIGS. 17A and 17B show a strain and a mean strain as an example for estimating mean strain $\varepsilon_{tave}$ of the overall multilayer structure illustrated in FIG. 1A. In this example, the In composition is 4% in the barrier layers, first light guide layer 105 and the second light guide layer are 200 nm in thickness, and the In composition is 0.05 (5%) in the light guide layers. It is understood that mean strain $\varepsilon_{tave}$ is $-2.4 \times 10^{-4}$, which is a compressive mean strain, in the overall multilayer structure. Thus, the element warps in a direction along which $\Delta R$ becomes negative in the multilayer structure.

Figure 18A:
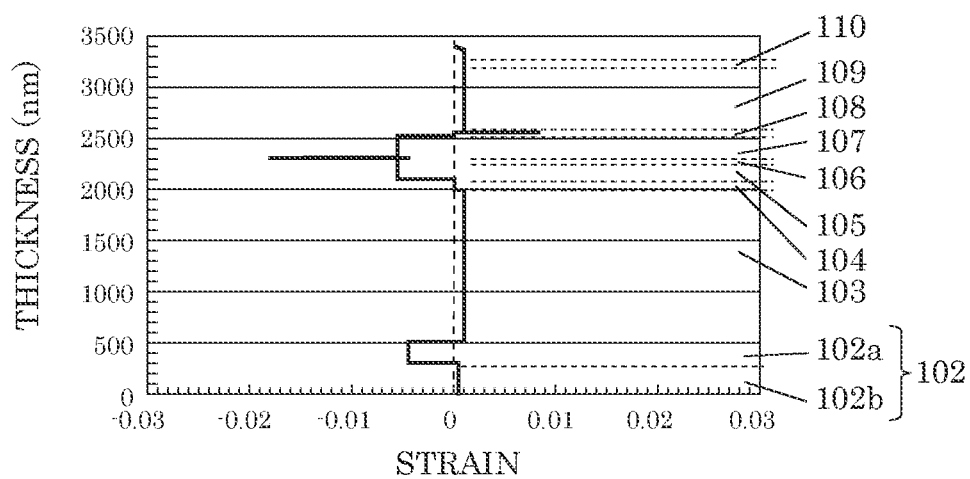
FIG. 18A is a graph showing another example of the distribution of lattice misfits (strains) in the thickness direction in a multilayer structure according to Embodiment 2.
Figure 18B:
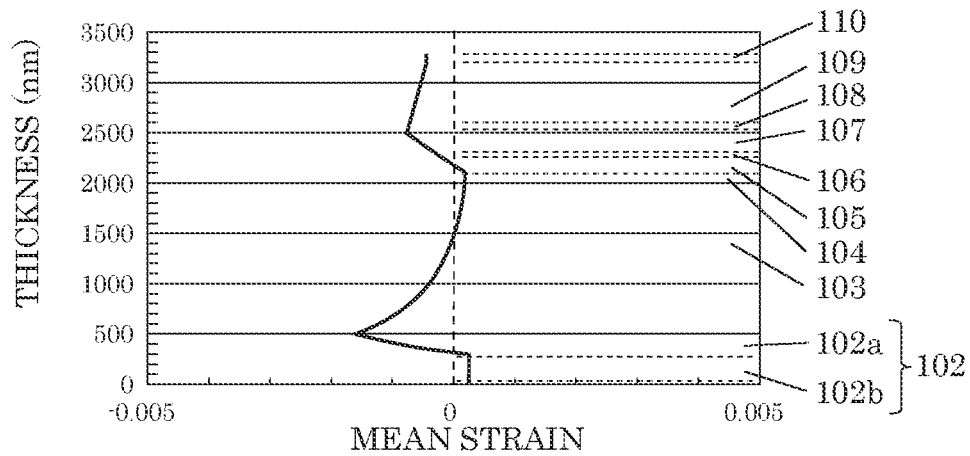
FIG. 18B is a graph showing another example of the distribution of mean strains in the direction of the growth layer of the multilayer structure according to Embodiment 2.

The mean strain of the multilayer structure according to Embodiment 2 will be described below in accordance with the accompanying drawings. FIG. 18A is a graph showing another example of the distribution of lattice misfits (strains) in the thickness direction in the multilayer structure according to Embodiment 2. FIG. 18B is a graph showing another example of the distribution of mean strains in the direction of the growth layer of the multilayer structure according to Embodiment 2. In the multilayer structure of FIGS. 18A and 18B, specifically, buffer layer 102 is added to the multilayer structure used in the calculations of FIGS. 17A and 17B. Buffer layer 102 includes, sequentially from GaN substrate 101, 300-nm-thick AlGaN layer 102b with an Al composition of 1% and 200-nm-thick InGaN layer 102a with an In composition of 4%. As illustrated in FIG. 16A, buffer layer 102 is disposed between GaN substrate 101 and first clad layer 103. Since buffer layer 102 is disposed between GaN substrate 101 and first clad layer 103, a distance between buffer layer 102 and quantum-well active layer 106 can be increased, thereby sufficiently suppressing light intensity on buffer layer 102. This can sufficiently suppress the influence of buffer layer 102 on a light distribution. Furthermore, the placement of buffer layer 102 can control the mean strain of the overall multilayer structure to a compressive strain.

In this example, buffer layer 102 includes the two layers. Buffer layer 102 may include three or more layers or a single layer as long as buffer layer 102 is disposed with a compressive mean strain between GaN substrate 101 and first clad layer 103.

As shown in FIG. 18A, particularly, InGaN layer 102a of buffer layer 102 has a compressive strain. As shown in FIG. 18B, mean strain $\varepsilon_{tave}$ of the overall multilayer structure is $-4.6 \times 10^{-4}$. In the example of FIG. 18B, the compression of mean strain $\varepsilon_{tave}$ is higher than that of the example of FIG. 17B. Thus, the provision of buffer layer 102 can control the direction of the warp of the semiconductor laser element such that $\Delta R$ has a smaller negative value.

Since buffer layer 102 is used, the warp of the semiconductor laser element can be controlled to a concave shape near GaN substrate 101 by setting mean strain $\varepsilon_{tave}$ of the overall multilayer structure to a compressive strain or $-1.5 \times 10^{-4}$ or less even if the In composition is at most about 3% in first light guide layer 105 and second light guide layer 107. In this case, the In composition of about 3% in first light guide layer 105 and second light guide layer 107 can suppress the occurrence of lattice defects in the light guide layers and the occurrence of a free carrier loss.

The relationship between a total film thickness (hereinafter also referred to as a total thickness) of first light guide layer 105 and second light guide layer 107 and an In composition of the light guide layer and a mean strain will be described below in accordance with the accompanying drawings.

Figure 19A:
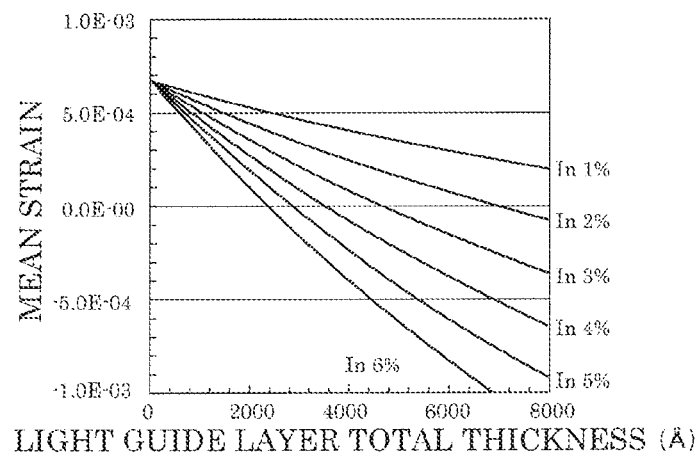
FIG. 19A is a graph showing the relationship between mean strain $\varepsilon_{tave}$ of a multilayer structure and the total thickness of a first light guide layer and a second light guide layer according to a comparative example.

FIG. 19A is a graph showing the relationship between mean strain $\varepsilon_{tave}$ of a multilayer structure and the total thickness of first light guide layer 105 and second light guide layer 107 according to a comparative example. FIG. 19A shows the calculation results of mean strain $s\varepsilon_{tave}$ in a multilayer structure where buffer layer 102 is removed from the multilayer structure of semiconductor laser element 12 according to Embodiment 2 illustrated in FIG. 16A.

Figure 19B:
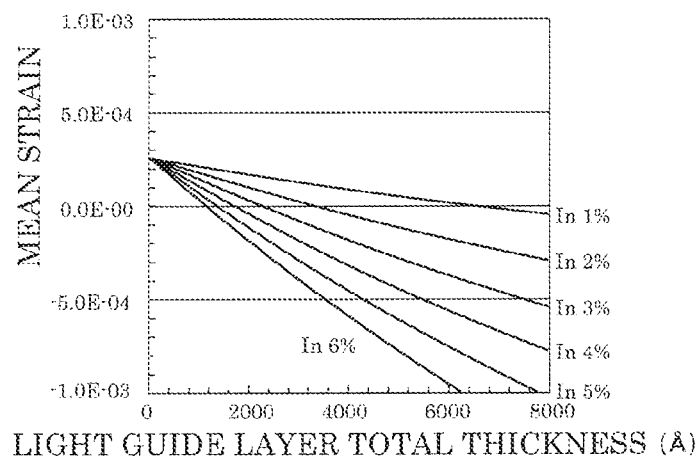
FIG. 19B is a graph showing an example of the relationship between mean strain $\varepsilon_{tave}$ of the multilayer structure and the total thickness of a first light guide layer and a second light guide layer according to Embodiment 2.

FIG. 19B is a graph showing an example of the relationship between mean strain $\varepsilon_{tave}$ of the multilayer structure and the total thickness of first light guide layer 105 and second light guide layer 107 according to Embodiment 2. FIG. 19B shows calculation results if buffer layer 102 is 200-nm-thick InGaN layer 102a formed with an In composition of 4% on 300-nm-thick AlGaN layer 102b with an Al composition of 1% in the multilayer structure of semiconductor laser element 12 according to Embodiment 2 illustrated in FIG. 16A.

In strain compensating buffer layer 102 in which the tensile and compressive layers are alternately formed, dislocations are likely to occur in opposite directions in the two adjacent layers, thereby suppressing the occurrence of lattice defects.

Figure 19C:
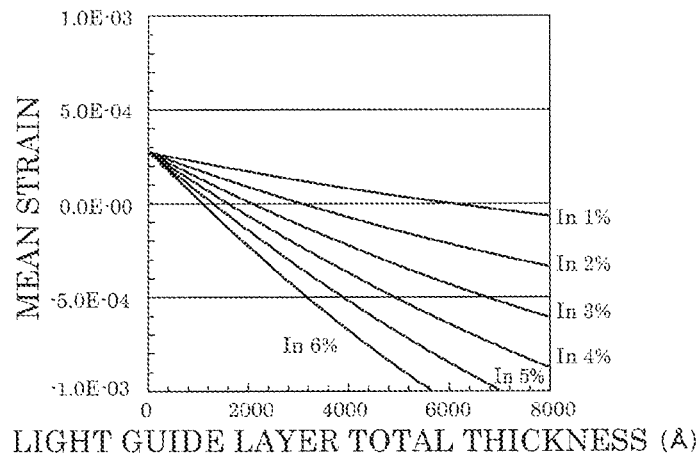
FIG. 19C is a graph showing another example of the relationship between mean strain $\varepsilon_{tave}$ of the multilayer structure and the total thickness of the first light guide layer and the second light guide layer according to Embodiment 2.

FIG. 19C is a graph showing another example of the relationship between mean strain $\varepsilon_{tave}$ of the multilayer structure and the total thickness of first light guide layer 105 and second light guide layer 107 according to Embodiment 2. FIG. 19C shows calculation results of mean strain $\varepsilon_{tave}$ if buffer layer 102 is a 200-nm-thick InGaN layer with an In composition of 4% in the multilayer structure of semiconductor laser element 12 according to Embodiment 2 illustrated in FIG. 16A.

FIGS. 19A to 19C show mean strain $\varepsilon_{tave}$ when the In composition of each light guide layer is changed from 1% to 7%.

In order to obtain mean strain $\varepsilon_{tave}$ of 0 or less or $-1.5 \times 10^{-4}$ or less in the overall multilayer structure in the absence of buffer layer 102, as shown in FIG. 19A, the total thickness of first light guide layer 105 and second light guide layer 107 needs to be at least 460 nm (4600 Å) or at least 610 nm (6100 Å) if the In composition is 3% in the light guide layers. Likewise, if the In composition is 4% in first light guide layer 105 and second light guide layer 107, the total thickness of the layers needs to be at least 350 nm (3500 Å) or at least 460 nm (4600 Å). Similarly, if the In composition is 5% in first light guide layer 105 and second light guide layer 107, the total thickness of the layers needs to be at least 280 nm (2800 Å) or at least 360 nm (3600 Å).

If the InGaN layer used in the light guide layer is grown with an In composition of 3% or more by at least 500 nm in total, a lattice defect or a pit is likely to occur during crystal growth, which may cause a deterioration of the characteristics of the semiconductor laser element. In contrast, in order to obtain mean strain $\varepsilon_{tave}$ of 0 or less or $-1.5 \times 10^{-4}$ or less in the overall multilayer structure in the example of FIG. 19B, the total thickness of first light guide layer 105 and second light guide layer 107 with an In composition of 3% only needs to be at least 220 nm (2200 Å) or at least 380 nm (3300 Å). Likewise, if the In composition is 4% in first light guide layer 105 and second light guide layer 107, the total thickness of the layers only needs to be at least 200 nm (2000 Å) or at least 280 nm (2800 Å). Similarly, if the In composition is 5% in first light guide layer 105 and second light guide layer 107, the total thickness of the layers only needs to be at least 130 nm (1300 Å) or at least 220 nm (2200 Å).

Consequently, even in the use of the first light guide layer and the second light guide layer with an In composition of at least 3%, the required total thickness of the light guide layers can be reduced, thereby stably obtaining high-quality crystals while reducing the occurrence of lattice defects and pits.

In contrast, in order to obtain mean strain $\varepsilon_{tave}$ of 0 or less or $-1.5 \times 10^{-4}$ or less in the overall multilayer structure in the example of FIG. 19C, the total thickness of first light guide layer 105 and second light guide layer 107 with an In composition of 3% only needs to be at least 200 nm (2000 Å) or at least 340 nm (3400 Å). Hence, also in the light guide layers with an In composition of 3%, high-quality crystals can be stably obtained. Likewise, if the In composition is 4% in first light guide layer 105 and second light guide layer 107, the total thickness of the layers only needs to be at least 160 nm (1600 Å) or at least 250 nm (2500 Å). Similarly, if the In composition is 5% in first light guide layer 105 and second light guide layer 107, the total thickness of the layers only needs to be at least 120 nm (1200 Å) or at least 200 nm (2000 Å).

Consequently, the use of buffer layer 102 can reduce the required total thickness of the light guide layers with an In composition of at least 3%, thereby stably obtaining high-quality crystals.

As described above, the use of buffer layer 102, which is a compressive strain control layer, can reduce the thickness of the light guide layers required for obtaining mean strain $\varepsilon_{tave}$ of 0 or less or $-1.5 \times 10^{-4}$ or less, thereby suppressing the occurrence of lattice defects and pits during crystal growth.

The configuration of buffer layer 102 required for obtaining mean strain $\varepsilon_{tave}$ of 0 or less or $-1.5 \times 10^{-4}$ or less was examined. In this case, the In composition of first light guide layer 105 and second light guide layer 107 is 3% and the total thickness of the layers is 250 nm.

In order to obtain excellent temperature characteristics, the quantum-well active layer needs an optical confinement factor of at least 1.2%. As a waveguide structure for this purpose, first light guide layer 105 and second light guide layer 107 need an In composition of at least 3% and need to be at least 250 nm in total thickness. If the In composition or total thickness of the light guide layers is increased, the optical confinement factor for the quantum-well active layer can be raised. The larger the In composition, the greater the compression of the light guide layers. This can increase a compressive strain.

As described above, in the example of FIG. 19B and the like, strain compensating buffer layer 102 is used, in which InGaN layer 102a is formed on AlGaN layer 102b with an Al composition of 1%. Compressive buffer layer 102 is formed by setting the compositions and thicknesses of AlGaN layer 102b and InGaN layer 102a such that the two layers have a compressive mean strain. If the Al composition is too small, a strain compensation effect is lessened. If the Al composition is too large, a lattice misfit with GaN substrate 101 is likely to cause a lattice defect. In the multilayer structure of Embodiment 2, the strain compensation effect and suppression of lattice defects can be achieved by setting the Al composition of AlGaN layer 102b at 0.5% to 1%. In the multilayer structure of Embodiment 2, the Al composition of AlGaN layer 102b is 1% in buffer layer 102. If the Al composition of the AlGaN layer is 1% or less, the occurrence of lattice defects can be suppressed when the layer is grown to about 2 μm in thickness.

Figure 20:
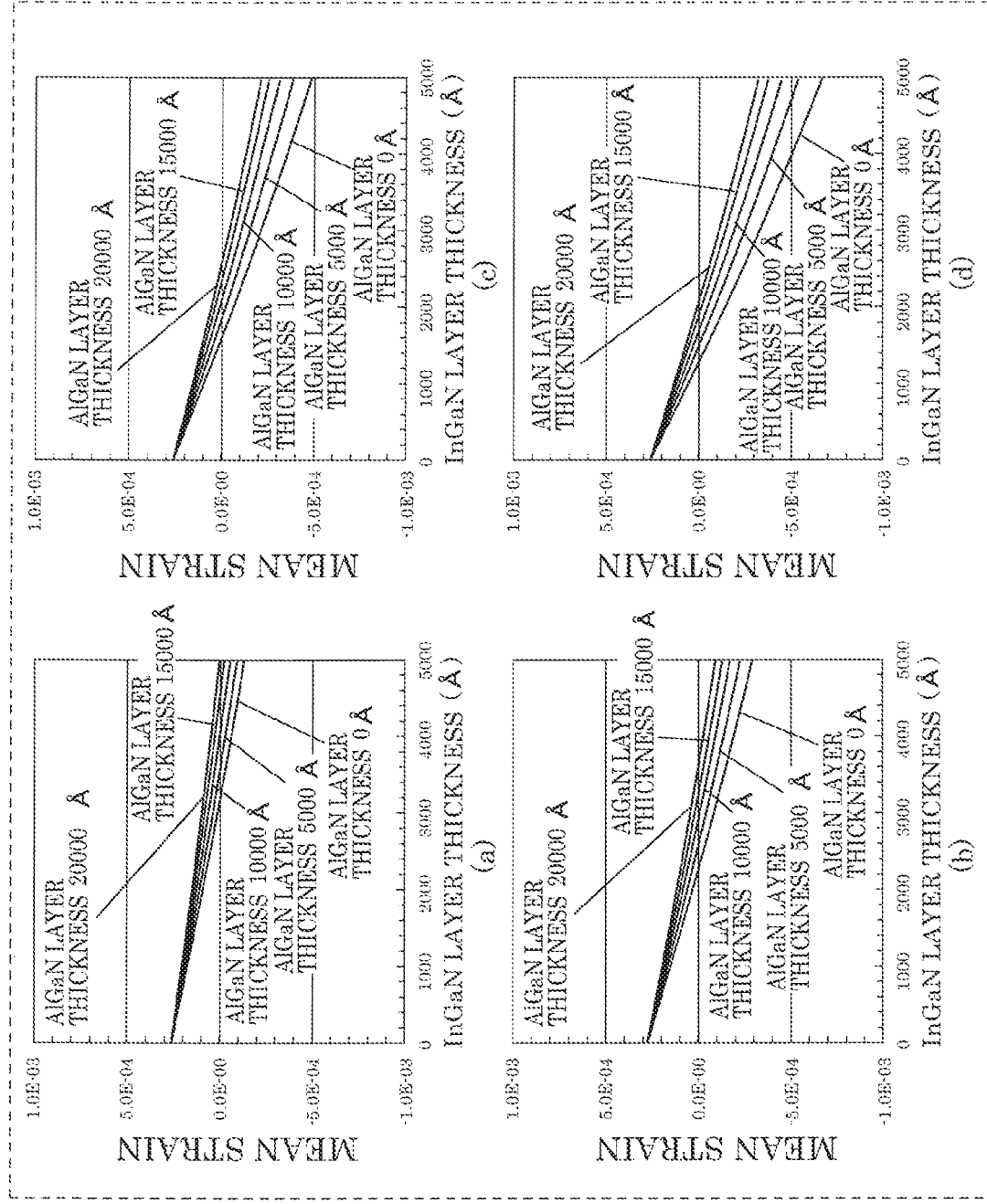
FIG. 20 shows graphs, each indicating the relationship between mean strain $\varepsilon_{tave}$ of the overall multilayer structure and the thicknesses of an InGaN layer and an AlGaN layer that constitute buffer layer 102 according to Embodiment 2.

The relationship between a thickness of each layer constituting buffer layer 102 and mean strain $\varepsilon_{tave}$ will be described below in accordance with the accompanying drawings. FIG. 20 shows graphs, each indicating the relationship between mean strain $\varepsilon_{tave}$ of the overall multilayer structure and the thicknesses of InGaN layer 102a and AlGaN layer 102b that constitute buffer layer 102 according to Embodiment 2. Graphs (a), (b), and (c) in FIG. 20 show the calculation results of the dependence of mean strain $\varepsilon_{tave}$ of the overall multilayer structure on a thickness of the InGaN layer with respect to various thicknesses of the AlGaN layer when the In composition of InGaN layer 102a constituting buffer layer 102 is 2%, 3%, 4%, and 5%. The graphs in FIG. 20 show the calculation results when the thickness of the AlGaN layer is changed from 0 nm to 200 nm in 50-nm intervals.

As shown in graph (a) in FIG. 20, in order to set mean strain $\varepsilon_{tave}$ at 0 or less in the overall multilayer structure including InGaN layer 102a with an In composition of 2%, the InGaN layer needs to have a thickness of at least 320 nm when the AlGaN layer is 0 nm in thickness (that is, in the absence of the AlGaN layer). Similarly, the graph shows that the InGaN layer needs to have a thickness of at least 350 nm when the AlGaN layer is 500 nm in thickness, the InGaN layer needs to have a thickness of at least 420 nm when the AlGaN layer is 1000 nm in thickness, the InGaN layer needs to have a thickness of at least 480 nm when the AlGaN layer is 1500 nm in thickness, and the InGaN layer needs to have a thickness of at least 500 nm when the AlGaN layer is 2000 nm in thickness.

Moreover, it is understood that in order to set mean strain $\varepsilon_{tave}$ of the overall multilayer structure at $-1.5 \times 10^{-4}$ or less, the InGaN layer needs to have a thickness of at least 500 nm even when the AlGaN layer is 0 nm in thickness.

As shown in graph (b) in FIG. 20, in order to set mean strain $\varepsilon_{tave}$ at 0 or less in the overall multilayer structure including InGaN layer 102a with an In composition of 3%, the InGaN layer needs to have a thickness of at least 220 nm when the AlGaN layer is 0 nm in thickness. Similarly, the graph shows that the InGaN layer needs to have a thickness of at least 260 nm when the AlGaN layer is 500 nm in thickness, the InGaN layer needs to have a thickness of at least 280 nm when the AlGaN layer is 1000 nm in thickness, the InGaN layer needs to have a thickness of at least 320 nm when the AlGaN layer is 1500 nm in thickness, and the InGaN layer needs to have a thickness of at least 340 nm when the AlGaN layer is 2000 nm in thickness.

The graph shows that in order to set mean strain $\varepsilon_{tave}$ of the overall multilayer structure at $-1.5 \times 10^{-4}$ or less, the InGaN layer needs to have a thickness of at least 370 nm when the AlGaN layer is 0 nm in thickness, the InGaN layer needs to have a thickness of at least 430 nm when the AlGaN layer is 500 nm in thickness, and the InGaN layer needs to have a thickness of at least 490 nm when the AlGaN layer is 1000 nm in thickness.

As shown in graph (c) in FIG. 20, in order to set mean strain $\varepsilon_{tave}$ at 0 or less in the overall multilayer structure including InGaN layer 102a with an In composition of 4%, the InGaN layer needs to have a thickness of at least 160 nm when the AlGaN layer is 0 nm in thickness. Similarly, the graph shows that the InGaN layer needs to have a thickness of at least 180 nm when the AlGaN layer is 500 nm in thickness, the InGaN layer needs to have a thickness of at least 200 nm when the AlGaN layer is 1000 nm in thickness, the InGaN layer needs to have a thickness of at least 230 nm when the AlGaN layer is 1500 nm in thickness, and the InGaN layer needs to have a thickness of at least 260 nm when the AlGaN layer is 2000 nm in thickness.

Moreover, in order to set mean strain $\varepsilon_{tave}$ of the overall multilayer structure at $-1.5\times10^{-4}$ or less, the InGaN layer needs to have a thickness of at least 260 nm when the AlGaN layer is 0 nm in thickness. Similarly, the graph shows that the InGaN layer needs to have a thickness of at least 300 nm when the AlGaN layer is 500 nm in thickness, and the InGaN layer needs to have a thickness of at least 350 nm when the AlGaN layer is 1000 nm in thickness. The graph shows that the InGaN layer needs to have a thickness of at least 395 nm when the AlGaN layer is 1500 nm in thickness, and the InGaN layer needs to have a thickness of at least 440 nm when the AlGaN layer is 2000 nm in thickness.

As shown in graph (d) in FIG. 20, in order to set mean strain $\varepsilon_{tave}$ of the overall multilayer structure at 0 or less, the InGaN layer needs to have a thickness of at least 130 nm when the AlGaN layer is 0 nm in thickness. Similarly, the graph shows that the InGaN layer needs to have a thickness of at least 160 nm when the AlGaN layer is 500 nm in thickness, the InGaN layer needs to have a thickness of at least 180 nm when the AlGaN layer is 1000 nm in thickness, the InGaN layer needs to have a thickness of at least 195 nm when the AlGaN layer is 1500 nm in thickness, and the InGaN layer needs to have a thickness of at least 210 nm when the AlGaN layer is 2000 nm in thickness.

Moreover, in order to set mean strain $\varepsilon_{tave}$ of the overall multilayer structure at $-1.5\times10^{-4}$ or less, the InGaN layer needs to have a thickness of at least 220 nm when the AlGaN layer is 0 nm in thickness. Similarly, the graph shows that the InGaN layer needs to have a thickness of at least 260 nm when the AlGaN layer is 500 nm in thickness, and the InGaN layer needs to have a thickness of at least 300 nm when the AlGaN layer is 1000 nm in thickness. Moreover, the graph shows that the InGaN layer needs to have a thickness of at least 330 nm when the AlGaN layer is 1500 nm in thickness, and the InGaN layer needs to have a thickness of at least 360 nm when the AlGaN layer is 2000 nm in thickness.

According to the calculation results of the graphs in FIG. 20, the occurrence of pits and lattice defects can be suppressed when the InGaN layer has a thickness of 500 nm or less. If the InGaN layer has a thickness of 400 nm, the occurrence of lattice defects and pits can be further suppressed.

If the AlGaN layer has a thickness of 1 μm or less with an Al composition of 1% or less and the InGaN layer has a thickness of 490 nm or less with an In composition of 3% to 5%, mean strain $\varepsilon_{tave}$ of the overall multilayer structure can be set at $-1.5\times10^{-4}$ or less.

In the multilayer structure according to Embodiment 2 illustrated in FIG. 16A, first light guide layer 105 is 185 nm in thickness with an In composition of 3%, second light guide layer 107 is 100 nm in thickness with an In composition of 3%, the In composition is 4% in the barrier layers, and buffer layer 102 is configured such that the InGaN layer having a thickness of 350 nm with an In composition of 4% is formed on the AlGaN layer having a thickness of 1000 nm with an Al composition of 1%, so that mean strain $\varepsilon_{tave}$ of the overall multilayer structure is $-1.8\times10^{-4}$.

The light guide layers with an In composition of 3% in the multilayer structure can achieve all six objects: (1) to suppress the occurrence of a free carrier loss in the light guide layer, (2) to prevent an increase in operating voltage, (3) to suppress a piezoelectric field generated on the quantum-well active layer and increase the gain of the quantum-well active layer, (4) to increase the optical confinement factor in the vertical direction to at least 1.2%, (5) to reduce a lasing threshold current value, and (6) to suppress leakage current into the current non-injection window region on the cavity end face by the influence of a piezoelectric potential generated by a piezoelectric field in the cavity direction and suppress a reduction of the COD level.

Alternatively, AlGaN layer 102b and InGaN layer 102a in buffer layer 102 may be each divided into multiple layers and form a multilayer structure or a superlattice such that the total thickness of the layers is an ideal total thickness obtained from the calculation results. For example, in the case of the buffer layer in which the InGaN layer having a thickness of 350 nm with an In composition of 4% is formed on the AlGaN layer having a thickness of 1000 nm with an Al composition of 1%, a compressive strain is equal to the compressive strain of a buffer layer having a multilayer structure in which a 100-nm thick AlGaN layer and a 35-nm thick InGaN layer are stacked in a pair in ten cycles.

In the multilayer structure according to Embodiment 2 illustrated in FIG. 16A, first light guide layer 105 is 175 nm in thickness with an In composition of 3%, second light guide layer 107 is 98 nm in thickness with an In composition of 3%, the In composition is 4% in the barrier layers, and buffer layer 102 is configured such that the InGaN layer having a thickness of 100 nm with an In composition of 3% is formed on the AlGaN layer having a thickness of 400 nm with an Al composition of 1%, so that mean strain $\varepsilon_{tave}$ of the overall multilayer structure can be set at $-1.3\times10^{-4}$.

In this case, ΔR is 0.2 μm or less for the submount substrate comprising diamond. The results of FIG. 4 show that a piezoelectric potential on the cavity end is stably higher than that at the center in the cavity direction even when quantum-well active layer 106 has a high temperature of 200° C. or higher, thereby preventing leakage current into the current non-injection window region.

The foregoing description illustrates the method of suppressing leakage current into the current non-injection window region on the cavity end face by the influence of a piezoelectric potential generated by a piezoelectric field in the cavity direction. A piezoelectric potential is generated by the piezoelectric effect in the horizontal direction (x direction in FIG. 16A) as well as in the cavity direction. In the structures of FIGS. 1A and 16A, second clad layer 109 has a ridge and Au having a thermal expansion coefficient of $4.2\times10^{-6}$, which is larger than that of a GaN material, is applied onto the ridge. Thus, if the semiconductor laser element is mounted junction-down on the submount substrate, a stress is generated also in the x direction due to a difference in thermal expansion coefficient between Au and the GaN material, thereby generating a shear stress in a plane (in the xy-plane) perpendicular to the cavity direction.

The shear stress in the xy-plane generates a piezoelectric field and a piezoelectric potential in the x direction and affects the band structure of quantum-well active layer 106 in the x-axis direction. For example, a shear stress generated in a plane perpendicular to the cavity direction of a semiconductor laser according to Embodiment 2 will be described below in accordance with the accompanying drawings.

Figure 21A:
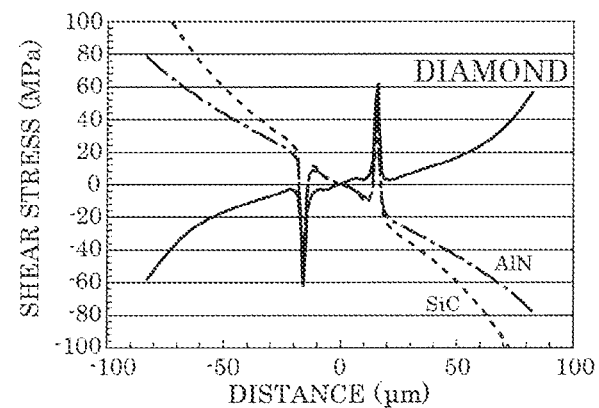
FIG. 21A shows a shear stress distribution in the x-axis direction at 25° C. in a quantum well layer when the semiconductor laser element according to Embodiment 2 is mounted junction-down on a submount substrate.
Figure 21B:
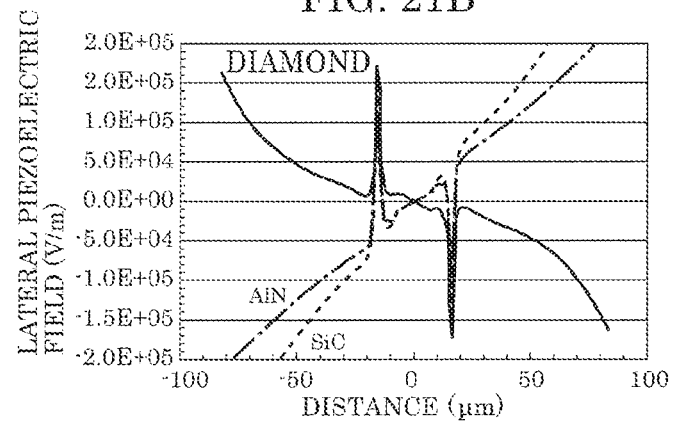
FIG. 21B shows a piezoelectric field distribution in the x-axis direction at 25° C. in the quantum well layer when the semiconductor laser element according to Embodiment 2 is mounted junction-down on the submount substrate.
Figure 21C:
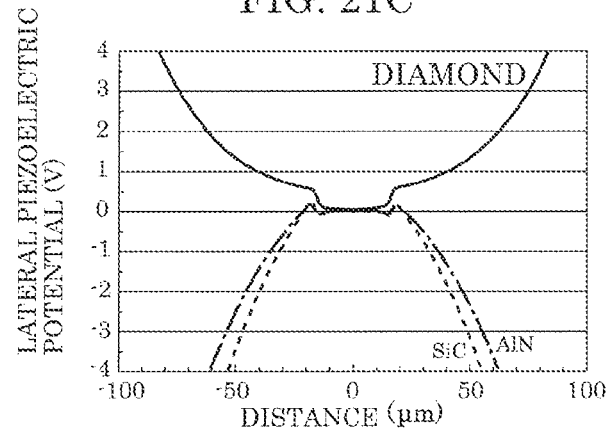
FIG. 21C shows a piezoelectric potential distribution in the x-axis direction at 25° C. in the quantum well layer when the semiconductor laser element according to Embodiment 2 is mounted junction-down on the submount substrate.

FIGS. 21A, 21B, and 21C show a shear stress distribution, a piezoelectric field distribution, and a piezoelectric potential distribution in the x-axis direction at 25° C. in quantum well layers 106b and 106d when the semiconductor laser element according to Embodiment 2 is mounted junction-down on the submount substrate.

Figure 22A:
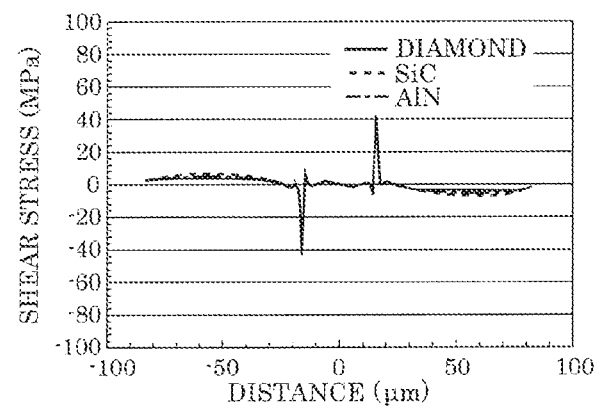
FIG. 22A shows a shear stress distribution in the x-axis direction at 25° C. in the quantum well layer when the semiconductor laser element according to Embodiment 2 is mounted junction-down on the submount substrate.
Figure 22B:
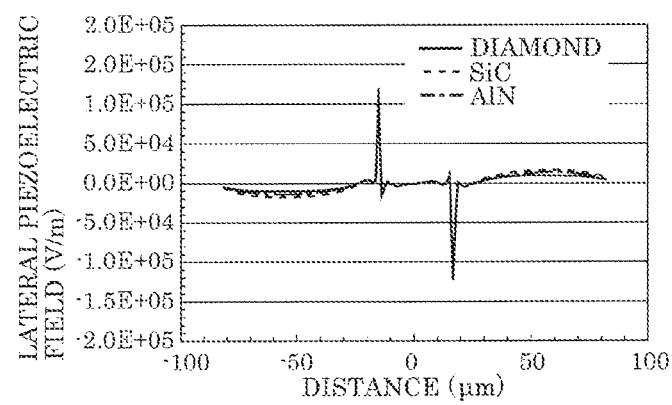
FIG. 22B shows a piezoelectric field distribution in the x-axis direction at 25° C. in the quantum well layer when the semiconductor laser element according to Embodiment 2 is mounted junction-down on the submount substrate.
Figure 22C:
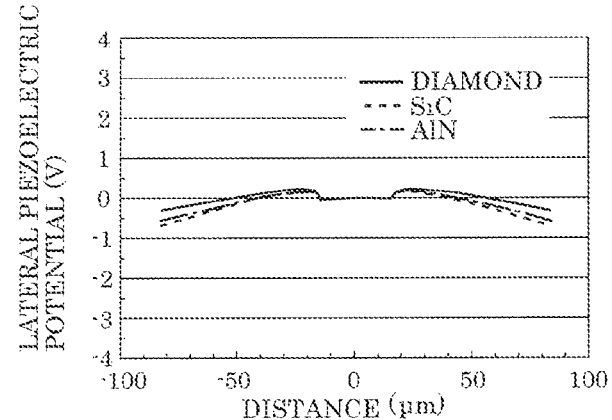
FIG. 22C shows a piezoelectric potential distribution in the x-axis direction at 25° C. in the quantum well layer when the semiconductor laser element according to Embodiment 2 is mounted junction-up on the submount substrate.

FIGS. 22A, 22B, and 22C show a shear stress distribution, a piezoelectric field distribution, and a piezoelectric potential distribution in the x-axis direction at 25° C. in quantum well layers 106b and 106d when the semiconductor laser element according to Embodiment 2 is mounted junction-up on the submount substrate.

Figure 23A:
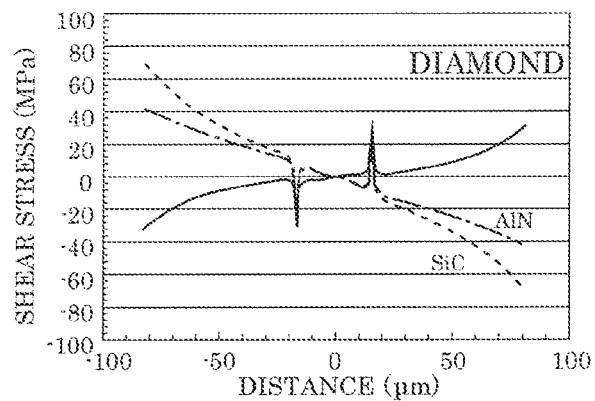
FIG. 23A shows a shear stress distribution in the x-axis direction at 150° C. in the quantum well layer when the semiconductor laser element according to Embodiment 2 is mounted junction-down on the submount substrate.
Figure 23B:
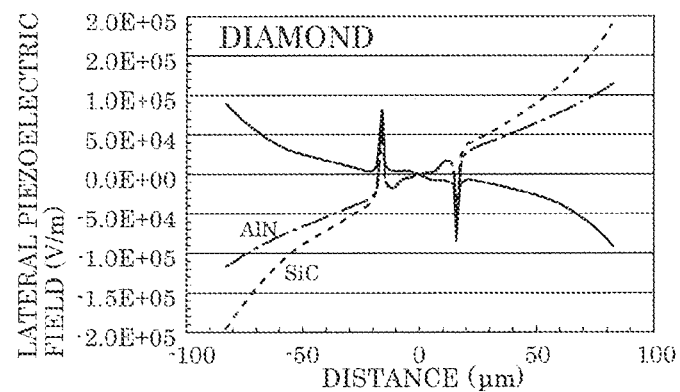
FIG. 23B shows a piezoelectric field distribution in the x-axis direction at 150° C. in the quantum well layer when the semiconductor laser element according to Embodiment 2 is mounted junction-down on the submount substrate.
Figure 23C:
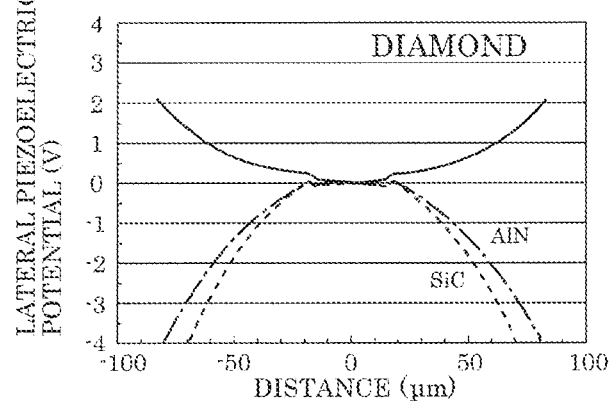
FIG. 23C shows a piezoelectric potential distribution in the x-axis direction at 150° C. in the quantum well layer when the semiconductor laser element according to Embodiment 2 is mounted junction-down on the submount substrate.

FIGS. 23A, 23B, and 23C show a shear stress distribution, a piezoelectric field distribution, and a piezoelectric potential distribution in the x-axis direction at 150° C. in quantum well layers 106b and 106d when the semiconductor laser element according to Embodiment 2 is mounted junction-down on the submount substrate.

Figure 24A:
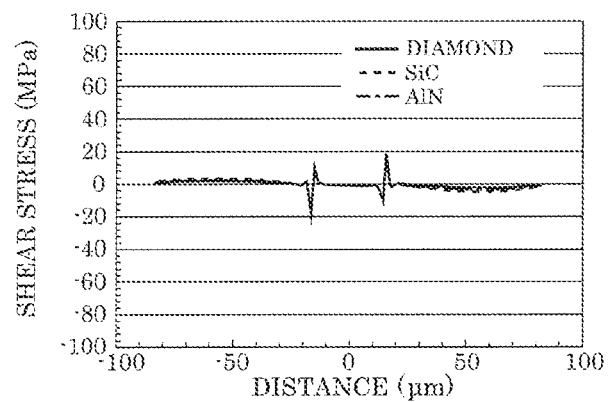
FIG. 24A shows a shear stress distribution in the x-axis direction at 150° C. in the quantum well layer when the semiconductor laser element according to Embodiment 2 is mounted junction-up on the submount substrate.
Figure 24B:
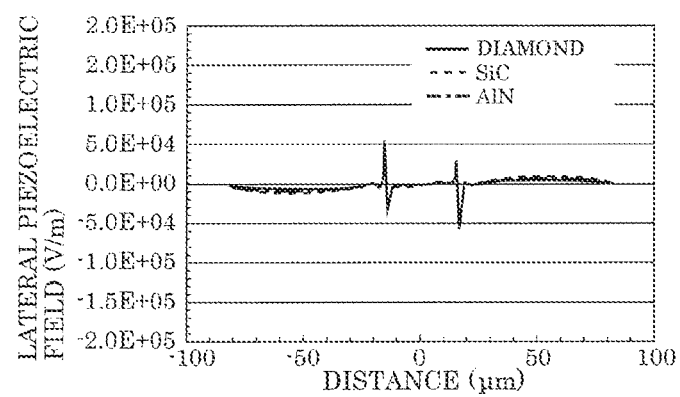
FIG. 24B shows a piezoelectric field distribution in the x-axis direction at 150° C. in the quantum well layer when the semiconductor laser element according to Embodiment 2 is mounted junction-up on the submount substrate.
Figure 24C:
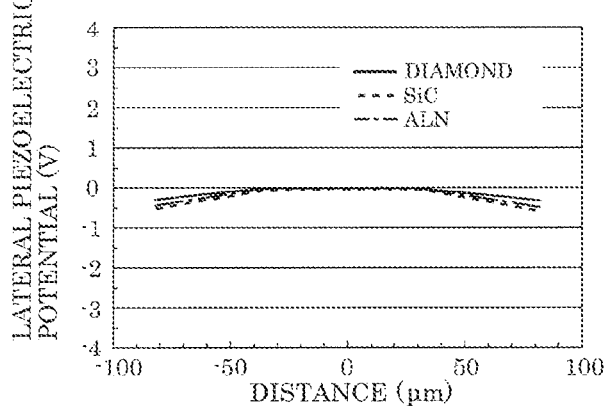
FIG. 24C shows a piezoelectric potential distribution in the x-axis direction at 150° C. in the quantum well layer when the semiconductor laser element according to Embodiment 2 is mounted junction-up on the submount substrate.

FIGS. 24A, 24B, and 24C show a shear stress distribution, a piezoelectric field distribution, and a piezoelectric potential distribution in the x-axis direction at 150° C. in quantum well layers 106b and 106d when the semiconductor laser element according to Embodiment 2 is mounted junction-up on the submount substrate.

FIGS. 21A to 24C show the calculation results of submount substrates comprising diamond, AlN, and SiC. The center of the ridge in the x-axis direction is located at a distance of 0 μm.

As shown in FIGS. 21A and 23A, in junction-down mounting, an x-direction shear stress and an x-direction piezoelectric field based on the shear stress in mounting on the diamond submount are applied in a direction opposite to those in mounting on the AlN and SiC submount substrates. This is because, as described above, SiC has a thermal expansion coefficient of $6.6 \times 10^{-6}$ and AlN has a thermal expansion coefficient of $4.15 \times 10^{-6}$, whereas diamond has a thermal expansion coefficient of $1.1 \times 10^{-6}$, which is lower than $5.59 \times 10^{-6}$, a thermal expansion coefficient of GaN. In this case, when the semiconductor laser element is mounted on the submount substrate at a high temperature of about 300° C. with bonding layer 121 of AuSn solder, the diamond submount substrate has a smaller thermal expansion coefficient. Thus, when the temperature is lowered to 25° C., the influence of a thermal residual stress caused by a difference in thermal expansion coefficient between the submount substrate and the semiconductor laser element is greater than that in the use of the submount substrate of SiC or AlN. Thus, if the semiconductor laser element is mounted on the diamond submount substrate, a tensile stress in the x-axis direction of the semiconductor laser element is larger than that in mounting on the submount substrate of SiC or AlN. At this point, a shear stress in the xy-plane is generated in a direction that allows a piezoelectric potential to be higher than that on the ridge. FIGS. 21C and 23C show that the use of the diamond submount substrate forms a potential barrier outside the ridge from 25° C. to 150° C. and obtains the effect of suppressing leakage current out of the ridge. If SiC or AlN is used for the submount substrate, a piezoelectric potential for suppressing leakage of injected current out of the ridge is substantially eliminated when the semiconductor laser element reaches a high temperature of 150° C. This proves that the SiC or AlN submount substrate is more likely to cause leakage current than the diamond submount substrate. If the semiconductor laser element is used at an environmental temperature of 85° C., the waveguide including the quantum-well active layer of the semiconductor laser element is placed at 150° C. or higher by the influence of self-heat. Thus, even at a high temperature of 150° C. or higher, a piezoelectric potential for suppressing leakage current out of the ridge is generated, thereby achieving a lower operating current as well as suppression of an increase in operating current value and the thermal saturation of optical output. This can reduce leakage current into the current non-injection window region near the cavity end face.

As shown in FIGS. 22C and 24C, such a piezoelectric potential for suppressing leakage current out of the ridge is not generated in junction-up mounting even if diamond is used for the submount substrate. This is because a distance between quantum-well active layer 106 and the submount substrate is so large that a difference in thermal expansion coefficient from the submount substrate material is hardly made in junction-up mounting.

In this way, the ridge semiconductor laser element mounted junction-down further provides the effect of suppressing leakage current out of the ridge, achieving the effect of reducing the operating current rather than the effect of high heat dissipation caused by high thermal conductivity compared with SiC and AlN.

A piezoelectric potential for suppressing leakage current out of the ridge is generated by a difference in thermal expansion coefficient between the diamond submount substrate and a nitride material of the semiconductor laser element, that is, an electrode material mainly composed of Au. Thus, the material of current block layer 112 is not limited to $SiO_2$. Current block layer 112 may be comprising insulators transparent to laser oscillation light, for example, materials such as $ZrO_2$, $Al_2O_3$, $Ta_2O_5$, $TiO_2$, and SiN or a semiconductor material such as AlN. The thermal conductivity of AlN is about 150 W/m·K, which is lower than that of diamond but is higher than, for example, those of oxide materials such as $SiO_2$ (a thermal conductivity of about 1.38 W/m·K), $ZrO_2$ (a thermal conductivity of about 4 W/m·K), and $Al_2O_3$ (a thermal conductivity of about 20 W/m·K) and silicon nitride (SiN; a thermal conductivity of about 20 W/m·K). Thus, the use of current block layer 112 comprising AlN is effective for obtaining high heat dissipation.

Figure 25A:
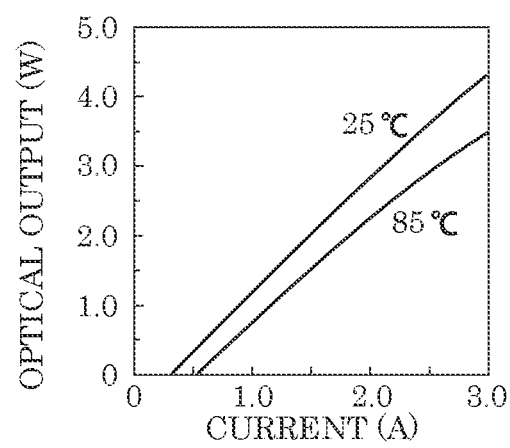
FIG. 25A is a graph showing the measurement results of current-optical output characteristics at 25° C. and 85° C. when the semiconductor laser element according to Embodiment 2 is mounted on a submount substrate comprising diamond.
Figure 25B:
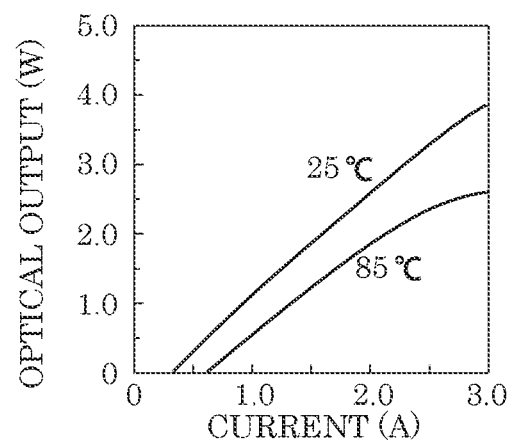
FIG. 25B is a graph showing the measurement results of current-optical output characteristics at 25° C. and 85° C. when the semiconductor laser element according to Embodiment 2 is mounted on a submount substrate comprising SiC.

The effect of the use of the diamond submount substrate will be described below in accordance with the accompanying drawings. FIGS. 25A and 25B are graphs showing the measurement results of current-optical output characteristics at 25° C. and 85° C. when the semiconductor laser element according to Embodiment 2 is mounted on the submount substrates comprising diamond and SiC.

As shown in FIGS. 25A and 25B, the diamond submount substrate obtains a lower lasing threshold current and higher slope efficiency than the SiC submount substrate. In particular, the use of the diamond submount substrate hardly shows a trend of thermal saturation in current-optical output characteristics even when a large current of 3 A is injected at a high temperature of 85° C. As described above, this results from the effect of high heat dissipation obtained by the diamond submount substrate and the effect of suppressing the occurrence of reactive current when a piezoelectric potential is generated so as to suppress leakage current out of the ridge.

Embodiment 3

A semiconductor laser element according to Embodiment 3 will be described below. The semiconductor laser element according to Embodiment 3 is identical to semiconductor laser element 11 according to Embodiment 1 except that a third light guide layer and a third clad layer are provided. Differences of the semiconductor laser element according to Embodiment 3 from semiconductor laser element 11 according to Embodiment 1 will be mainly described below in accordance with the accompanying drawings.

Figure 26A:
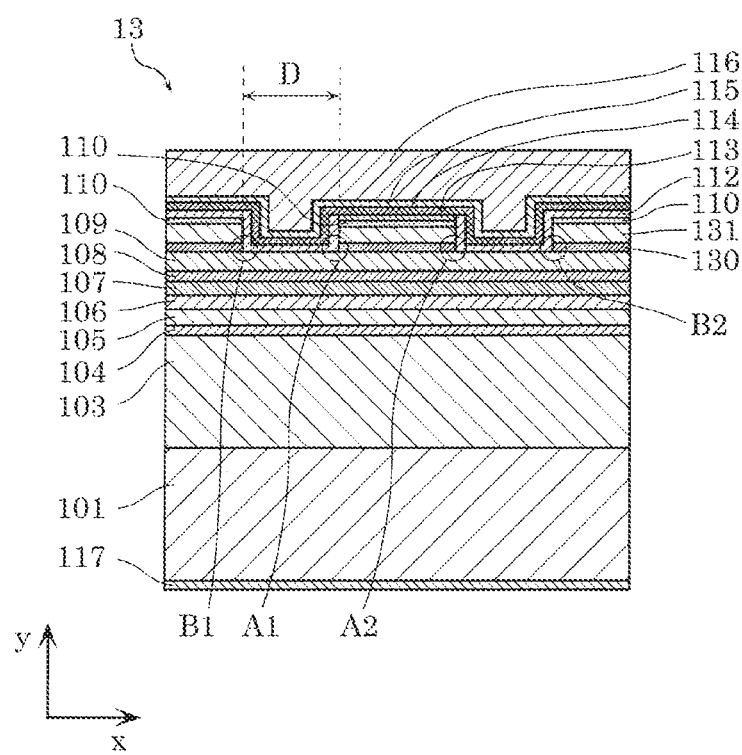
FIG. 26A is a schematic cross-sectional view illustrating the configuration of a semiconductor laser element according to Embodiment 3.
Figure 26B:
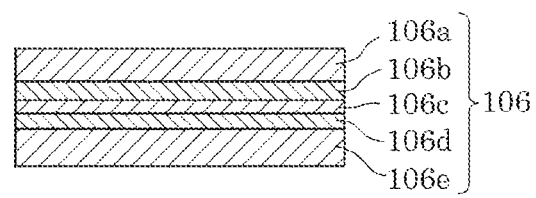
FIG. 26B is a schematic cross-sectional view illustrating the configuration of quantum-well active layer 106 in the semiconductor laser element according to Embodiment 3.

FIG. 26A is a schematic cross-sectional view illustrating the configuration of semiconductor laser element 13 according to Embodiment 3. FIG. 26A illustrates a cross section perpendicular to the cavity length direction of semiconductor laser element 13. FIG. 26B is a schematic cross-sectional view illustrating the configuration of quantum-well active layer 106 in semiconductor laser element 13 according to Embodiment 3.

As illustrated in FIG. 26A, semiconductor laser element 13 according to Embodiment 3 is a nitride semiconductor light-emitting element including GaN substrate 101 and a multilayer structure in which first clad layer 103 of a first conductivity type, first light guide layer 105, quantum-well active layer 106, second light guide layer 107, and second clad layer 109 of a second conductivity type are stacked on GaN substrate 101 sequentially from GaN substrate 101 like semiconductor laser element 11 according to Embodiment 1. As illustrated in FIG. 26B, quantum-well active layer 106 includes quantum well layers 106b and 106d and barrier layers 106a, 106c, and 106e like quantum-well active layer 106 according to Embodiment 1.

Semiconductor laser element 13 further includes N-type GaN layer 104, electron barrier layer 108, contact layer 110, current block layer 112, P-side ohmic electrode 113, P-side first adhesive layer 114, first barrier layer 115, pad electrode 116, and N-side electrode 117 like semiconductor laser element 11 according to Embodiment 1.

As illustrated in FIG. 26A, semiconductor laser element 13 further includes third light guide layer 130 and third clad layer 131 on second clad layer 109. In semiconductor laser element 13, second clad layer 109 comprises P-type AlGaN and has a thickness of 0.2 µm.

Third light guide layer 130 comprises P-type InGaN and has a thickness of 0.2 µm.

Third clad layer 131 comprises P-type AlGaN and has a thickness of 0.2 µm. Third clad layer 131 has an Al composition of 0.035 (3.5) like second clad layer 109.

Semiconductor laser element 13 also has a ridge like semiconductor laser element 11 according to Embodiment 1. In semiconductor laser element 13, the ridge is formed on third light guide layer 130 and third clad layer 131 as illustrated in FIG. 26A. The lower end of the ridge is placed on the top surface of second clad layer 109.

In semiconductor laser element 13, third light guide layer 130 is provided so as to control a shear stress in quantum-well active layer 106 to a larger shear stress in a horizontal direction relative to an active layer (x direction in FIG. 26A). InGaN has a larger lattice constant than GaN and thus a stress for horizontally extending the ridge is applied to a region near the ridge by third light guide layer 130. This affects the shear stress distribution of quantum-well active layer 106 so as to increase the shear stress. The shear stress of quantum-well active layer 106 will be described below in accordance with the accompanying drawings.

Figure 27A:
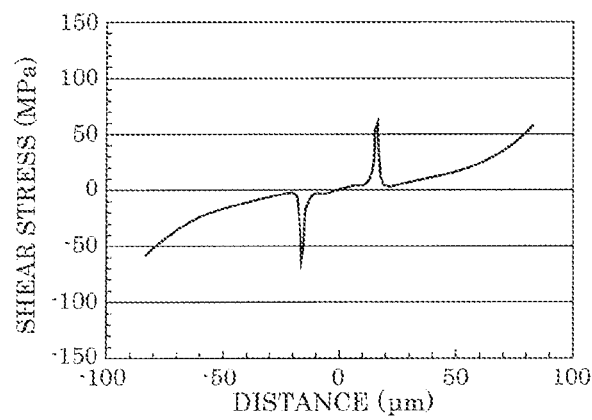
FIG. 27A is a graph showing the x-axis direction distribution of shear stresses at 25° C. in a quantum well layer in the quantum-well active layer when the In composition of a third light guide layer is changed to 0%.
Figure 27B:
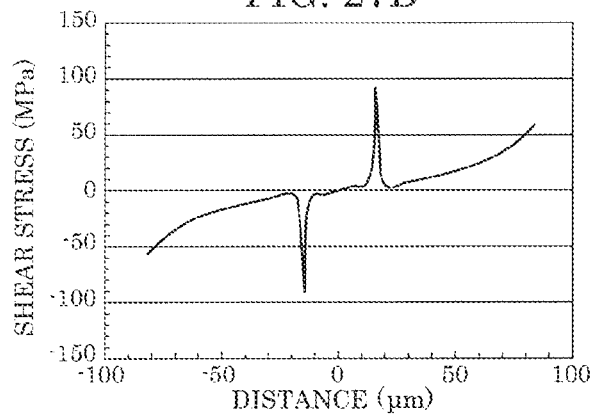
FIG. 27B is a graph showing the x-axis direction distribution of shear stresses at 25° C. in the quantum well layer in the quantum-well active layer when the In composition of the third light guide layer is changed to 1%.
Figure 27C:
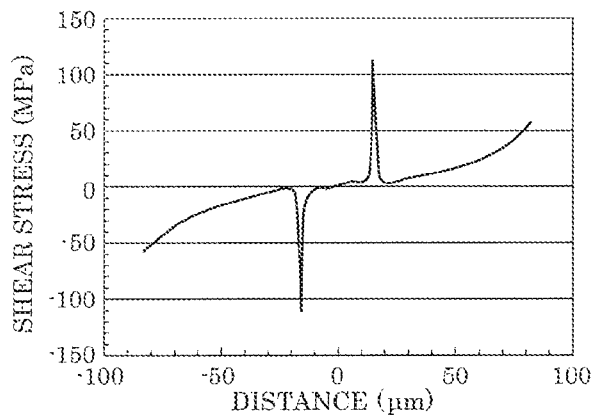
FIG. 27C is a graph showing the x-axis direction distribution of shear stresses at 25° C. in the quantum well layer in the quantum-well active layer when the In composition of the third light guide layer is changed to 2%.

FIGS. 27A, 27B, and 27C are graphs showing the x-axis direction distribution of shear stresses at 25° C. in quantum well layers 106b and 106d in quantum-well active layer 106 when the In composition of third light guide layer 130 is changed to 0% (third light guide layer 130 comprises GaN), 1%, and 2%. A position at a distance of 0 µm is the center of the ridge in the x-axis direction. As shown in FIGS. 27A, 27B, and 27C, when the In composition of third light guide layer 130 is increased from 0% to 1% and 2%, a peak shear stress has a large absolute value, which means an increase in shear stress. This is because the lattice misfit of third light guide layer 130 increases with the In composition so as to apply a larger stress for horizontally extending the lower end of the ridge to the outside. Thus, in a stress generated on quantum-well active layer 106, rotational stress components are intensified in the xy-plane, thereby increasing the absolute value of the peak shear stress. A piezoelectric potential generated on quantum-well active layer 106 by the shear stress will be described below.

Figure 28:
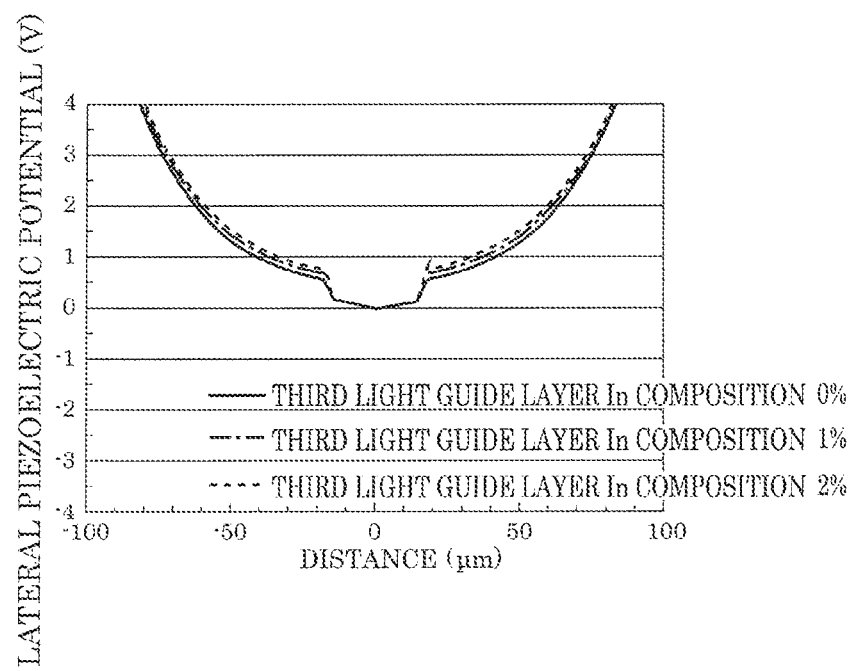
FIG. 28 is a graph showing the relationship between a piezoelectric potential generated on the quantum-well active layer and an x-axis direction position according to Embodiment 3.

FIG. 28 is a graph showing the relationship between a piezoelectric potential generated on quantum-well active layer 106 and an x-axis direction position according to Embodiment 3. FIG. 28 indicates a piezoelectric potential when the In composition of third light guide layer 130 is changed to 0%, 1%, and 2%. As shown in FIG. 28, a potential barrier caused by a piezoelectric potential inside and outside the ridge increases with the In composition, thereby enhancing the effect of suppressing leakage of injected current to the outside of the ridge. Thus, semiconductor laser element 13 can be obtained with an advanced high-temperature high-power operation.

A piezoelectric potential for suppressing leakage current to the outside of the ridge is generated so as to achieve a lower operating current as well as suppression of an increase in operating current value and the thermal saturation of optical output. This can also reduce leakage current into a current non-injection window region near a cavity end face.

In this configuration, a shear stress generated on a ridge waveguide appears at the boundary between materials having different thermal expansion coefficients or lattice constants. Thus, the shear stress is maximized in regions (regions A1 and A2 in FIG. 26A) near current block layer 112 at the lower end of the ridge. For this reason, third light guide layer 130 is formed at the lower end of the ridge and a stress generated by a lattice misfit of the InGaN layer is applied to the regions, achieving a larger shear stress. If the thickness of third light guide layer 130 is too large, third light guide layer 130 having a higher refractive index than second clad layer 109 and third clad layer 131 may deteriorate the effect of confining a light distribution perpendicularly to quantum-well active layer 106, reducing an optical confinement factor. In the semiconductor laser element according to Embodiment 3, third light guide layer 130 is 0.1 µm to 0.2 µm in thickness, achieving the effect of increasing a piezoelectric potential and the effect of confining light.

Also in the case of third light guide layer 130 comprising GaN, a generated tensile stress is smaller than that in the region of an AlGaN layer, achieving the effect of increasing a piezoelectric potential. Hence, a change of the In composition of third light guide layer 130 from 0% to 2% can enhance the effect of suppressing leakage of injected current out of the ridge as compared with the case where the P-type layer of the ridge is entirely composed of an AlGaN layer.

In Embodiment 3, third light guide layer 130 has a thickness of 0.2 µm with an In composition of 1%.

Embodiment 4

A semiconductor laser element according to Embodiment 4 will be described below. The semiconductor laser element according to Embodiment 4 is identical to semiconductor laser element 13 according to Embodiment 3 except that the lower end of a ridge is disposed in the thickness direction of the growth film of a third light guide layer. Differences of the semiconductor laser element according to Embodiment 4 from semiconductor laser element 13 according to Embodiment 3 will be mainly described below in accordance with the accompanying drawings.

Figure 29A:
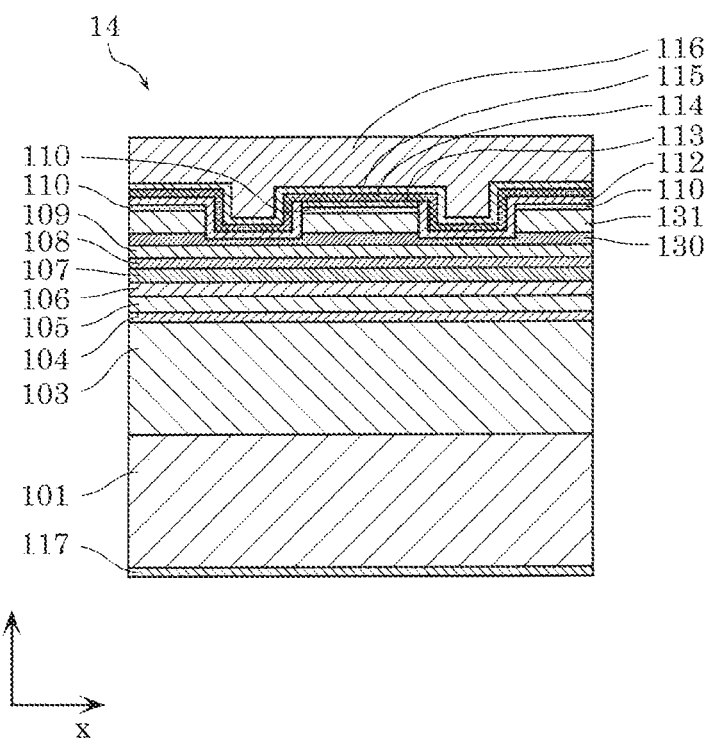
FIG. 29A is a schematic cross-sectional view illustrating the configuration of a semiconductor laser element according to Embodiment 4.
Figure 29B:
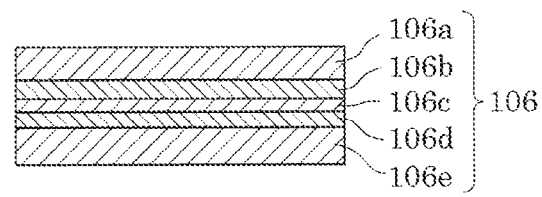
FIG. 29B is a schematic cross-sectional view illustrating the configuration of a quantum-well active layer in the semiconductor laser element according to Embodiment 4.

FIG. 29A is a schematic cross-sectional view illustrating the configuration of semiconductor laser element 14 according to Embodiment 4. FIG. 29A illustrates a cross section perpendicular to the cavity length direction of semiconductor laser element 14. FIG. 29B is a schematic cross-sectional view illustrating the configuration of quantum-well active layer 106 in semiconductor laser element 14 according to Embodiment 4.

As illustrated in FIG. 29A, semiconductor laser element 14 according to Embodiment 4 is a nitride semiconductor light-emitting element including GaN substrate 101 and a multilayer structure in which first clad layer 103 of a first conductivity type, first light guide layer 105, quantum-well active layer 106, second light guide layer 107, and second clad layer 109 of a second conductivity type are stacked on GaN substrate 101 sequentially from GaN substrate 101 like semiconductor laser element 13 according to Embodiment 3. As illustrated in FIG. 29B, quantum-well active layer 106 includes quantum well layers 106b and 106d and barrier layers 106a, 106c, and 106e like quantum-well active layer 106 according to Embodiment 1.

Semiconductor laser element 14 further includes N-type GaN layer 104, electron barrier layer 108, contact layer 110, current block layer 112, P-side ohmic electrode 113, P-side first adhesive layer 114, first barrier layer 115, pad electrode 116, and N-side electrode 117 like semiconductor laser element 13 according to Embodiment 3.

Semiconductor laser element 14 further includes third light guide layer 130 and third clad layer 131 on second clad layer 109.

As illustrated in FIG. 29A, the multilayer structure according to Embodiment 4 is configured such that the lower end of the ridge is disposed in the thickness direction of the growth film of third light guide layer 130 comprising P-type InGaN with a thickness of 0.2 µm in the multilayer structure according to Embodiment 3 illustrated in FIG. 26A. Specifically, the lower end of the ridge is disposed between both ends of third light guide layer 130 (y-axis direction in FIG. 29A) in the thickness direction. Other configurations of the multilayer structure according to Embodiment 4 are identical to the multilayer structure according to Embodiment 3.

Semiconductor laser element 14 configured thus can obtain the same effect as semiconductor laser element 13 according to Embodiment 3 as long as third light guide layer 130 is 0.1 µm to 0.2 µm in thickness in the region of the ridge at the lower end of the ridge.

Embodiment 5

A semiconductor laser element according to Embodiment 5 will be described below. The semiconductor laser element according to Embodiment 5 is identical to semiconductor laser element 13 according to Embodiment 3 except that a buffer layer is provided. Differences of the semiconductor laser element according to Embodiment 5 from semiconductor laser element 13 according to Embodiment 3 will be mainly described below in accordance with the accompanying drawings.

Figure 30A:
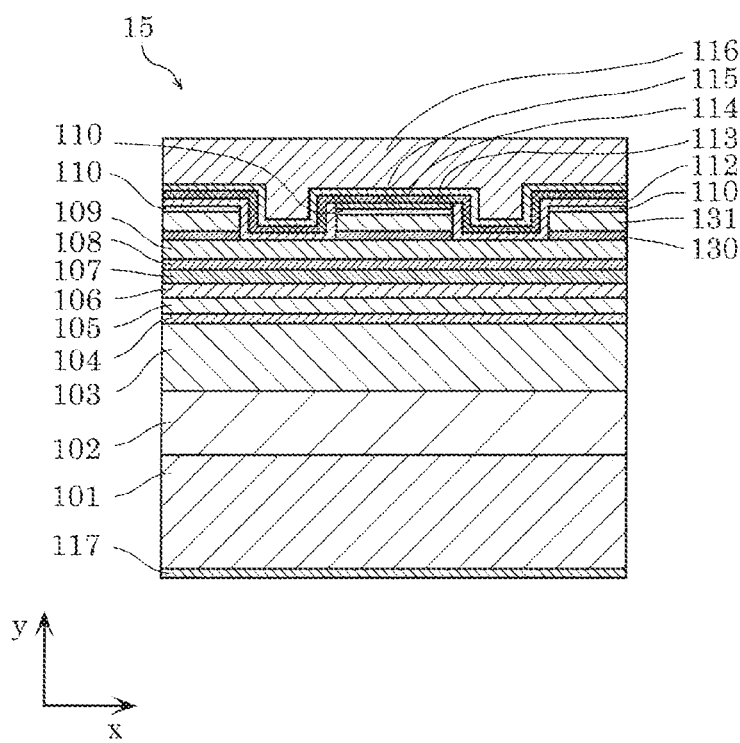
FIG. 30A is a schematic cross-sectional view illustrating the configuration of a semiconductor laser element according to Embodiment 5.
Figure 30B:
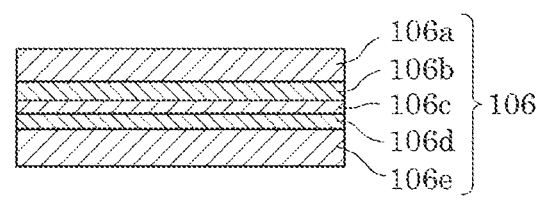
FIG. 30B is a schematic cross-sectional view illustrating the configuration of a quantum-well active layer in the semiconductor laser element according to Embodiment 5.

FIG. 30A is a schematic cross-sectional view illustrating the configuration of semiconductor laser element 15 according to Embodiment 5. FIG. 30A illustrates a cross section perpendicular to the cavity length direction of semiconductor laser element 15. FIG. 30B is a schematic cross-sectional view illustrating the configuration of quantum-well active layer 106 in semiconductor laser element 15 according to Embodiment 5.

As illustrated in FIG. 30A, semiconductor laser element 15 according to Embodiment 5 further includes buffer layer 102 in addition to the configuration of semiconductor laser element 13 according to Embodiment 3. As illustrated in FIG. 30B, quantum-well active layer 106 of semiconductor laser element 15 includes quantum well layers 106b and 106d and barrier layers 106a, 106c, and 106e as in semiconductor laser element 13.

This configuration obtain the same effect as semiconductor laser element 13 according to Embodiment 3 as long as third light guide layer 130 is 0.1 µm to 0.2 µm in thickness. Moreover, the same effect as semiconductor laser element 12 according to Embodiment 2 can be obtained.

Embodiment 6

A semiconductor laser element according to Embodiment 6 will be described below. The semiconductor laser element according to Embodiment 6 is identical to semiconductor laser element 14 according to Embodiment 4 except that a buffer layer is provided. Differences of the semiconductor laser element according to Embodiment 6 from semiconductor laser element 14 according to Embodiment 4 will be mainly described below in accordance with the accompanying drawings.

Figure 31A:
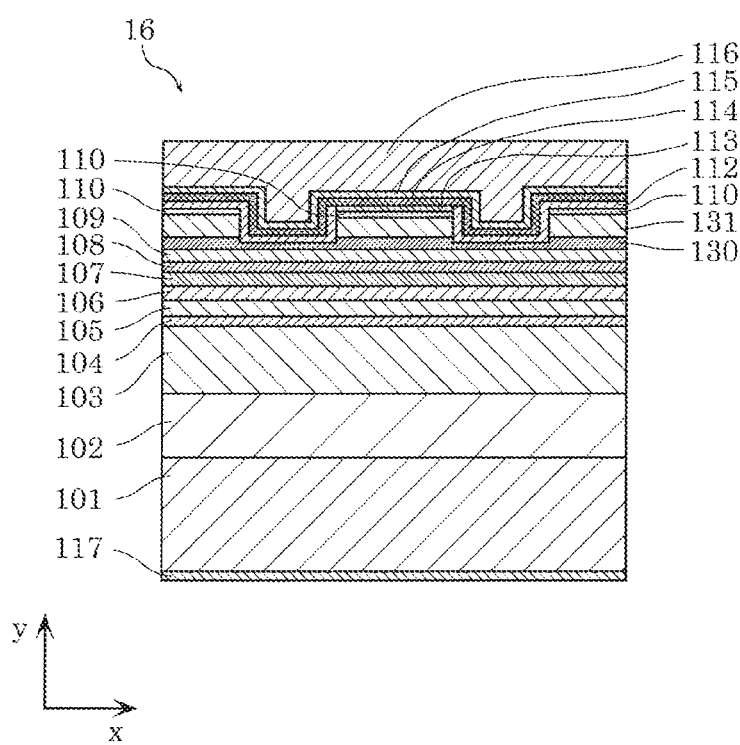
FIG. 31A is a schematic cross-sectional view illustrating the configuration of a semiconductor laser element according to Embodiment 6.
Figure 31B:
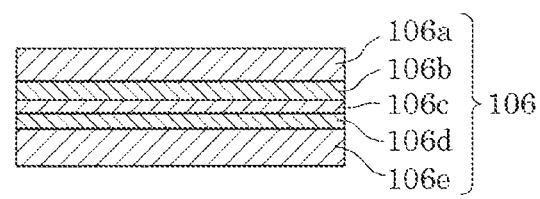
FIG. 31B is a schematic cross-sectional view illustrating the configuration of quantum-well active layer 106 in the semiconductor laser element according to Embodiment 6.

FIG. 31A is a schematic cross-sectional view illustrating the configuration of semiconductor laser element 16 according to Embodiment 6. FIG. 31A illustrates a cross section perpendicular to the cavity length direction of semiconductor laser element 16. FIG. 31B is a schematic cross-sectional view illustrating the configuration of quantum-well active layer 106 in semiconductor laser element 16 according to Embodiment 6.

As illustrated in FIG. 31A, semiconductor laser element 16 according to Embodiment 6 further includes buffer layer 102 in addition to the configuration of semiconductor laser element 14 according to Embodiment 4. As illustrated in FIG. 31B, quantum-well active layer 106 of semiconductor laser element 16 includes quantum well layers 106b and 106d and barrier layers 106a, 106c, and 106e as in semiconductor laser element 13.

This configuration obtain the same effect as semiconductor laser element 14 according to Embodiment 4 as long as third light guide layer 130 is 0.1 µm to 0.2 µm in thickness. Moreover, the same effect as semiconductor laser element 12 according to Embodiment 2 can be obtained.

In semiconductor laser elements according to Embodiments 3 to 6, a shear stress generated on a ridge waveguide appears at the boundary between materials having different thermal expansion coefficients or lattice constants. Thus, the shear stress is maximized in regions (regions A1 and A2 in FIG. 26A) near current block layer 112 at the lower end of the ridge.

In the case of a ridge laser, a shear stress is also generated in regions B1 and B2 in FIG. 26A and also affects the x-direction shear stress distribution of quantum-well active layer 106. A shear stress generated in region B1 and a shear stress generated in region A1 rotate in opposite directions. Moreover, a shear stress generated in region B2 and a shear stress generated in region A2 rotate in opposite directions. Thus, if isolation trench width D on each side of the ridge is small (see FIG. 26A), a shear stress in regions B1 and B2 cancels out a shear stress in regions A1 and A2, so that the absolute value of a shear stress generated on the quantum-well active layer decreases. This reduces a piezoelectric potential formed in the x-axis direction if the semiconductor laser element is mounted junction-down on a diamond submount substrate.

Figure 32A:
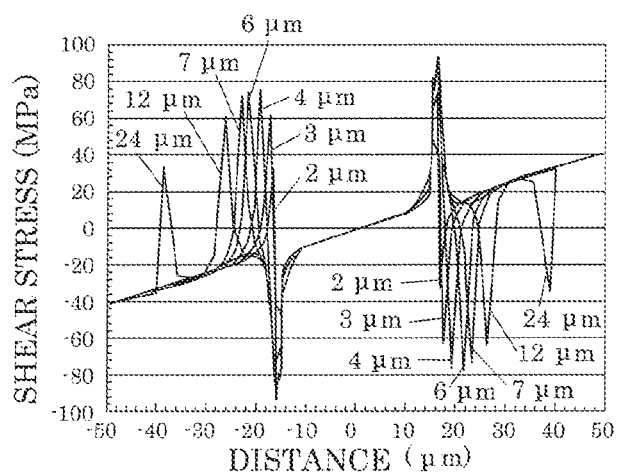
FIG. 32A is a graph showing the calculation results of a shear stress generated on the quantum well layer at 25° C. when isolation trench width D of the semiconductor laser element according to Embodiment 3 is changed from 2 μm to 24 μm.
Figure 32B:
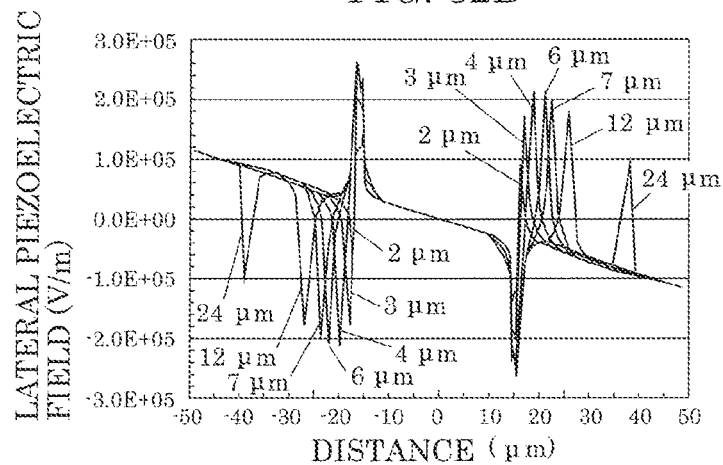
FIG. 32B is a graph showing the calculation results of a piezoelectric field generated on the quantum well layer at 25° C. when isolation trench width D of the semiconductor laser element according to Embodiment 3 is changed from 2 μm to 24 μm.
Figure 32C:
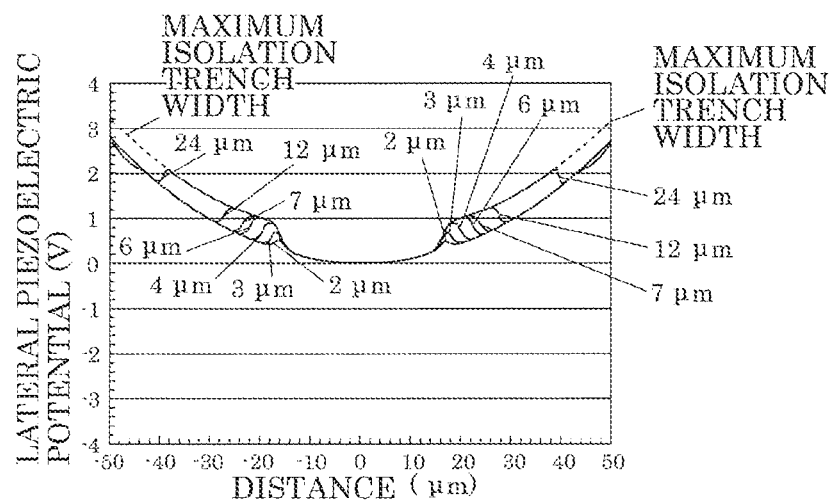
FIG. 32C is a graph showing the calculation results of a piezoelectric potential generated on the quantum well layer at 25° C. when isolation trench width D of the semiconductor laser element according to Embodiment 3 is changed from 2 μm to 24 μm.

The relationship between a shear stress and isolation trench width D will be described below in accordance with the accompanying drawings. FIGS. 32A, 32B, and 32C indicate the calculation results of a shear stress, a piezoelectric field, and a piezoelectric potential that are generated on quantum well layers 106b and 106d at 25° C. when isolation trench width D of semiconductor laser element 13 according to Embodiment 3 is changed from 2 μm to 24 μm. In FIG. 32C, a dotted line indicates that an isolation trench region reaches both ends of a chip, that is, the isolation trench width is maximized. As shown in FIG. 32C, a piezoelectric potential decreases with a reduction in isolation trench width D. When isolation trench width D is 6 μm or more, a piezoelectric potential is substantially kept constant on the ends of the ridge (at the positions of distances −15 μm and +15 μm in FIG. 32C). Furthermore, the width of a potential barrier formed in an isolation trench decreases with a reduction in isolation trench width and thus the isolation trench width is set at 6 μm or more to form the potential barrier having a width of at least 5 μm.

Figure 33A:
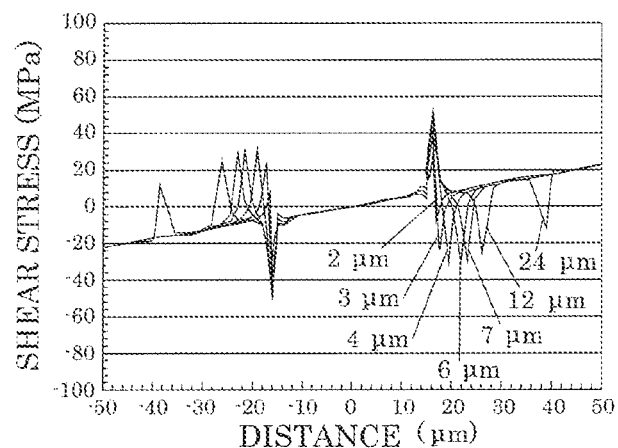
FIG. 33A is a graph showing the calculation results of a shear stress generated on the quantum well layer at 150° C. when isolation trench width D of the semiconductor laser element according to Embodiment 3 is changed from 2 μm to 24 μm.
Figure 33B:
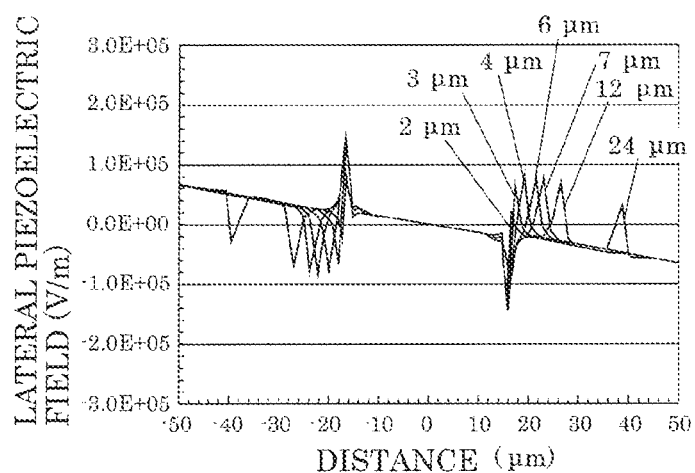
FIG. 33B is a graph showing the calculation results of a piezoelectric field generated on the quantum well layer at 150° C. when isolation trench width D of the semiconductor laser element according to Embodiment 3 is changed from 2 μm to 24 μm.
Figure 33C:
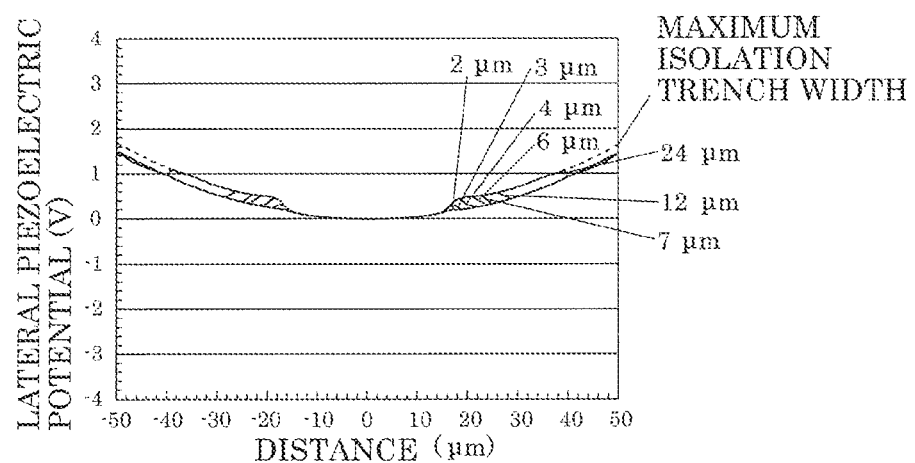
FIG. 33C is a graph showing the calculation results of a piezoelectric potential generated on the quantum well layer at 150° C. when isolation trench width D of the semiconductor laser element according to Embodiment 3 is changed from 2 μm to 24 μm.

FIGS. 33A, 33B, and 33C indicate the calculation results of a shear stress, a piezoelectric field, and a piezoelectric potential that are generated on quantum well layers 106b and 106d at 150° C. when isolation trench width D of semiconductor laser element 13 according to Embodiment 3 is changed from 2 μm to 24 μm. As in the case of 25° C., a piezoelectric potential decreases with a reduction in isolation trench width D. When isolation trench width D is 6 μm or more, a piezoelectric potential is substantially kept constant on the ends of the ridge (at the positions of distances −15 μm and +15 μm in FIG. 33C). Furthermore, the width of a potential barrier formed in the isolation trench decreases with a reduction in isolation trench width and thus the isolation trench width is set at 6 μm or more to form the potential barrier having a width of at least 5 μm.

According to the results, if the semiconductor laser element is mounted junction-down on the diamond submount substrate, a piezoelectric potential in the x-axis direction decreases unless the isolation trench width is at least 6 μm. This lessens the effect of suppressing leakage of injected current in the ridge to the outside.

If isolation trench width D is too large, a mounting load may concentrate on the ridge and damage the region of the ridge during junction-down mounting. Moreover, a lattice defect may occur on the quantum-well active layer immediately under the ridge. In the semiconductor laser elements according to Embodiments 3 to 6, damage to the ridge can be reduced by setting isolation trench width D at 15 μm or less.

Thus, isolation trench width D set at 6 μm to 15 μm achieves the effect of suppressing leakage of injected current in the ridge to the outside while suppressing damage to the ridge and the occurrence of lattice defects in the ridge region when the semiconductor laser element is mounted junction-down on the diamond submount substrate.

In the embodiments of the present disclosure, isolation trench width D set at 7 μm achieves the effect of suppressing leakage of injected current in the ridge to the outside while suppressing damage to the ridge and the occurrence of lattice defects in the ridge region when the semiconductor laser element is mounted junction-down on the diamond submount substrate.

Embodiment 7

A semiconductor laser element according to Embodiment 7 will be described below. In semiconductor laser elements according to the embodiments, the multilayer structure is formed above the GaN substrate having a (0001) C-face. If a nitride layer is formed on the C-face, piezo polarization charge is generated on an interface having a lattice misfit and a piezoelectric field in, for example, the C-axis direction ((0001) direction) is generated in the normal direction relative to the principal surface of the GaN substrate as shown in graph (c) in FIG. 2, thereby increasing the operating voltage. In order to suppress the occurrence of a piezoelectric field in the C-axis direction and reduce the operating voltage, the semiconductor laser element according to Embodiment 7 has a multilayer structure on a semipolar face including a GaN {11-22} face. The semiconductor laser element according to Embodiment 7 will be described below in accordance with the accompanying drawings.

Figure 34:
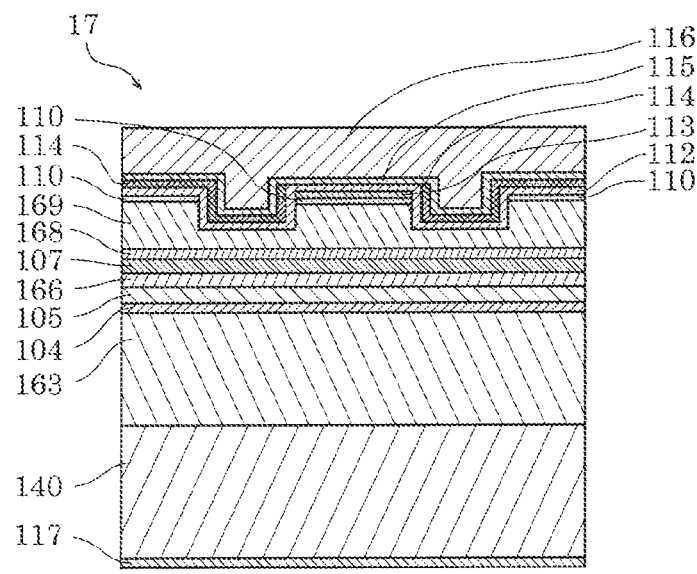
FIG. 34 is a schematic cross-sectional view illustrating the configuration of a semiconductor laser element according to Embodiment 7.

FIG. 34 is a schematic cross-sectional view illustrating the configuration of semiconductor laser element 17 according to Embodiment 7.

As illustrated in FIG. 34, semiconductor laser element 17 according to Embodiment 7 is identical to semiconductor laser element 11 according to Embodiment 1 except for GaN substrate 140. As described above, the principal face of GaN substrate 140 according to Embodiment 7 is a semi-polar face including a {11-22} face.

In this case, the C-face of GaN substrate 101 according to the embodiments is referred to as a polar face that is most seriously affected by piezo polarization. However, polarization does not occur on a {10-10} face (M-face) and {11-20} face (A-face) that are perpendicular to the C-face. These faces are referred to as non-polar faces. A reduction in luminous efficiency due to piezo polarization in the semiconductor laser element may be suppressed by using the GaN substrate having these faces. Except for the C-face, faces such as the {20-21} face and the {11-22} face that are inclined from the non-polar faces are referred to as semipolar faces that can reduce piezo polarization.

The multilayer structure formed above GaN substrate 140 is identical to the multilayer structure according to Embodiment 1 except for first clad layer 163, electron barrier layer 168, and second clad layer 169.

It is not always necessary to provide electron barrier layer 168 for semiconductor laser element 17. An Al composition may be at most about 1% or 0% (GaN) in first clad layer 163 comprising N-type AlGaN and second clad layer 169 comprising P-type AlGaN. In other words, the Al composition may be 1% or less in the multilayer structure. The reason will be described in Embodiment 8.

Figure 35:
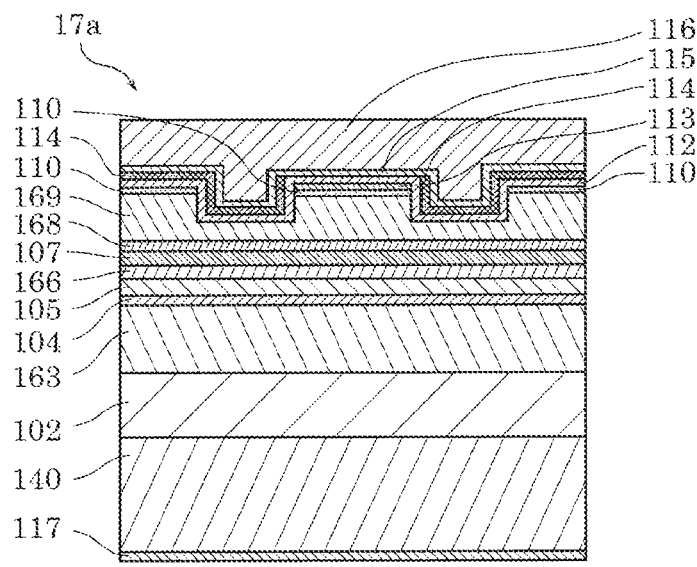
FIG. 35 is a schematic cross-sectional view illustrating the configuration of a semiconductor laser element according to a variation of Embodiment 7.

Semiconductor laser element 17 according to Embodiment 7 may further include compressive buffer layer 102. FIG. 35 is a schematic cross-sectional view illustrating the configuration of semiconductor laser element 17a according to a variation of Embodiment 7. As illustrate in FIG. 35, semiconductor laser element 17a includes compressive buffer layer 102.

Embodiment 8

A semiconductor laser element according to Embodiment 8 will be described below. In order to suppress the occurrence of a piezoelectric field in the C-axis direction and reduce the operating voltage as discussed in Embodiment 7, the semiconductor laser element according to Embodiment 8 is different from the semiconductor laser elements according to the foregoing embodiments in that a multilayer structure is formed on a non-polar face including a GaN {10-10} face (M-face). Differences of the semiconductor laser element according to Embodiment 8 from the semiconductor laser elements according to the foregoing embodiments will be mainly described below in accordance with the accompanying drawings.

Figure 36:
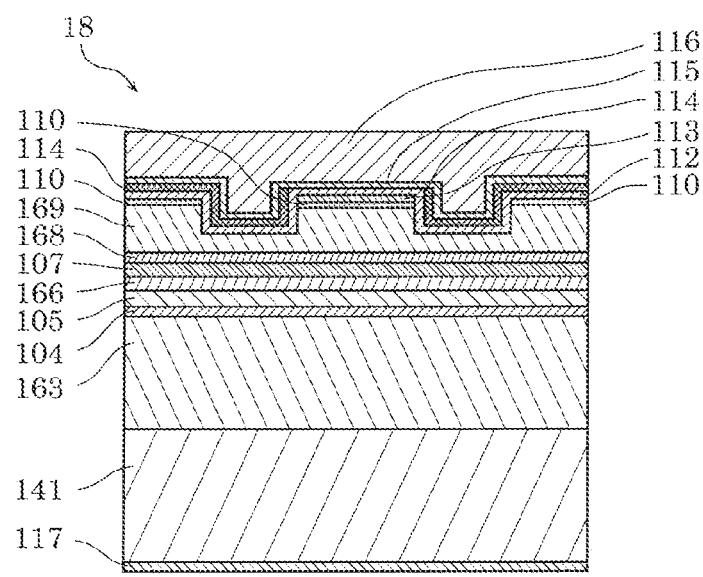
FIG. 36 is a schematic cross-sectional view illustrating the configuration of a semiconductor laser element according to Embodiment 8.
Figure 37:
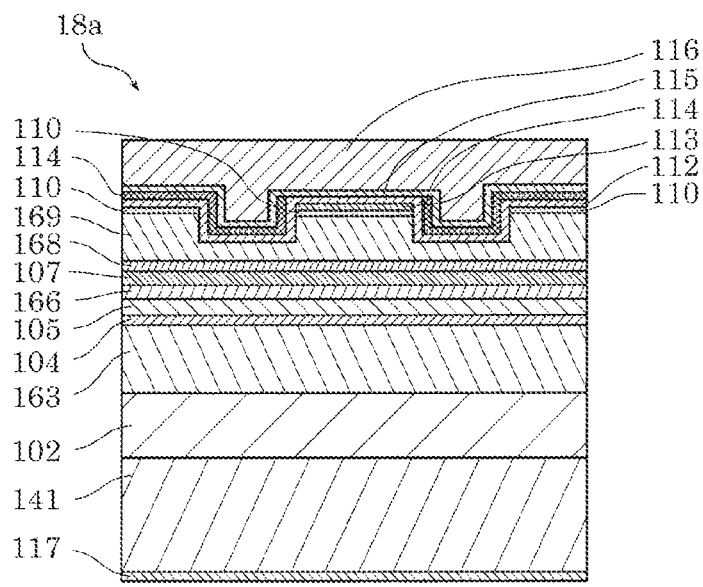
FIG. 37 is a schematic cross-sectional view illustrating the configuration of a semiconductor laser element according to a variation of Embodiment 8.

FIG. 36 is a schematic cross-sectional view illustrating the configuration of semiconductor laser element 18 according to Embodiment 8. FIG. 37 is a schematic cross-sectional view illustrating the configuration of semiconductor laser element 18a according to a variation of Embodiment 8.

As illustrated in FIG. 36, semiconductor laser element 18 according to Embodiment 8 includes GaN substrate 141 having a {10-10} face (M-face) as a principal face. The multilayer structure formed above GaN substrate 141 is identical to the multilayer structure according to Embodiment 1 except for first clad layer 163, electron barrier layer 168, and second clad layer 169.

Semiconductor laser element 18 may include compressive buffer layer 102. As illustrate in FIG. 37, semiconductor laser element 18a according to a variation of Embodiment 8 includes buffer layer 102.

It is not always necessary to provide electron barrier layer 168 for semiconductor laser element 18. An Al composition may be at most about 1% or 0% (GaN) in first clad layer 163 and second clad layer 169. In other words, the Al composition may be 1% or less in the multilayer structure. The reason will be discussed later.

The formation of the multilayer structure on the semipolar face or the non-polar GaN substrate can reduce or eliminate the occurrence of a piezoelectric field in a normal direction with respect to the GaN substrate, thereby reducing an operating voltage. Although a lattice misfit generates piezo polarization charge on a heterointerface because AlGaN and InGaN have different lattice constants from GaN, the multilayer structure suppresses or prevents the occurrence of piezo polarization charge. This suppresses deformation of a band structure in the normal direction with respect to the GaN substrate on the C-face, achieving a lower voltage. Thus, a piezoelectric field generated on a quantum-well active layer in the C-axis direction ((0001) direction) as indicated in graph (c) in FIG. 2 is suppressed or eliminated, so that the band structure is placed in the state of graph (a) in FIG. 2. Consequently, as shown in FIG. 9B, a high gain can be obtained with a low carrier injection density in the quantum-well active layer, thereby reducing a lasing threshold current value and an operating carrier density during an operation. This reduces an operating carrier density during a high-temperature high-power operation and suppresses the occurrence of carrier overflow in which thermally excited carriers leak into the clad layers from the quantum-well active layer. Thus, it is not necessary to increase confining of light in the quantum-well active layer by using the AlGaN clad layers or suppress the occurrence of carrier overflow by using electron barrier layer 168. Hence, as described above, semiconductor laser element 18 may not include electron barrier layer 168 and an Al composition may be at most about 1% or 0% (GaN) in first clad layer 163 and second clad layer 169. In other words, the Al composition may be 1% or less in the multilayer structure.

If the GaN substrate is semi-polar or non-polar, piezo polarization charge generated on an interface between a quantum well layer and a barrier layer is reduced or eliminated. Thus, even if the number of quantum well layers of the quantum-well active layer is increased to, for example, four from that of a DQW structure, the optical confinement factor can be vertically increased over the quantum well layer without increasing the operating voltage.

Hence, as the number of quantum well layers increases, an operating carrier density decreases in the quantum well layers, thereby further suppressing the occurrence of carrier overflow.

In the multilayer structure including the AlGaN layer, the AlGaN layer generates a tensile stress relative to the GaN substrate and thus acts in a direction that raises a tension in mean strain $\varepsilon_{tave}$ of the overall multilayer structure. Thus, the semiconductor laser element warps into a convex shape ($\Delta R>0$) with the substrate placed on top of the structure. For this reason, in order to warp the semiconductor laser element into a concave shape ($\Delta R<0$) with the GaN substrate placed on top of the structure, an Al composition may be reduced in an Al layer or the Al layer may be eliminated.

Figure 38A:
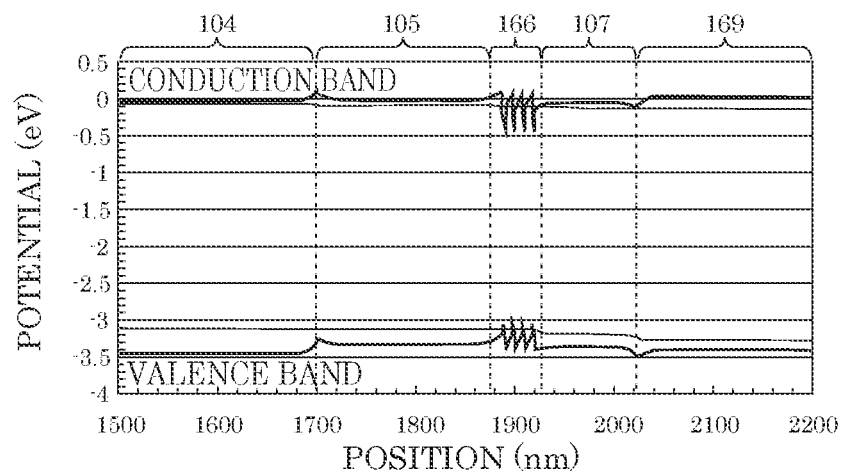
FIG. 38A shows a band structure near the quantum-well active layer if a multilayer structure including a first clad layer and a second clad layer with an Al composition of 0 is formed above a GaN substrate having a C-face as a principal face.

The relationship between the band structure of the multilayer structure and the polarity of the principal face of the GaN substrate will be described below in accordance with the accompanying drawings. FIG. 38A shows the band structure near quantum-well active layer 166 if a multilayer structure including first clad layer 163 and second clad layer 169 with an Al composition of 0 is formed on a GaN substrate having a C-face as a principal face.

Figure 38B:
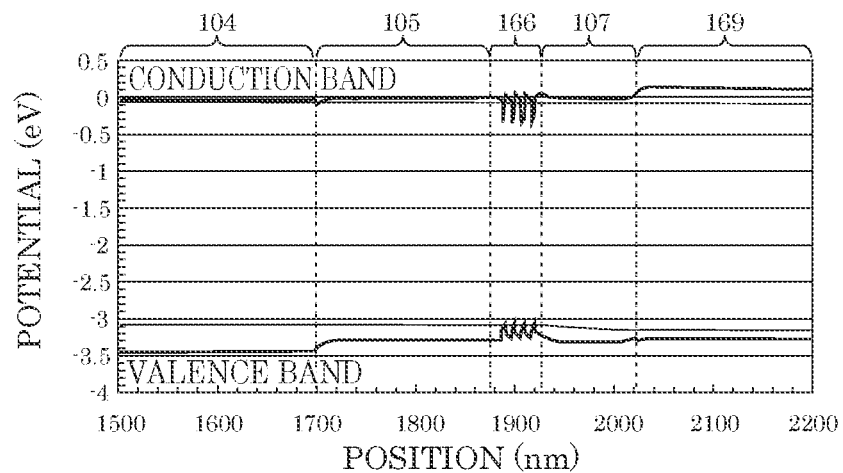
FIG. 38B shows a band structure near the quantum-well active layer if the multilayer structure including the first clad layer and the second clad layer with an Al composition of 0 is formed above a GaN substrate having a semi-polar face as a principal face.

FIG. 38B shows the band structure near quantum-well active layer 166 if the multilayer structure including first clad layer 163 and second clad layer 169 with an Al composition of 0 is formed on a GaN substrate having a semi-polar face as a principal face.

Figure 38C:
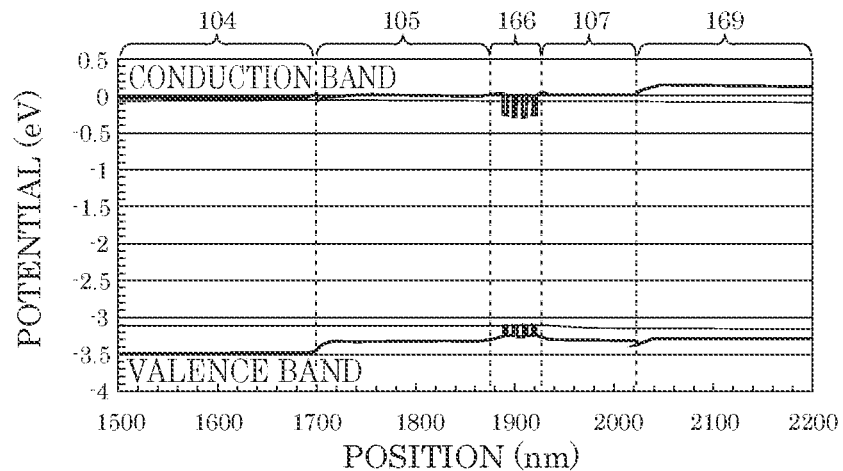
FIG. 38C shows a band structure near the quantum-well active layer if the multilayer structure including the first clad layer and the second clad layer with an Al composition of 0 is formed above a GaN substrate having a non-polar face as a principal face.

FIG. 38C shows the band structure near quantum-well active layer 166 if the multilayer structure including first clad layer 163 and second clad layer 169 with an Al composition of 0 is formed on a GaN substrate having a non-polar face as a principal face.

In this configuration, quantum-well active layer 166 includes four quantum well layers. The quantum well layers are 30 Å thick with an In composition of 18%. Moreover, barrier layers are 3 nm, 7 nm, 7 nm, 7 nm, and 3 nm in thickness sequentially from one end. Furthermore, an Al composition is absent in electron barrier layer 168 (that is, a GaN layer).

As shown in FIG. 38A, the formation of the multilayer structure on the C-face generates a large piezoelectric field on the quantum well layers of quantum-well active layer 166. This increases the operating voltage and reduces a gain according to a bias of a wave function.

In contrast, as shown in FIG. 38B, the multilayer structure formed above a semi-polar face generates a small piezoelectric field on the quantum well layers of quantum-well active layer 166. This suppresses an increase in operating voltage and a reduction in gain according to a bias of the wave function.

As shown in FIG. 38C, the multilayer structure formed on a non-polar face does not generate a piezoelectric field on the quantum well layers of the quantum-well active layer. This suppresses an increase in operating voltage and prevents a reduction in gain according to a bias of the wave function.

Hence, the formation of the multilayer structure on the GaN substrate with a semi-polar or non-polar principal face can obtain a high gain from the quantum well layers with a low injected current, achieving a semiconductor laser element with a low voltage and a low operating current.

If the semiconductor laser element in a concave form with the GaN substrate placed on top of the structure is mounted junction-down on a submount substrate by using AuSn solder as a bonding layer, the semiconductor laser element is mounted at a high temperature of about 300° C. When the temperature is lowered to 25° C. from this state, a solder layer and a P-side electrode contract according to a thermal expansion coefficient. Thus, ΔR indicating the concave shape of the semiconductor laser element becomes smaller after mounting.

Conversely, if the laser element in a convex form with the GaN substrate placed on top of the structure is mounted junction-down on the submount substrate by using AuSn solder, the laser element is similarly mounted at a high temperature of about 300° C. When the temperature is lowered to 25° C. from this state, the solder layer and the P-side electrode contract according to the thermal expansion coefficient. Thus, ΔR indicating the convex shape of the element becomes larger after mounting.

A compressive strain generated on the quantum-well active layer in the z-axis direction of FIGS. 3A and 3B is smaller in the concave shape because the quantum-well active layer is further extended. Thus, the semiconductor laser element in the concave form with the GaN substrate placed on top of the structure tends to generate a smaller compressive stress on the quantum-well active layer and thus advantageously suppresses the occurrence of lattice defects.

By using a semi-polar substrate or a non-polar substrate, a high gain can be obtained from each of the quantum well layers with a small injected current without using an AlGaN layer, achieving a laser element with a low voltage and a low operating current. Furthermore, if the AlGaN clad layer is replaced with a layer that does not include Al in the multilayer structure, compressive mean strain $\varepsilon_{tave}$ of the overall multilayer structure can be easily obtained without using a compressive buffer layer in the multilayer structure, so that the semiconductor laser element can have a concave shape (ΔR<0) with the GaN substrate placed on top of the structure. In this case, the effect is enhanced by increasing the number of quantum well layers of the quantum-well active layer. This can reduce a compressive strain generated on a quantum well while obtaining compressive mean strain $\varepsilon_{tave}$ of the multilayer structure, thereby suppressing the occurrence of lattice defects. Therefore, a reliable semiconductor laser element can be achieved suitably for a long-term operation.

The relationship between an operating voltage of the semiconductor laser element and an Al composition of each clad layer and the number of quantum well layers will be described below in accordance with the accompanying drawings.

Figure 39A:
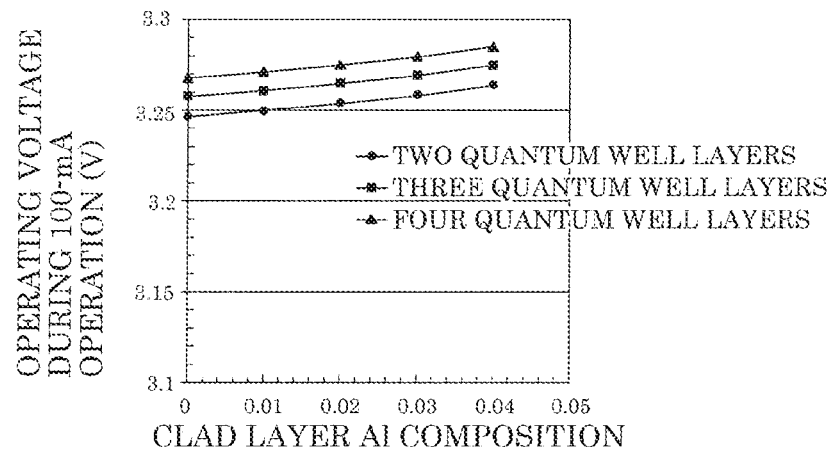
FIG. 39A is a graph showing the dependence of an operating voltage on the Al composition of each clad layer during a 100-mA operation of the semiconductor laser element having the multilayer structure on the C-face.
Figure 39B:
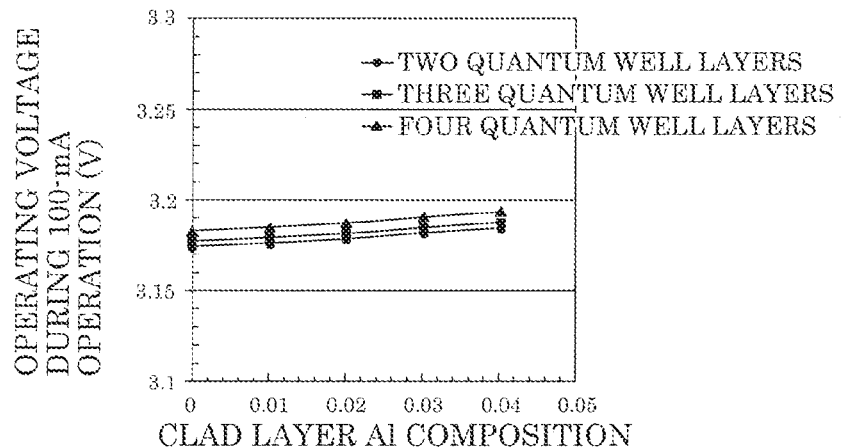
FIG. 39B is a graph showing the dependence of an operating voltage on the Al composition of each clad layer during a 100-mA operation of the semiconductor laser element having the multilayer structure on the semi-polar face.
Figure 39C:
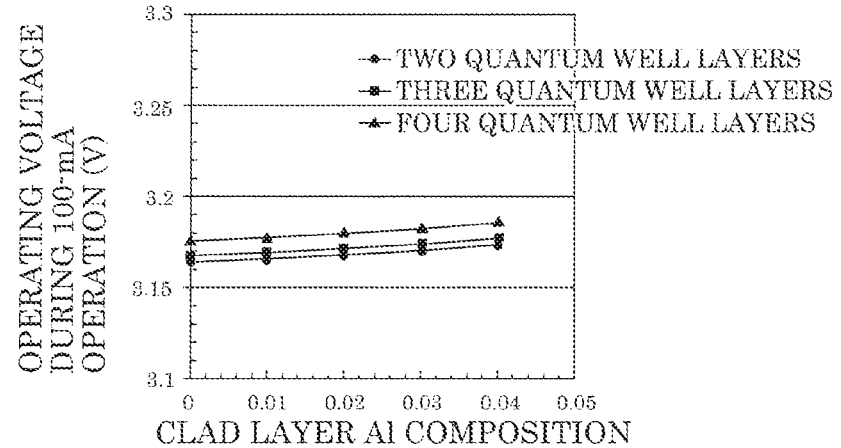
FIG. 39C is a graph showing the dependence of an operating voltage on the Al composition of each clad layer during a 100-mA operation of the semiconductor laser element having the multilayer structure on the non-polar face.

FIGS. 39A, 39B, and 39C are graphs showing the dependence of an operating voltage on the Al composition of each clad layer during a 100-mA operation of the semiconductor laser element when the multilayer structure is formed on a C-face, a semi-polar face, and a non-polar face. FIGS. 39A to 39C show an operating voltage of a semiconductor laser element that is identical in structure to the semiconductor laser element illustrated in FIG. 34. Furthermore, FIGS. 39A to 39C show calculation results when the number of quantum well layers is changed from two to four. The electron barrier layer has the same Al composition as the clad layers in each calculation. In the case of three quantum well layers, the barrier layers are 3 nm, 7 nm, 7 nm, and 3 nm in thickness sequentially from the GaN substrate.

As shown in FIG. 39A, in the case of the multilayer structure formed on the C-face, the larger the number of quantum well layers, the larger the operating voltage according to a piezoelectric field in the normal direction of the substrate.

As shown in FIGS. 39B and 39C, in the case of the multilayer structure formed on the semi-polar or non-polar substrate, an increase in operating voltage is suppressed even if the number of quantum well layers is increased. In particular, even if the number of quantum well layers is increased from two to three, an increase in operating voltage is substantially suppressed. In the case of three quantum well layers, the optical confinement factor perpendicular to the quantum-well active layer can be increased to about 1.5 times larger than that in the case of three quantum well layers. This can reduce an operating carrier density in the quantum-well active layer.

If the substrate is a semi-polar or non-polar, even if the Al composition of each clad layer is increased to 1%, an increase in operating voltage is suppressed. Thus, in the case of the semi-polar or non-polar substrate, the operating voltage hardly increases even if the Al composition of each clad layer is 0% (GaN) to 1%.

Figure 40:
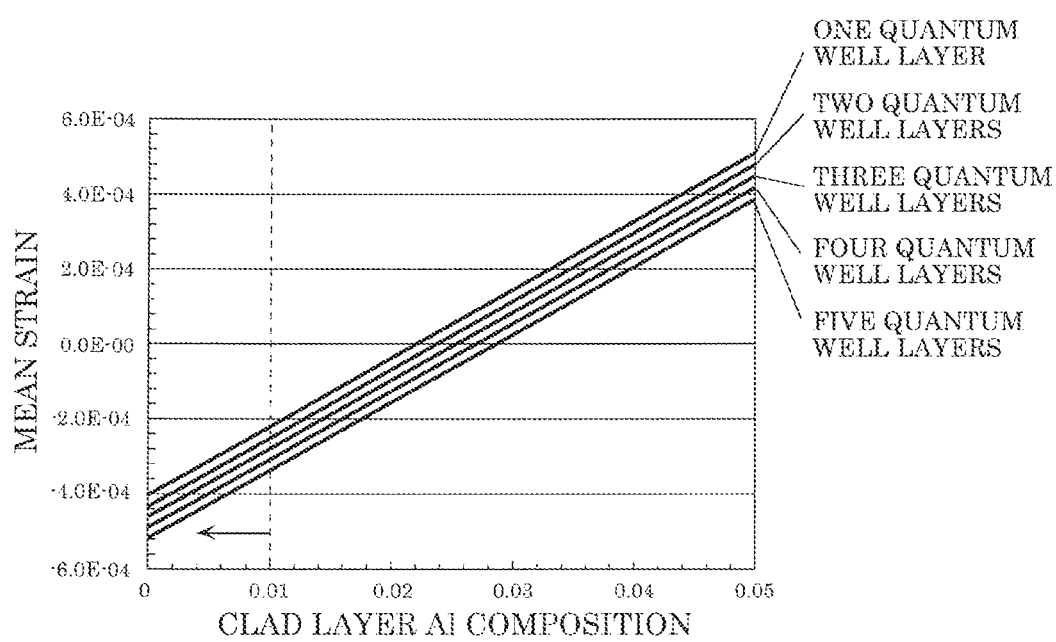
FIG. 40 is a graph showing the dependence of mean strain $\varepsilon_{tave}$ of the multilayer structure on the Al composition of each clad layer.

The relationship between mean strain $\varepsilon_{tave}$ of the multilayer structure and an Al composition of each clad layer and the number of quantum well layers will be described below in accordance with the accompanying drawings. FIG. 40 is a graph showing the dependence of mean strain $\varepsilon_{tave}$ of the multilayer structure on the Al composition of each clad layer. FIG. 40 shows the calculation results of mean strain $\varepsilon_{tave}$ of the overall multilayer structure if the In composition is 4% in the barrier layer of the structure illustrated in FIG. 34, the In composition is 3% in first light guide layer 105 and second light guide layer 107, and the total thickness of first light guide layer 105 and second light guide layer 107 is 300 nm. FIG. 40 shows calculation results for one to five quantum well layers. In the calculations, first clad layer 163 and second clad layer 169 that comprise AlGaN have the same Al composition as electron barrier layer 168.

As shown in FIG. 40, as the number of quantum well layers increases from one to five, compression of mean strain $\varepsilon_{tave}$ increases. In particular, when the Al composition is 1% or less, mean strain $\varepsilon_{tave}$ is at most $-2 \times 10^{-4}$, indicating that ΔR is negative.

Thus, if the substrate is semi-polar or non-polar, a high gain can be obtained from each of the quantum well layers with a small injected current by using the clad layer with the Al composition of at most 1% or a layer that does not include Al. Thus, a laser element can be achieved with a low voltage and a low operating current. Furthermore, if the Al composition is at most 1% in each of the clad layers, compressive mean strain $\varepsilon_{tave}$ of the overall multilayer structure can be obtained without using a compressive buffer layer in the multilayer structure, so that the semiconductor laser element can have a concave shape (ΔR<0) with the GaN substrate placed on top of the structure. In this case, the effect is enhanced by increasing the number of quantum well layers of the quantum-well active layer. This can reduce a compressive strain generated on the quantum well layer while obtaining compressive mean strain $\varepsilon_{tave}$ of the multilayer structure, thereby suppressing the occurrence of lattice defects. Therefore, a reliable laser element can be achieved suitably for a long-term operation.

Embodiment 9

Embodiment 9 will be described below. In Embodiment 9, semiconductor laser element 11 according to Embodiment 1 is mounted on submount substrate 122.

Figure 41:
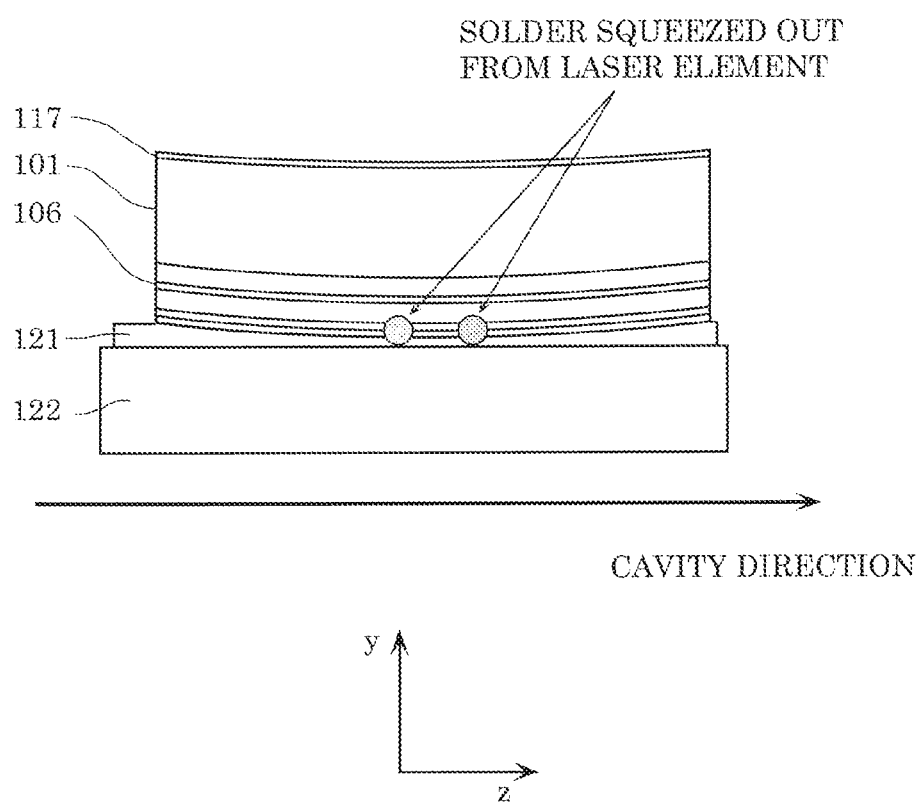
FIG. 41 shows a solder material squeezed out from a side wall near the center of the laser element.

If semiconductor laser element 11 in a concave form with the substrate placed on top of the structure is mounted junction-down on the submount substrate, the laser element is concave at the center in the cavity direction and thus the side ends of the submount substrate of the multilayer structure are convex at the center in the cavity direction. Thus, on the submount substrate, a load first concentrates on a part near the center in the cavity direction during mounting. Hence, as illustrated in FIG. 41, solder that forms a bonding layer is likely to be squeezed out from a side wall near the center of the laser element.

Figure 42:
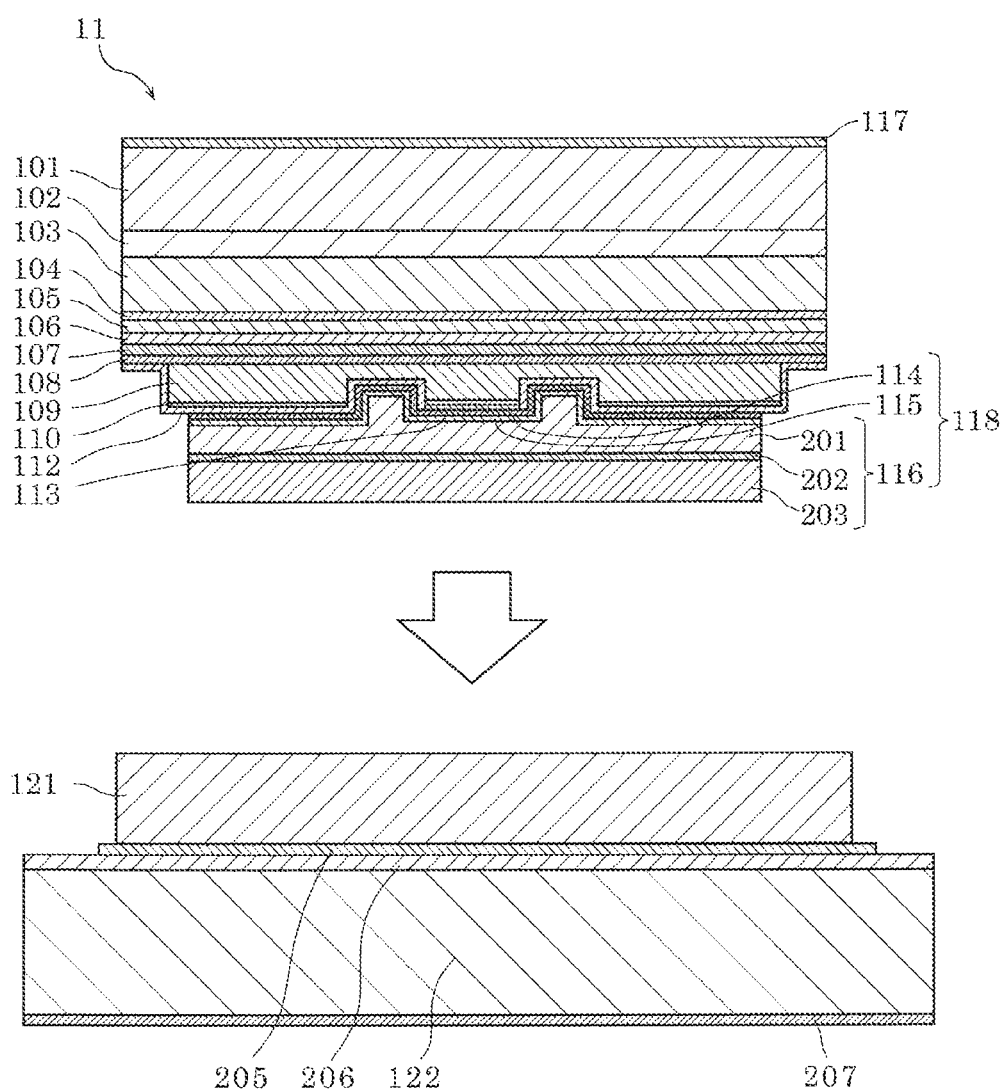
FIG. 42 is a schematic cross-sectional view illustrating a state immediately before the semiconductor laser element according to Embodiment 1 is mounted junction-down on the submount substrate.

This state will be specifically described below in accordance with the drawings. FIG. 42 is a schematic cross-sectional view illustrating a state immediately before semiconductor laser element 11 according to Embodiment 1 is mounted junction-down on submount substrate 122. FIG. 42 illustrates a cross section perpendicular to the cavity direction of semiconductor laser element 11. FIG. 42 is a cross-sectional view illustrating a mounting state of semiconductor laser element 11 according to Embodiment 1. The cross-sectional view of semiconductor laser element 11 in FIG. 42 is vertically inverted from that of FIG. 1A.

As illustrated in FIG. 42, pad electrode 116 formed on first barrier layer 115 of semiconductor laser element 11 includes first pad electrode 201 comprising Au with a thickness of 0.6 µm, second barrier layer 202 comprising Pt with a thickness of 35 nm, and second pad electrode 203 comprising Au with a thickness of 1.0 µm. Moreover, P-side first adhesive layer 114, first barrier layer 115, first pad electrode 201, second barrier layer 202, and second pad electrode 203 constitute P-side multilayer electrode 118.

FIG. 42 also illustrates the configurations of, for example, submount substrate 122 comprising diamond and bonding layer 121 formed above submount substrate 122. Under submount substrate 122, bottom-contact metallic layer 207 comprising Ti, Pt, and Au is formed.

On submount substrate 122, sequentially from submount substrate 122, top-contact metallic layer 206 comprising Ti, Pt, and Au, submount barrier layer 205 comprising Pt, and bonding layer 121 comprising AuSn are formed.

In this state, a load is applied to semiconductor laser element 11 to bring semiconductor laser element 11 into contact with submount substrate 122 at a high temperature of 300° C., which is the melting temperature of bonding layer 121 comprising AuSn. In this way, semiconductor laser element 11 is mounted on submount substrate 122.

After the mounting, second pad electrode 203 comprising Au chemically reacts with bonding layer 121 comprising AuSn, so that second pad electrode 203 is substantially entirely comprising AuSn. Second barrier layer 202 comprising Pt acts as a barrier for preventing a chemical reaction of first pad electrode 201 comprising Au and bonding layer 121 comprising AuSn. First pad electrode 201 contains Au even after the mounting.

At this point, if semiconductor laser element 11 in a concave form with GaN substrate 101 placed on top of the structure is mounted junction-down on the submount substrate, the laser element is concave at the center in the cavity direction and thus a load first concentrates on a part near the center in the cavity direction on the submount substrate during mounting. Thus, a material of AuSn bonding layer 121 at the center in the cavity direction is likely to be squeezed out along the side wall of semiconductor laser element 11 so as to cover the side wall. In this case, first clad layer 103 and second clad layer 109 are short-circuited by AuSn and thus current applied to semiconductor laser element 11 may cause leakage current without passing through a PN junction of semiconductor laser element 11. Such leakage current may disadvantageously increase a lasing threshold current value and an operating current value.

Figure 43:
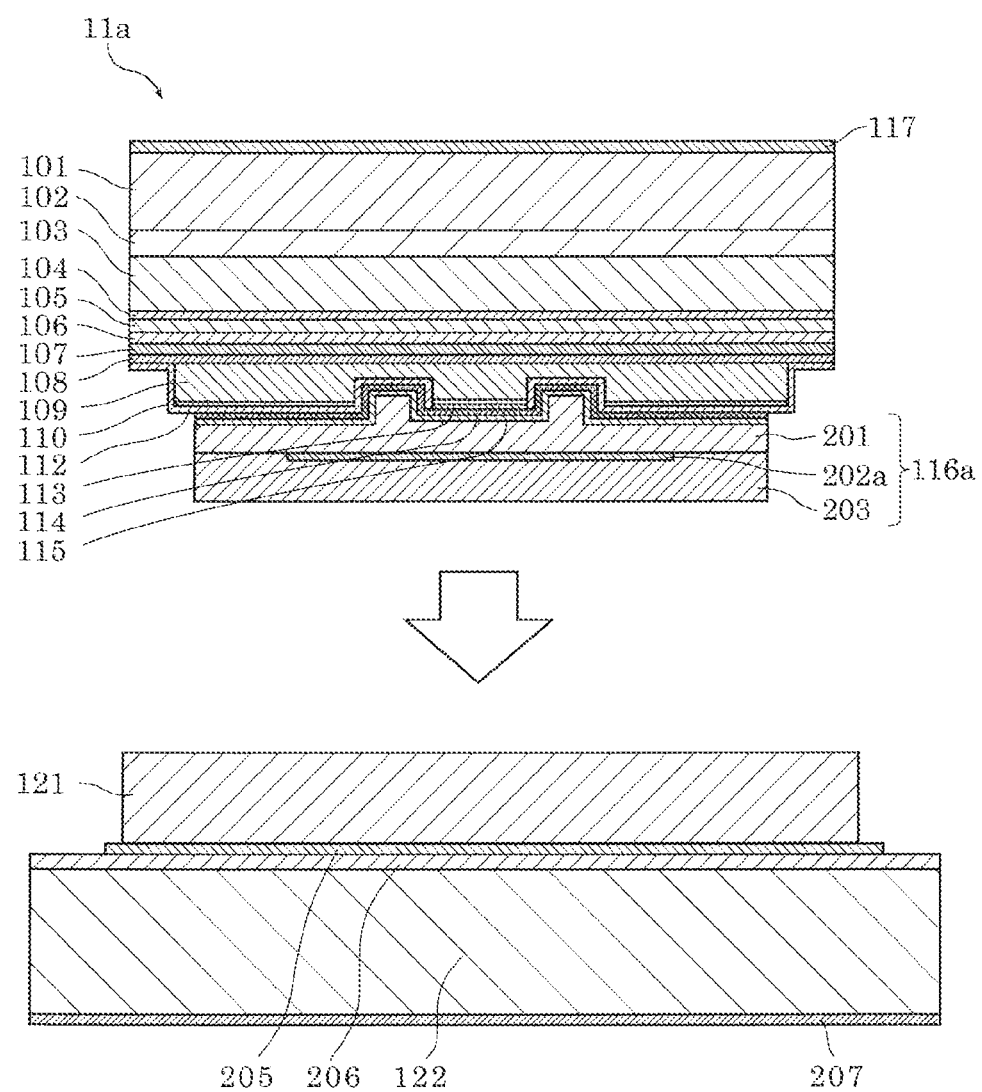
FIG. 43 is a schematic cross-sectional view illustrating a state immediately before a semiconductor laser element according to Embodiment 9 is mounted junction-down on the submount substrate.

The semiconductor laser element is configured to suppress covering over the side wall of semiconductor laser element 11 with AuSn. The configuration of the semiconductor laser element will be described below in accordance with the accompanying drawings. FIG. 43 is a schematic cross-sectional view illustrating a state immediately before semiconductor laser element 11a according to Embodiment 9 is mounted junction-down on submount substrate 122. FIG. 43 illustrates a cross section perpendicular to the cavity direction of semiconductor laser element 11a.

As illustrated in FIG. 43, semiconductor laser element 11a according to Embodiment 9 is identical to semiconductor laser element 11 according to Embodiment 1 except for the configuration of second barrier layer 202a of pad electrode 116a. The width of a shorter side (in a short-side direction) of second barrier layer 202a is smaller than that of a shorter side (in a short-side direction) of first barrier layer 115. In other words, second barrier layer 202a is smaller in width than first barrier layer 115 in a direction perpendicular to the cavity direction and the stacking direction. The structure of a semiconductor laser for semiconductor laser element 11a mounted junction-down on submount substrate 122 will be described below in accordance with the accompanying drawings.

Figure 44:
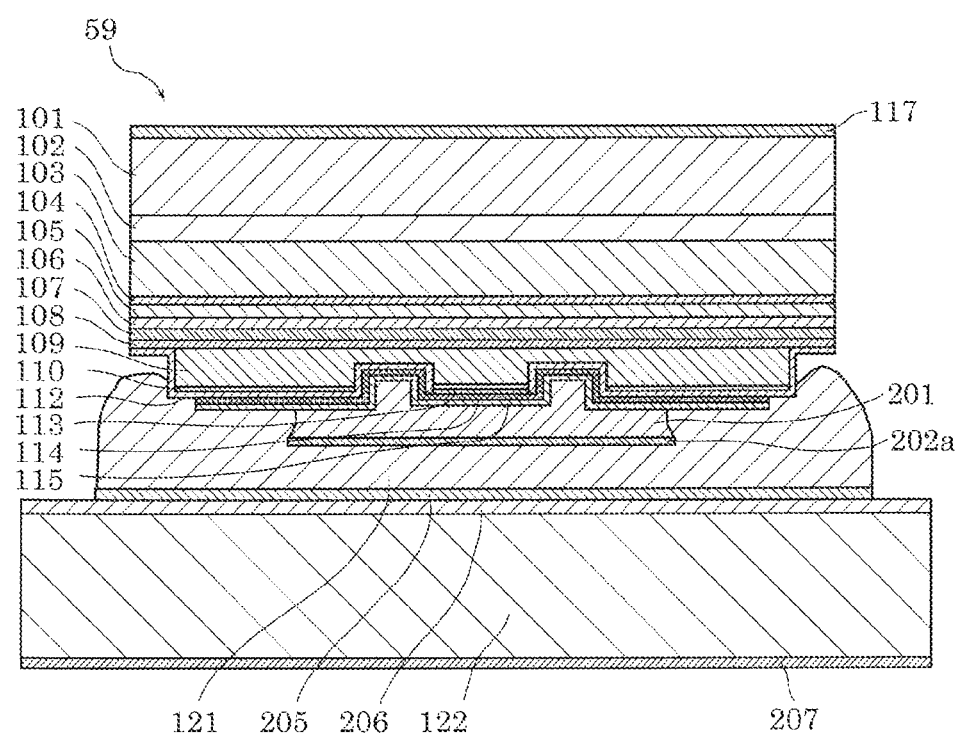
FIG. 44 is a schematic cross-sectional view illustrating the structure of the semiconductor laser according to Embodiment 9.

FIG. 44 is a schematic cross-sectional view illustrating the structure of semiconductor laser 59 according to Embodiment 9. FIG. 44 illustrates a cross section perpendicular to the cavity direction of semiconductor laser 59.

Semiconductor laser 59 in FIG. 44 is an example of a nitride light emitter that includes semiconductor laser element 11a and submount substrate 122. In semiconductor laser 59, semiconductor laser element 11a is mounted on submount substrate 122 such that the multilayer structure and submount substrate 122 are opposed to each other.

As illustrated in FIG. 44, bonding layer 121 comprising AuSn and first pad electrode 201 in a region not covered with second barrier layer 202a chemically react with each other, first pad electrode 201 partially contains AuSn, and AuSn expands to the center of the laser element (that is, the center in the horizontal direction in FIG. 44). Thus, a bonding layer surface at a joining part of bonding layer 121 and first pad electrode 201 is curved into the center from the outer edge of first pad electrode 201. Bonding layer 121 is also placed inward from the ends of second barrier layer 202a in a region between second barrier layer 202a and the first barrier layer. In other words, bonding layer 121 is partially disposed between second barrier layer 202a and first barrier layer 115 and is placed inward from the ends of second barrier layer 202a.

This suppresses the extension of bonding layer 121 to the side wall of semiconductor laser element 11a, thereby suppressing the occurrence of leakage current caused by a short circuit on the side wall.

Figure 45A:
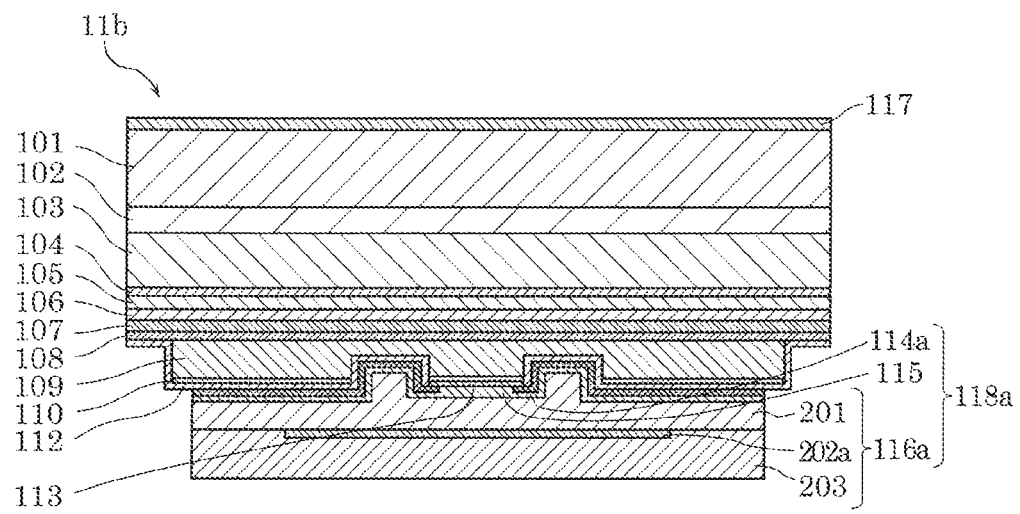
FIG. 45A is a schematic cross-sectional view illustrating the configuration of a semiconductor laser element according to a variation of Embodiment 9.

The electrode configuration of the semiconductor laser element is not limited to, for example, the configuration of FIG. 43. A variation of the electrode configuration of the semiconductor laser element will be described below in accordance with the accompanying drawings. FIG. 45A is a schematic cross-sectional view illustrating the configuration of semiconductor laser element 11b according to the variation of Embodiment 9. As illustrated in FIG. 45A, semiconductor laser element 11b according to the variation is identical to semiconductor laser element 11a except for the configuration of P-side first adhesive layer 114a in the electrode. As illustrated in FIG. 45A, P-side first adhesive layer 114a comprising Ti is not formed on a ridge. This configuration can reduce the resistance of semiconductor laser element 11b, achieving a low voltage operation for the semiconductor laser element.

In semiconductor laser 59 according to Embodiment 9, the total thickness of pad electrode 116 including first pad electrode 201 comprising Au with a thickness of 0.6 µm, second barrier layer 202a comprising Pt with a thickness of 35 nm, and second pad electrode 203 comprising Au with a thickness of 1.0 µm is about 1.6 µm. Bonding layer 121 comprising AuSn is 1.6 µm in thickness. If the total thickness is too large, a distance between submount substrate 122 and semiconductor laser element 11a increases, thereby suppressing the generation of a piezoelectric potential caused by a smaller thermal expansion coefficient of submount substrate 122 than those of a nitride light-emitting element and metallic materials such as Au. If the total thickness is too small, adhesive strength between semiconductor laser element 11a and submount substrate 122 decreases. Thus, the total thickness of first pad electrode 201, second barrier layer 202a, second pad electrode 203, and bonding layer 121 may be 3 µm to 5 µm. Alternatively, the total thickness of first pad electrode 201, second barrier layer 202a, and second pad electrode 203 may be substantially equal to the thickness of bonding layer 121. This is because if the total thickness of first pad electrode 201, second barrier layer 202a, second pad electrode 203, and bonding layer 121 is 3 µm to 5 µm, the bonding layer material is likely to be squeezed out to the side wall of semiconductor laser element 11a during mounting if the thickness of bonding layer 121 is too large, whereas the adhesive strength decreases with a reduction in the thickness of bonding layer 121. Hence, in Embodiment 9, bonding layer 121 has a thickness of 1.6 µm.

As described above, the total thickness of first pad electrode 201, second barrier layer 202a, and second pad electrode 203 and the thickness of bonding layer 121 may be 1.5 µm to 2.5 µm. This can suppress a reduction in adhesive strength, suppress squeezing of the bonding layer to the element side wall, suppress leakage current into a current non-injection window region near a cavity end face when the leakage is caused by junction-down mounting onto the diamond submount substrate, and also generate a piezoelectric field for suppressing leakage current to the outside of the ridge.

The effects can be obtained by the semiconductor laser elements according to Embodiments 2 to 8 as well as the semiconductor laser elements according to Embodiments 1 and 9.

Since the diamond submount substrate has a high thermal conductivity, heat conduction increases during mounting and AuSn solder, which is a material of the bonding layer, is likely to be quickly melted toward the side wall. Hence, as compared with a submount substrate comprising SiC or AlN, solder is likely to be squeezed out along the side wall of the semiconductor laser element during mounting even if the semiconductor laser element is flat or convex with the GaN substrate placed on top of the structure, mean strain $\varepsilon_{tave}$ of the overall multilayer structure is 0, or the semiconductor laser element is a tensile element. In this case, as described above, solder covers the side wall of the semiconductor laser element and may cause leakage current. In order to solve the problem, the configuration of the second barrier layer provided in semiconductor laser element 11a according to Embodiment 9 is effectively used.

If a direction from GaN substrate 101 to quantum-well active layer 106 is defined as an upward direction, P-side multilayer electrode 118a is formed on current block layer 112. As illustrated in FIG. 45A, P-side multilayer electrode 118a includes P-side first adhesive layer 114a, first pad electrode 201, second barrier layer 202a, and second pad electrode 203.

Figure 45B:
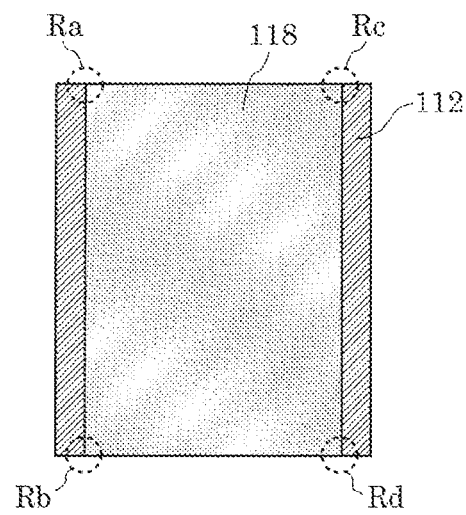
FIG. 45B is a schematic plan view illustrating an example of the shape of the P-side multilayer electrode of the semiconductor laser element viewed in a substrate normal direction according to Embodiment 1, Embodiment 9, or the variation of Embodiment 9.
Figure 45C:
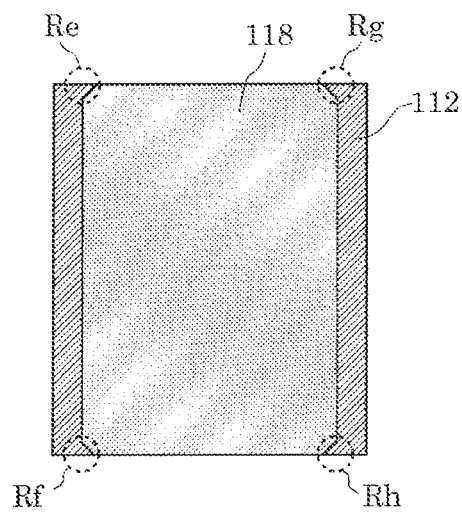
FIG. 45C is a schematic plan view illustrating another example of the shape of the P-side multilayer electrode of the semiconductor laser element viewed in the substrate normal direction according to Embodiment 1, Embodiment 9, or the variation of Embodiment 9.
Figure 45D:
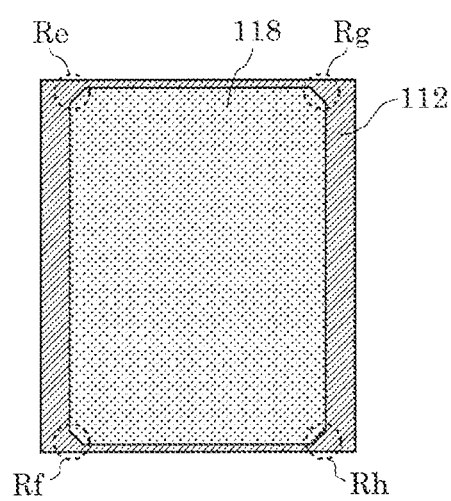
FIG. 45D is a schematic plan view illustrating still another example of the shape of the P-side multilayer electrode of the semiconductor laser element viewed in the substrate normal direction according to Embodiment 1, Embodiment 9, or the variation of Embodiment 9.

The shapes of P-side multilayer electrodes 118 and 118a will be described below in accordance with the accompanying drawings. FIGS. 45B to 45D are schematic plan views, each illustrating an example of the shape of P-side multilayer electrode 118 of the semiconductor laser element viewed in a substrate normal direction according to Embodiment 1, Embodiment 9, or the variation of Embodiment 9. Although P-side multilayer electrode 118 is illustrated in FIGS. 45B to 45D, P-side multilayer electrode 118a has a similar shape.

If P-side multilayer electrode 118 is rectangular as illustrated in FIG. 45B, a stress is likely to concentrate on corners Ra to Rd of P-side multilayer electrode 118, so that the electrode is likely to peel off from the corners. Peeling at the corners of P-side multilayer electrode 118 interrupts uniform current injection and reduces heat dissipation at the same time, thereby deteriorating the operation characteristics and reliability of the semiconductor laser.

In order to suppress peeling of the electrode, P-side multilayer electrode 118 in FIGS. 45C and 45D is rectangular with four cut corners. In other words, at corners Ra to Rd of P-side multilayer electrode 118, the outer edge of P-side multilayer electrode 118 is located inside an intersection point of an extension of a side parallel to the cavity of P-side multilayer electrode 118 and an extension of a side parallel to the cavity end face. In the present embodiment, corners Re to Rh having no electrodes are provided at distances of 10 µm to 30 µm in each of the longer-side direction and the shorter-side direction from the vertices of a rectangle that is formed by a side parallel to the cavity direction of P-side multilayer electrode 118, an extension (longer side) of the side, a side parallel to the cavity end face, and an extension (shorter side) of the side.

This suppresses the formation of a region where a stress concentrates on P-side multilayer electrode 118, thereby reducing the occurrence of peeling of the electrode. The P-side multilayer electrodes 118 illustrated in FIGS. 45C and 45D each have no electrodes at a distance of 20 µm from the vertices of the rectangle in the cavity direction and the width direction of the semiconductor laser element. In other words, P-side multilayer electrode 118 is shaped such that triangular regions are cut from four corners Re to Rh of a rectangular electrode.

As illustrated in FIG. 45C, the ends of P-side multilayer electrode 118 on the cavity end faces may be located at the same positions as the cavity end faces. As illustrated in FIG. 45D, the ends of P-side multilayer electrode 118 may be separated from the cavity end faces in consideration of the relationship with cleavage accuracy during cavity formation.

In other words, a clearance may be formed between the end of P-side multilayer electrode 118 and the cavity end face.

If the clearance is too small, it is difficult to make a cleavage with accuracy of finishing in the process of cleavage without being affected by P-side multilayer electrode 118. The position of cleavage may include a part of one end of P-side multilayer electrode 118. In this case, the end of P-side multilayer electrode 118 may affect the direction of cleavage. In other words, the direction of cleavage may be deviated from a desired direction during the process of cleavage. Conversely, if the clearance is too large, heat dissipation decreases in a region near the cavity end face and thus a clearance of about 1 µm to 20 µm is suitable between the cavity end face and the end of P-side multilayer electrode 118. In the example of FIG. 45D, a clearance of 10 µm is formed.

Figure 45E:
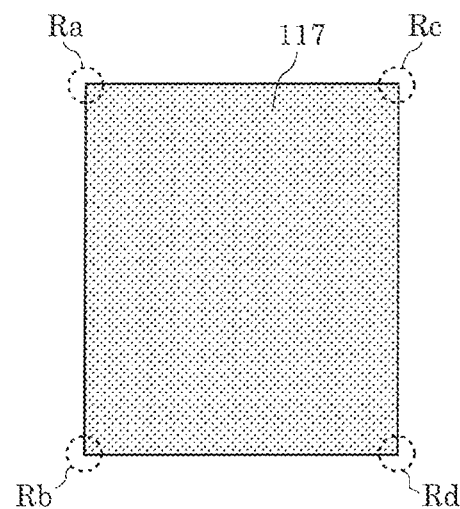
FIG. 45E is a schematic plan view illustrating an example of the shape of the N-side electrode of the semiconductor laser element viewed in the substrate normal direction according to Embodiment 1, Embodiment 9, or the variation of Embodiment 9.
Figure 45F:
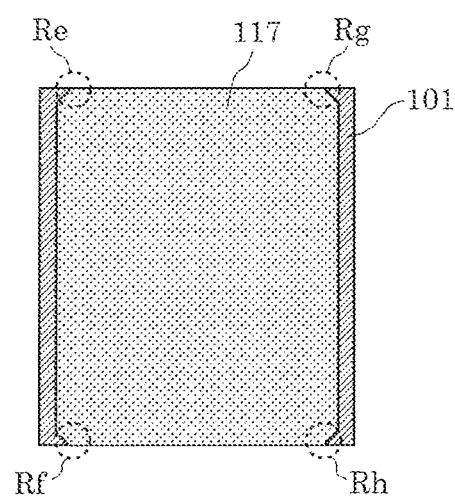
FIG. 45F is a schematic plan view illustrating another example of the shape of the N-side electrode of the semiconductor laser element viewed in the substrate normal direction according to Embodiment 1, Embodiment 9, or the variation of Embodiment 9.
Figure 45G:
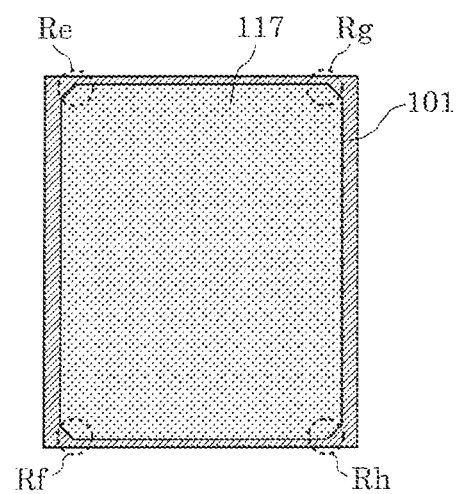
FIG. 45G is a schematic plan view illustrating still another example of the shape of the N-side electrode of the semiconductor laser element viewed in the substrate normal direction according to Embodiment 1, Embodiment 9, or the variation of Embodiment 9.

This configuration is also applicable to the shape of N-side electrode 117 viewed in a substrate normal direction, as in the P-side multilayer electrode 118. FIGS. 45E to 45G are schematic plan views, each illustrating an example of the shape of N-side electrode 117 of the semiconductor laser element viewed in a substrate normal direction according to the variation of Embodiment 1, Embodiment 9, or the variation of Embodiment 9.

If N-side electrode 117 is rectangular as illustrated in FIG. 45E, a stress is likely to concentrate on corners Ra to Rd, so that the electrode is likely to peel off from the corners. Peeling at the corners of N-side electrode 117 interrupts uniform current injection and reduces heat dissipation at the same time, thereby deteriorating the operation characteristics and reliability of the semiconductor laser.

In order to suppress peeling of the electrode, N-side electrode 117 in FIGS. 45F and 45G is rectangular with four cut corners. In other words, at corners Ra to Rd of N-side electrode 117, the outer edge of N-side electrode 117 is located inside an intersection point of an extension of a side parallel to the cavity of N-side electrode 117 and an extension of a side parallel to the cavity end face. In the present embodiment, corners Re to Rh having no electrodes are provided at distances of 10 µm to 30 µm in each of the longer-side direction and the shorter-side direction from the vertices of a rectangle that is formed by a side parallel to the cavity direction of N-side electrode 117, an extension (longer side) of the side, a side parallel to the cavity end face, and an extension (shorter side) of the side. N-side electrodes 117 illustrated in FIGS. 45F and 45G each have no electrodes at a distance of 20 µm from the vertices of the rectangle in the cavity direction and the width direction of the semiconductor laser element. In other words, N-side electrode 117 is shaped such that triangular regions are cut from four corners Re to Rh of a rectangular electrode.

This suppresses the formation of a region where a stress concentrates on N-side electrode 117, thereby reducing the occurrence of peeling of the electrode.

As illustrated in FIG. 45F, the ends of N-side electrode 117 on the cavity end faces may be located at the same positions as the cavity end faces. As illustrated in FIG. 45G, the ends of N-side electrode 117 may be separated from the cavity end faces in consideration of the relationship with cleavage accuracy during cavity formation. In other words, a clearance may be formed between the end of N-side electrode 117 and the cavity end face.

If the clearance is too small, it is difficult to make a cleavage with accuracy of finishing in the process of cleavage without being affected by N-side electrode 117. The position of cleavage may include a part of one end of N-side electrode 117. In this case, the end of N-side electrode 117 may affect the direction of cleavage. In other words, the direction of cleavage may be deviated from a desired direction during the process of cleavage. Conversely, if the clearance is too large, heat dissipation decreases in a region near the cavity end face and thus a clearance of about 1 µm to 20 µm is suitable between the cavity end face and the end of N-side electrode 117. In the example of FIG. 45G, a clearance of 10 µm is formed.

In the structures of FIGS. 45F and 45G, N-side electrode 117 is formed in a region inside the ends of the semiconductor laser element also in the width direction of the semiconductor laser element. This structure is provided to facilitate isolation in a element isolation process of isolating the semiconductor laser in the cavity direction. In this case, a spacing between N-side electrode 117 and the end of the semiconductor laser element may be 1 µm to 20 µm in the width direction of the semiconductor laser element. In the examples of FIGS. 45F and 45G, a clearance of 10 µm is formed.

In the case of junction-down mounting, a thermal residual stress is applied to P-side multilayer electrode 118 according to a difference in thermal expansion coefficient from a submount material. Thus, in order to prevent P-side multilayer electrode 118 from being peeled off by a stress applied to the electrode during mounting, as shown in FIGS. 45C and 45D, an effective electrode pattern has no electrode corners where a stress is likely to concentrate.

Embodiment 10

A semiconductor laser according to Embodiment 10 will be described below.

The shape of the diamond submount substrate will be first described below. Since the submount substrate is hard, a diamond wafer is hard to split. Thus, in order to form the submount substrate, it is necessary to melt a diamond wafer with laser beam irradiation. In this case, if a relatively strong laser beam is emitted from the top surface of the wafer so as to melt the wafer to the underside, the wafer is easily split. However, a melted part of the wafer is turned into conductive carbon and thus if the melted part is used for the side wall of the submount substrate, the insulation of the submount substrate cannot be maintained. Hence, if the wafer is melted with laser beam irradiation, the wafer is melted to about a half of the thickness. This can suppress a carbonized portion of a split face of the wafer to about a half of the thickness.

If the wafer is irradiated with a laser beam, the laser beam has higher intensity at the center. Thus, a wafer portion irradiated with the center of the laser beam is deeply melted, whereas a portion irradiated with the outer edge of the laser beam is lightly melted. Thus, the side wall of the submount substrate formed by the method is inclined to a half depth in the thickness direction.

As described above, the formation of the submount substrate achieves separation of the submount substrate in a wafer state and the insulation of the submount substrate. For example, the shape of the submount substrate will be described below in accordance with the accompanying drawings.

Figure 46:
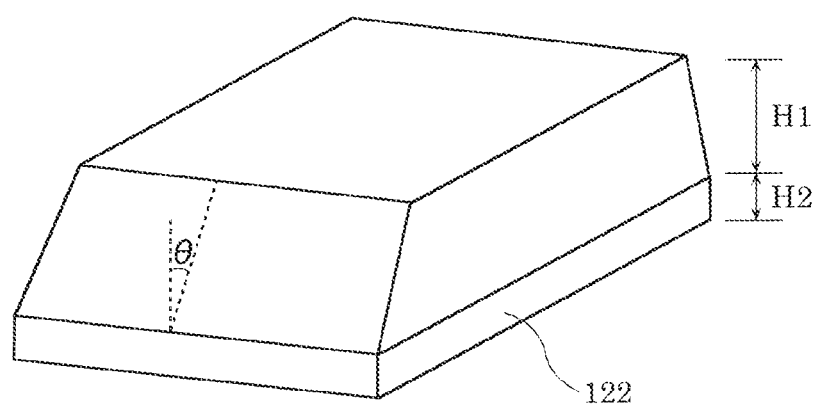
FIG. 46 is a perspective view illustrating the shape of a submount substrate according to Embodiment 10.

FIG. 46 is a perspective view illustrating the shape of submount substrate 122 according to Embodiment 10. As illustrated in FIG. 46, the shape of submount substrate 122 according to Embodiment 10 is not a rectangular parallelepiped. The side wall of submount substrate 122 (a surface other than the principal surface) includes a tilted portion having thickness H1 and an erect part having thickness H2.

The tilted portion of the side wall includes a plane inclined by angle θ with respect to the normal of the principal surface of submount substrate 122. The erect part of the side wall is formed with a plane parallel to the normal.

Thickness H1 of the tilted portion may be at most a half of the thickness of the submount substrate. For example, thickness H1 may be ±50 μm from a half of the thickness of the overall submount substrate.

Moreover, tilt angle θ of the side wall may range from 2.5° to 15° with respect to 8°. This is because if tilt angle θ is too large, the heat dissipation path of submount substrate 122 becomes too narrow, whereas if tilt angle θ is too small, it is difficult to form an electrode on the tilted portion of the side wall as will be described later.

Figure 47:
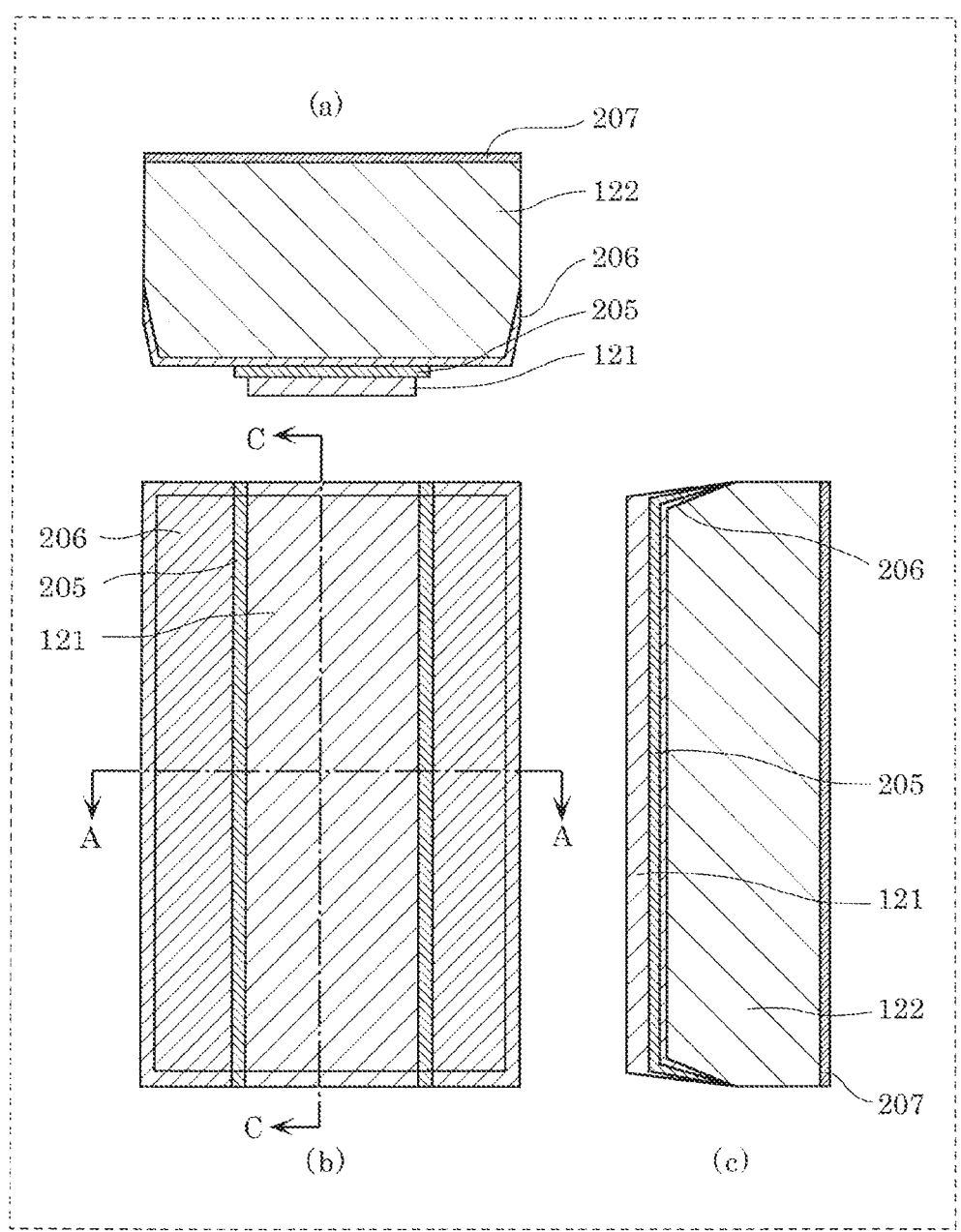
FIG. 47 illustrates the structure of an electrode formed above the submount substrate according to Embodiment 10.

The electrode formed on submount substrate 122 will be described below in accordance with the accompanying drawings. FIG. 47 illustrates the structure of the electrode formed on submount substrate 122 according to Embodiment 10. FIG. 47 illustrates cross-sectional views (a) and (c) and top view (b) of submount substrate 122 having the electrode. Cross-sectional views (a) and (c) are taken along line A-A and line C-C in top view (b).

As illustrated in cross-sectional view (c) of FIG. 47, top-contact metallic layer 206, submount barrier layer 205, and bonding layer 121 are formed on the top surface of submount substrate 122 so as to cover the tilted portion of the side wall. As illustrated in top view (b) of FIG. 47, submount barrier layer 205 is formed in a region inside top-contact metallic layer 206 and bonding layer 121 is formed slightly further inside submount barrier layer 205. Such a pattern enables recognition of a mounting position when the semiconductor laser element is mounted. Moreover, large extension of bonding layer 121 out of submount barrier layer 205 can be suppressed.

In the case of junction-down mounting, a bonding layer material, e.g., AuSn squeezed out of the submount substrate to the front end face may disturb the emission pattern of light emitted from the front end face (the emission-side end face of the cavity) of the semiconductor laser element. In order to suppress the disturbance of the emission pattern of a laser beam, the semiconductor laser element is effectively mounted while the front end face of the semiconductor laser element is projected from one end of the submount substrate.

As illustrated in cross-sectional view (c) in FIG. 47, top-contact metallic layer 206 and bonding layer 121 are also formed on the tilted portion of submount substrate 122, so that when the semiconductor laser element is mounted while the front end face of the laser is projected from one end of submount substrate, bonding layer 121 can be fixed so as to cover the pad electrode of the projected part. This can improve the heat dissipation of the projected part. Such a mounting configuration will be described below in accordance with the accompanying drawings.

Figure 48A:
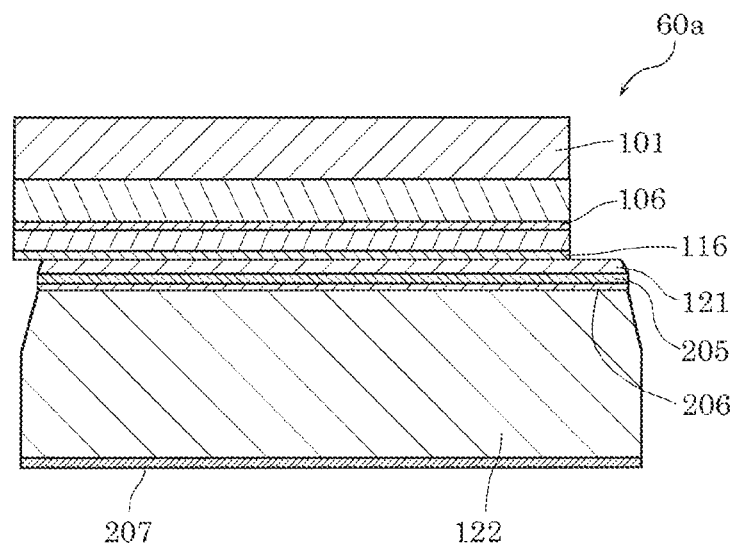
FIG. 48A is a schematic cross-sectional view illustrating the structure of a semiconductor laser including a semiconductor laser element mounted on the submount substrate having a tilted portion on which a bonding layer is not formed.
Figure 48B:
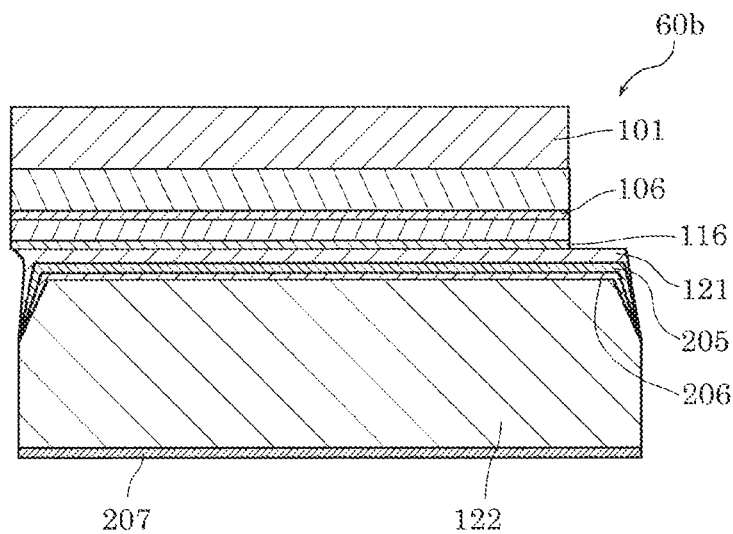
FIG. 48B is a schematic cross-sectional view illustrating the structure of the semiconductor laser including the semiconductor laser element mounted on the submount substrate having the tilted portion on which the bonding layer is formed.

FIG. 48A is a schematic cross-sectional view illustrating the structure of semiconductor laser 60a including the semiconductor laser element mounted on submount substrate 122 having the tilted portion on which bonding layer 121 is not formed. FIG. 48B is a schematic cross-sectional view illustrating the structure of semiconductor laser 60b including the semiconductor laser element mounted on submount substrate 122 having the tilted portion on which bonding layer 121 is formed. FIGS. 48A and 48B illustrate sections parallel to the cavity direction of the semiconductor laser and the stacking direction of the multilayer structure.

As illustrated in FIG. 48A, if submount barrier layer 205, top-contact metallic layer 206, and bonding layer 121 are not formed on the side wall of submount substrate 122, the projected part on the front end face of pad electrode 116 (left side in FIG. 48A) is not covered with bonding layer 121.

As illustrated in FIG. 48B, if submount barrier layer 205, top-contact metallic layer 206, and bonding layer 121 are formed on the side wall of submount substrate 122, bonding layer 121 can be fixed over the projected part on the front end face of pad electrode 116 (left side in FIG. 48B). This can improve the heat dissipation of the front end face of the semiconductor laser element. The front end face of the semiconductor laser element has quite a high optical density, which is most likely to generate heat. Thus, the fixation of bonding layer 121 to pad electrode 116 as illustrated in FIG. 48B is quite effective for preventing a reduction in COD level.

In particular, the effect of preventing a reduction in COD level can be enhanced if the current non-injection window region is formed near the cavity end face. The semiconductor laser element including the current non-injection window region will be described below in accordance with the accompanying drawings.

Figure 49A:
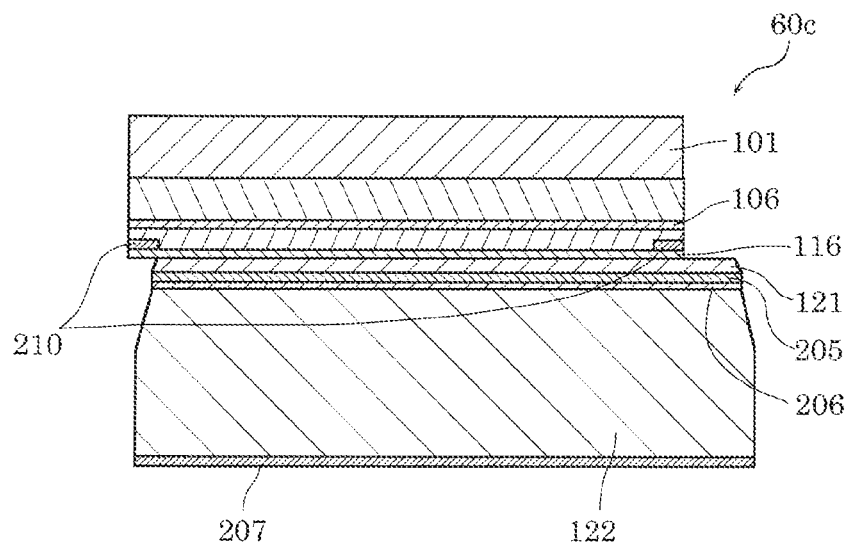
FIG. 49A is a schematic cross-sectional view illustrating the structure of the semiconductor laser including the semiconductor laser element mounted with a current non-injection window region on the submount substrate having the tilted portion on which the bonding layer is not formed.
Figure 49B:
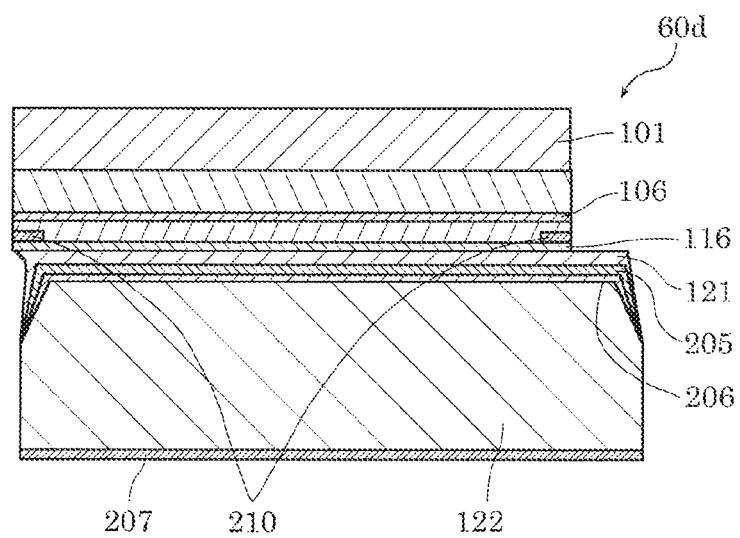
FIG. 49B is a schematic cross-sectional view illustrating the structure of the semiconductor laser including the semiconductor laser element mounted with the current non-injection window region on the submount substrate having the tilted portion on which the bonding layer is formed.

FIG. 49A is a schematic cross-sectional view illustrating the structure of semiconductor laser 60c including the semiconductor laser element mounted with current non-injection window region 210 on submount substrate 122 having the tilted portion on which bonding layer 121 is not formed. FIG. 49B is a schematic cross-sectional view illustrating the structure of semiconductor laser 60c including the semiconductor laser element mounted with current non-injection window region 210 on submount substrate 122 having the tilted portion on which bonding layer 121 is formed.

In current non-injection window region 210, an $SiO_2$ insulating film for preventing current injection is formed on a contact layer near the cavity end face of the semiconductor laser element. The formation of current non-injection window region 210 reduces the operating carrier density of quantum-well active layer 106 near the end face of the semiconductor laser element and suppressing heat generated by Auger non-radiative recombination. In this state, the bonding layer is fixed over the projected part of the front end face of pad electrode 116 (left side in FIG. 49B) of the semiconductor laser element as in semiconductor laser 60d illustrated in FIG. 49B. This can further increase heat dissipation in current non-injection window region 210. Therefore, a reduction in the COD level of semiconductor laser 60d can be suppressed.

Even if the semiconductor laser is flat or convex with GaN substrate 101 placed on top of the structure, mean strain $\varepsilon_{tave}$ of the overall multilayer structure is 0, or the semiconductor laser is a tensile laser, heat dissipation on the front end face of the semiconductor laser can be improved using the configuration illustrated in Embodiment 10. Therefore, a reduction in the COD level of the semiconductor laser can be suppressed.

Embodiment 11

An optical module according to Embodiment 11 will be described below.

The semiconductor laser element according to the present disclosure is mounted on the diamond submount substrate, achieving the effect of suppressing leakage current into the current non-injection window region and the effect of suppressing leakage current out of a ridge in a ridge laser. Since the diamond submount substrate has a lower thermal expansion coefficient than a nitride material and metallic materials such as Au, as illustrated in FIGS. 4, 21C, and 23C, the effects are enhanced at a room temperature of 25° C. as compared with a high temperature of 150° C.

Therefore, the effect of suppressing a deterioration of the semiconductor laser element and the effect of suppressing an operating current value can be enhanced by using the semiconductor laser element in environmental conditions close to room temperature, as compared with the semiconductor laser element mounted on SiC or AlN submount substrate.

The embodiment that can enhance the effects of the semiconductor laser element according to the present disclosure will be described below in accordance with the accompanying drawings.

Figure 50:
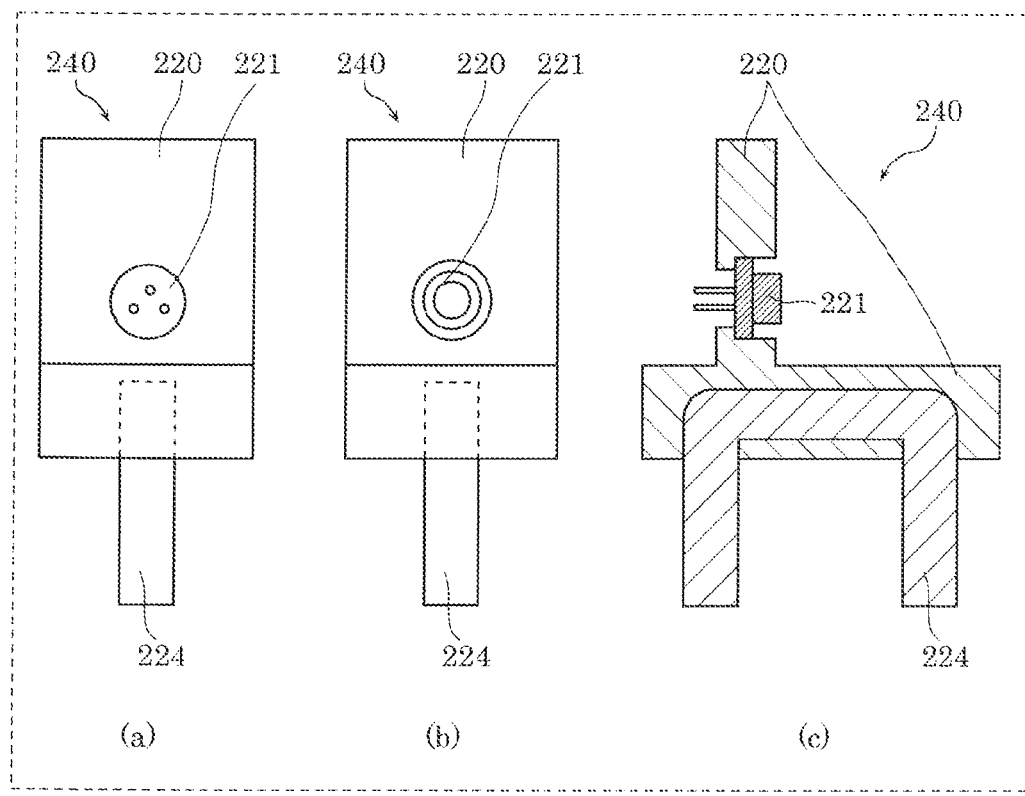
FIG. 50 illustrates an exemplary structure of an optical module according to Embodiment 11.

FIG. 50 illustrates an exemplary structure of optical module 240 according to Embodiment 11. FIG. 50 illustrates rear view (a), front view (b), and cross-sectional view (c) of optical module 240 according to Embodiment 11. Rear view (a) illustrates the appearance of the back side of the light emission side of optical module 240. Front view (b) illustrates the appearance of the light emission side of optical module 240. Cross-sectional view (c) illustrates a cross section passing through the optical axis of optical module 240.

Optical module 240 includes CAN package 221, in which the semiconductor laser element and the submount substrate according to the forgoing embodiments are mounted, and metal base 220 including a water-cooled mechanism.

Metal base 220 includes pipe 224 for circulating a coolant for cooling metal base 220. This configuration can keep metal base 220 at a temperature equal to or close to room temperature. Therefore, the semiconductor laser can be operated in environmental conditions closed to room temperature, and the effect of suppressing a deterioration of the semiconductor laser element and the effect of suppressing an operating current value can be enhanced as compared with the semiconductor laser element mounted on SiC or AlN submount substrate.

Embodiment 12

An optical module according to Embodiment 12 will be described below. The optical module according to Embodiment 12 is identical to optical module 240 according to Embodiment 11 except for the provision of an optical fiber. The optical module according to Embodiment 12 will be described below in accordance with the accompanying drawings.

Figure 51:
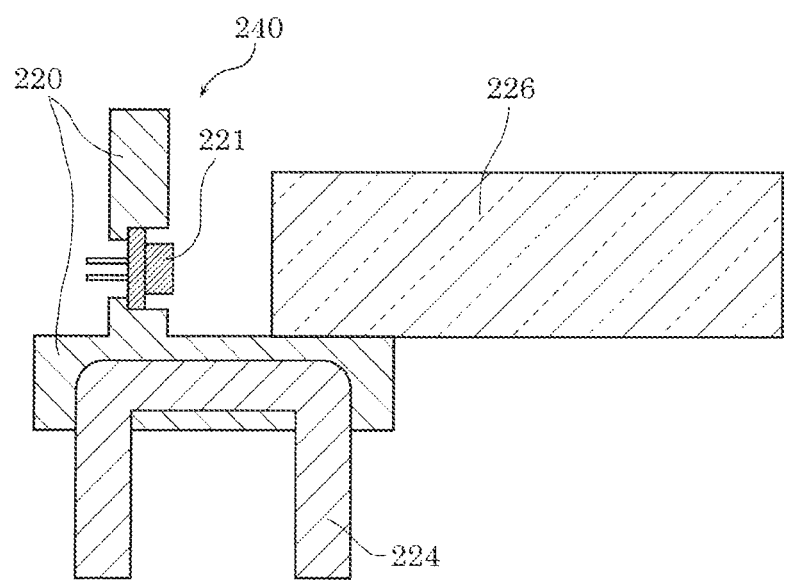
FIG. 51 is a cross-sectional view illustrating an exemplary structure of an optical module according to Embodiment 12.

FIG. 51 is a cross-sectional view illustrating an exemplary structure of the optical module according to Embodiment 12. FIG. 51 illustrates a cross section passing through the optical axis of the optical module according to Embodiment 12.

The optical module according to Embodiment 12 is configured such that optical fiber 226 is further integrated in optical module 240 according to Embodiment 11. This configuration can easily transmit a 450-nm-band blue laser beam in watts to a position where the laser beam is required while operating the semiconductor laser element in an environment close to room temperature as in Embodiment 11. The optical module according to Embodiment 12 can be used as, for example, a laser light source for working.

For example, a phosphor for generating yellow light or phosphors for generating red light and green light are disposed near the emission portion of optical fiber 226, achieving a white light source.

Embodiment 13

A light source according to Embodiment 13 will be described below. The light source according to Embodiment 13 is a light source that transforms a blue laser beam from the semiconductor laser element into white light. The light source according to Embodiment 13 will be described below in accordance with the accompanying drawings.

Figure 52:
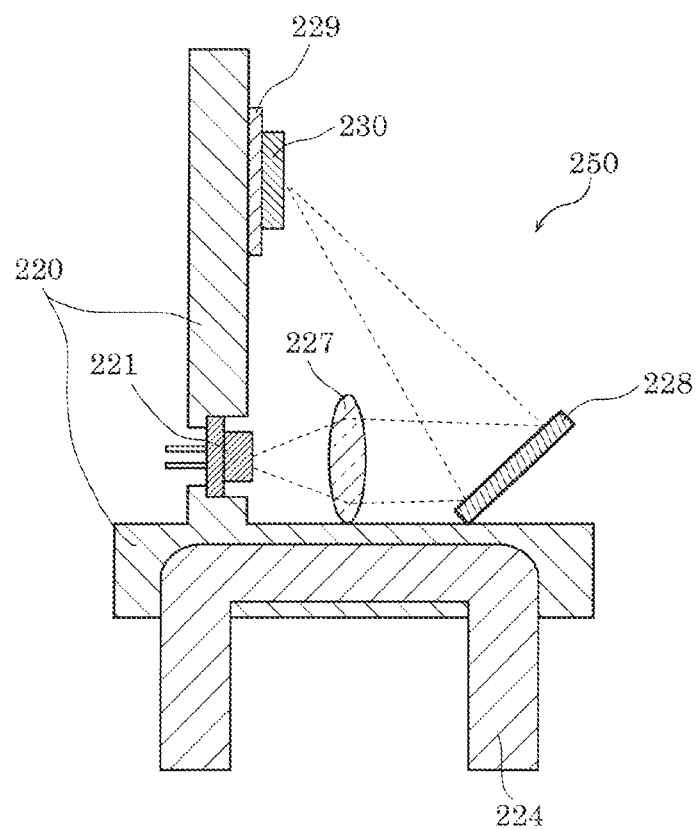
FIG. 52 is a cross-sectional view illustrating an example of the configuration of a light source according to Embodiment 13.

FIG. 52 is a cross-sectional view illustrating an example of the configuration of light source 250 according to embodiment 13.

As illustrated in FIG. 52, light source 250 according to Embodiment 13 includes CAN package 221 and metal base 220 of optical module 240 according to Embodiment 11. Light source 250 further includes lens 227, reflection mirror 228, base 229, and phosphor 230. These constituent elements are integrated in light source 250. This configuration can operate the semiconductor laser element of light source 250 in an environment close to room temperature and collect a 450-nm-band blue laser beam in watts into phosphor 230 through lens 227.

In this configuration, the phosphor can be excited by irradiating the phosphor with a 450-nm-band blue laser beam. Thus, the phosphor generates yellow light or red light and green light, so that the light source can be used to emit white light as a whole.

In this case, in addition to the effect of suppressing a deterioration by using the semiconductor laser element mounted junction-down on the diamond submount substrate, a deterioration of the phosphor caused by heat generation can be suppressed because the phosphor is used at an environmental temperature close to room temperature. Thus, a white light source is achieved with reliability for a long-term operation.

Although the nitride light emitter according to the present disclosure has been described with reference to a plurality of embodiments as above, the present disclosure is not limited to these embodiments.

For example, other embodiments with any combinations of the constituent elements described in the description or without a part of the constituent elements are also embodiments of the present disclosure.

In the foregoing embodiments, a (0001) C-face, a semi-polar face, and a non-polar face are illustrated as the principal surface of the substrate for fabricating the semiconductor laser element. The substrate may be an off-substrate having a principal surface tilted from the (0001) C-face. The piezoelectric effect in the C-axis direction on the quantum-well active layer can be reduced by using the off-substrate, thereby reducing the operating voltage.

INDUSTRIAL APPLICABILITY

A nitride light emitter according to the present disclosure can be used as a light source for an automobile headlight with excellent temperature characteristics and reliability for an extended period even in an extra-high output operation of at least 3 watts in an environment at, for example, 85° C.

What is claimed is:

1. A nitride light emitter, comprising:
a nitride semiconductor light-emitting element including an $Al_xGa_{1-x}N$ substrate, where x ranges from 0 to 1, inclusive, and a multilayer structure disposed above the AlxGa1–xN substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and
a submount substrate on which the nitride semiconductor light-emitting element is mounted, wherein:

the nitride semiconductor light-emitting element is mounted on the submount substrate such that the multilayer structure and submount substrate are opposed to each other, the submount substrate comprises diamond, the nitride semiconductor light-emitting element includes a cavity and a current non-injection region in a vicinity of an end face of the cavity, in a stacked structure consisting of the first clad layer and the layers that are stacked on the first clad layer in a direction from the first clad layer toward the second clad layer, a mean strain of the stacked structure with respect to the $Al_xGa_{1-x}N$ substrate is compressive, the mean strain of the stacked structure is a value obtained by dividing, by a thickness of the stacked structure, a total value resulting from adding, for all of the layers stacked in the stacked structure, a value obtained by multiplying a mean strain of each of the layers stacked in the stacked structure with a thickness of each of the layers, and the nitride semiconductor light-emitting element has a concave warp on a surface closer to the $Al_xGa_{1-x}N$ substrate.

2. The nitride light emitter according to claim 1, wherein the $Al_xGa_{1-x}N$ substrate is a GaN substrate.

3. The nitride light emitter according to claim 2, wherein the GaN substrate has a plane orientation that is non-polar or semi-polar, and the multilayer structure contains an Al composition of at most 1%.

4. The nitride light emitter according to claim 3, wherein the multilayer structure does not include Al.

5. The nitride light emitter according to claim 1, wherein at least one of the first light guide layer or the second light guide layer contains In.

6. The nitride light emitter according to claim 5, wherein the first light guide layer and the second light guide layer each include an In composition of 6% or less.

7. The nitride light emitter according to claim 5, wherein the quantum-well active layer includes a quantum well layer and a barrier layer, and the barrier layer contains an In composition that is equal to or higher than an In composition of each of the first light guide layer and the second light guide layer.

8. The nitride light emitter according to claim 1, further comprising a buffer layer between the $Al_xGa_{1-x}N$ substrate and the first clad layer, the buffer layer including a nitride semiconductor layer having a compressive mean strain relative to the $Al_xGa_{1-x}N$ substrate.

9. The nitride light emitter according to claim 8, wherein the buffer layer contains In.

10. The nitride light emitter according to claim 8, wherein the buffer layer further includes an AlGaN layer.

11. The nitride light emitter according to claim 1, wherein the second clad layer includes a ridge.

12. The nitride light emitter according to claim 11, wherein the ridge includes one of a layer including In and a layer including GaN, the one of the layer including In and the layer including GaN being located closer to the second light guide layer.

13. The nitride light emitter according to claim 11, wherein the second clad layer includes an isolation trench on a side of the ridge, the isolation trench including a width of 6 μm to 15 μm, inclusive.

14. The nitride light emitter according to claim 1, further comprising a first barrier layer, a first pad electrode layer, a second barrier layer, and a bonding layer that are disposed between the multilayer structure and the submount substrate and are arranged in stated order from the second clad layer, and the second barrier layer includes a shorter side having a width smaller than a width of a shorter side of the first barrier layer.

15. The nitride light emitter according to claim 1, further comprising a first barrier layer, a first pad electrode layer, a second barrier layer, and a bonding layer that are disposed between the multilayer structure and the submount substrate and are arranged in stated order from the second clad layer, and the bonding layer is further placed inward from an end of the second barrier layer in a region between second barrier layer and the first barrier layer.

16. The nitride light emitter according to claim 1, wherein:

the first clad layer comprises AlGaN, and the second clad layer comprises AlGaN.

17. A nitride light emitter, comprising:

a nitride semiconductor light-emitting element including an $Al_xGa_{1-x}N$ substrate, where x ranges from 0 to 1, inclusive, and a multilayer structure disposed above the $Al_xGa_{1-x}N$ substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and a submount substrate on which the nitride semiconductor light-emitting element is mounted, wherein:

the nitride semiconductor light-emitting element is mounted on the submount substrate such that the multilayer structure and the submount substrate are opposed to each other, the submount substrate comprises diamond, the nitride semiconductor light-emitting element includes a cavity and a current non-injection region in a vicinity of an end face of the cavity, in a stacked structure consisting of the first clad layer and the layers that are stacked on the first clad layer in a direction from the first clad layer toward the second clad layer, a mean strain of the stacked structure with respect to the $Al_xGa_{1-x}N$ substrate is compressive, and the mean strain of the stacked structure is a value obtained by dividing, by a thickness of the stacked structure, a total value resulting from adding, for all of the layers stacked in the stacked structure, a value obtained by multiplying a mean strain of each of the layers stacked in the stacked structure with a thickness of each of the layers.

18. The nitride light emitter according to claim 17, wherein:

the first clad layer comprises AlGaN, and the second clad layer comprises AlGaN.

19. A nitride light emitter, comprising:

a nitride semiconductor light-emitting element including an $Al_xGa_{1-x}N$ substrate, where x ranges from 0 to 1, inclusive, and a multilayer structure disposed above the $Al_xGa_{1-x}N$ substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and a submount substrate on which the nitride semiconductor light-emitting element is mounted, wherein:

the $Al_xGa_{1-x}N$ substrate has a thickness of 75 μm to 95 μm, inclusive, the nitride semiconductor light-emitting element is mounted on the submount substrate such that the multilayer structure and submount substrate are opposed to each other, the submount substrate comprises diamond, the nitride semiconductor light-emitting element includes a cavity and a current non-injection region in a vicinity of an end face of the cavity, in a stacked structure consisting of the first clad layer and the layers that are stacked on the first clad layer in a direction from the first clad layer toward the second clad layer, a mean strain of the stacked structure with respect to the $Al_xGa_{1-x}N$ substrate is compressive, and the mean strain of the stacked structure is a value obtained by dividing, by a thickness of the stacked structure, a total value resulting from adding, for all of the layers stacked in the stacked structure, a value obtained by multiplying a mean strain of each of the layers stacked in the stacked structure with a thickness of each of the layers.

20. The nitride light emitter according to claim 19, wherein the cavity includes a length of at least 600 μm.

21. The nitride light emitter according to claim 19, wherein:

the first clad layer comprises AlGaN, and the second clad layer comprises AlGaN.

22. A nitride light emitter, comprising:

a nitride semiconductor light-emitting element including an $Al_xGa_{1-x}N$ substrate, where x ranges from 0 to 1, inclusive, and a multilayer structure disposed above the AlxGa1−xN substrate, the multilayer structure including a first clad layer of a first conductivity type, a first light guide layer, a quantum-well active layer, a second light guide layer, and a second clad layer of a second conductivity type which are stacked in stated order from the $Al_xGa_{1-x}N$ substrate; and a submount substrate on which the nitride semiconductor light-emitting element is mounted, wherein:

the multilayer structure has a compressive mean strain relative to the $Al_xGa_{1-x}N$ substrate, the nitride semiconductor light-emitting element is mounted on the submount substrate such that the multilayer structure and submount substrate are opposed to each other, the submount substrate comprises diamond, the nitride semiconductor light-emitting element includes a cavity and a current non-injection region in a vicinity of an end face of the cavity, the quantum-well active layer includes a well layer and a barrier layer, the first light guide layer and the second light guide layer each contains an In composition of at least 2.5%, the barrier layer contains an In composition that is higher than or equal to the In composition of each of the first light guide layer and the second light guide layer, and the nitride semiconductor light-emitting element has a concave warp on a surface closer to the $Al_xGa_{1-x}N$ substrate.

23. The nitride light emitter according to claim 22, wherein:

the first clad layer comprises AlGaN, and the second clad layer comprises AlGaN.

* * * * *